(12) United States Patent
Volfovski et al.

(10) Patent No.: US 7,699,021 B2
(45) Date of Patent: Apr. 20, 2010

(54) CLUSTER TOOL SUBSTRATE THROUGHPUT OPTIMIZATION

(75) Inventors: Leon Volfovski, Mountain View, CA (US); Tetsuya Ishikawa, Saratoga, CA (US)

(73) Assignee: Sokudo Co., Ltd., Kyoto (JP)

( * ) Notice: Subject to any disclaimer, the term of this patent is extended or adjusted under 35 U.S.C. 154(b) by 765 days.

(21) Appl. No.: 11/344,565

(22) Filed: Jan. 30, 2006

(65) Prior Publication Data

US 2006/0130751 A1 Jun. 22, 2006

Related U.S. Application Data

(63) Continuation-in-part of application No. 11/112,281, filed on Apr. 22, 2005, now Pat. No. 7,357,842.

(60) Provisional application No. 60/639,109, filed on Dec. 22, 2004.

(51) Int. Cl.
*B05C 13/02* (2006.01)
*C23C 14/00* (2006.01)
*H01L 21/677* (2006.01)

(52) U.S. Cl. .................... 118/500; 118/503; 118/50; 414/217; 414/935; 414/936; 414/225.01

(58) Field of Classification Search ............. 118/323, 118/50, 500, 503, 326, 309, DIG. 7, 634; 29/25.01; 414/217, 744.5, 744.6, 416.03, 414/935–941, 225.01
See application file for complete search history.

(56) References Cited

U.S. PATENT DOCUMENTS

| | | | |
|---|---|---|---|
| 1,383,093 A | 6/1921 | Finch | |
| 1,927,677 A | 9/1933 | Bennington | |
| 2,578,220 A | 12/1951 | Billner | |
| 3,193,080 A | 7/1965 | Speaker et al. | |
| 3,206,041 A | 9/1965 | McGrath | |
| 3,279,625 A | 10/1966 | McConnell et al. | |
| 3,351,219 A | 11/1967 | Ruderfer et al. | |
| 3,402,835 A | 9/1968 | Saul | |

(Continued)

FOREIGN PATENT DOCUMENTS

DE 3790259 C2 11/1986

(Continued)

OTHER PUBLICATIONS

Eberhardt et al., entitled: "Advanced Photoresist Wafer Processing System for Deep UV (DUV)" Fairchild Technologies, GMBH pp. 1-10.

(Continued)

*Primary Examiner*—Yewebdar T Tadesse
(74) *Attorney, Agent, or Firm*—Townsend and Townsend and Crew LLP

(57) ABSTRACT

Embodiments generally provide an apparatus and method for processing substrates using a multi-chamber processing system (e.g., a cluster tool) that has an increased system throughput, increased system reliability, substrates processed in the cluster tool have a more repeatable wafer history. In one embodiment, non-orthogonal robot trajectories are used to assure reliable and high speed substrate transfer. In another embodiment, at least one buffering station is used to avoid collision and improve throughput. In another embodiment, optimal positioning of the robots are used to improve throughput.

8 Claims, 31 Drawing Sheets

U.S. PATENT DOCUMENTS

| | | |
|---|---|---|
| 3,428,195 A | 2/1969 | Pamer |
| 3,610,159 A | 10/1971 | Fickenacher |
| 3,669,206 A | 6/1972 | Tax et al. |
| 3,750,804 A | 8/1973 | Lemelson |
| 3,782,564 A | 1/1974 | Burt |
| 3,796,327 A | 3/1974 | Meyer et al. |
| 3,876,085 A | 4/1975 | Bright |
| 4,027,246 A | 5/1977 | Caccoma et al. |
| 4,197,000 A | 4/1980 | Blackwood |
| 4,319,689 A | 3/1982 | Clapp |
| 4,609,575 A | 9/1986 | Burkman |
| 4,634,655 A | 1/1987 | Yanagimoto et al. |
| 4,664,133 A | 5/1987 | Silvernail |
| 4,682,614 A | 7/1987 | Silvernail |
| 4,750,505 A | 6/1988 | Inuta et al. |
| 4,755,257 A | 7/1988 | Yamamoto et al. |
| 4,756,047 A | 7/1988 | Hayashi et al. |
| 4,774,552 A | 9/1988 | Nishihama et al. |
| 4,778,532 A | 10/1988 | McConnell et al. |
| 4,788,994 A | 12/1988 | Shinbara |
| 4,803,734 A | 2/1989 | Onishi et al. |
| 4,830,888 A | 5/1989 | Kobayashi et al. |
| 4,838,979 A | 6/1989 | Nishida et al. |
| 4,844,746 A | 7/1989 | Hörmann et al. |
| 4,846,623 A | 7/1989 | Otani et al. |
| 4,855,775 A | 8/1989 | Matsuoka |
| 4,856,641 A | 8/1989 | Matsumura et al. |
| 4,857,949 A | 8/1989 | Masuda et al. |
| 4,870,923 A | 10/1989 | Sugimoto |
| 4,871,417 A | 10/1989 | Nishizawa et al. |
| 4,892,761 A | 1/1990 | Yamada |
| 4,895,604 A | 1/1990 | Hayashi |
| 4,899,686 A | 2/1990 | Toshima et al. |
| 4,911,761 A | 3/1990 | McConnell et al. |
| 4,917,123 A | 4/1990 | McConnell et al. |
| 4,919,073 A | 4/1990 | Kobayashi et al. |
| 4,922,278 A | 5/1990 | Takeda et al. |
| 4,923,054 A | 5/1990 | Ohtani et al. |
| 4,924,073 A | 5/1990 | Chiba |
| 4,924,800 A | 5/1990 | Tanaka |
| 4,966,094 A | 10/1990 | Yamada |
| 4,982,694 A | 1/1991 | Moriyama |
| 4,984,597 A | 1/1991 | McConnell et al. |
| 4,985,720 A | 1/1991 | Masuda et al. |
| 4,987,687 A | 1/1991 | Sugimoto |
| 4,998,021 A | 3/1991 | Mimasaka |
| 5,002,008 A | 3/1991 | Ushijima et al. |
| 5,020,200 A | 6/1991 | Mimasaka et al. |
| 5,032,217 A | 7/1991 | Tanaka |
| 5,035,200 A | 7/1991 | Moriyama et al. |
| 5,054,332 A | 10/1991 | Terauchi et al. |
| 5,061,144 A | 10/1991 | Akimoto et al. |
| 5,065,178 A | 11/1991 | Awazu et al. |
| 5,070,813 A | 12/1991 | Sakai et al. |
| 5,078,832 A | 1/1992 | Tanaka |
| 5,089,305 A | 2/1992 | Ushijima et al. |
| 5,127,362 A | 7/1992 | Iwatsu et al. |
| 5,150,452 A | 9/1992 | Pollack et al. |
| 5,151,871 A | 9/1992 | Matsumura et al. |
| 5,169,408 A | 12/1992 | Biggerstaff |
| 5,174,855 A | 12/1992 | Tanaka |
| 5,180,431 A | 1/1993 | Sugimoto et al. |
| 5,197,846 A | 3/1993 | Uno et al. |
| 5,201,653 A | 4/1993 | Hasegawa et al. |
| 5,209,180 A | 5/1993 | Shoda et al. |
| 5,227,707 A | 7/1993 | Mitomi et al. |
| 5,234,499 A | 8/1993 | Sasaki et al. |
| 5,240,556 A | 8/1993 | Ishikawa et al. |
| 5,250,114 A | 10/1993 | Konishi et al. |
| 5,252,137 A | 10/1993 | Tateyama et al. |
| 5,254,367 A | 10/1993 | Matsumura et al. |
| D341,418 S | 11/1993 | Akimoto et al. |
| 5,275,658 A | 1/1994 | Kimura |
| 5,307,109 A | 4/1994 | Miyasaka et al. |
| 5,308,210 A | 5/1994 | Ohtani et al. |
| 5,312,487 A | 5/1994 | Akimoto et al. |
| 5,322,079 A | 6/1994 | Fukutomi et al. |
| 5,331,987 A | 7/1994 | Hayashi et al. |
| 5,339,128 A | 8/1994 | Tateyama et al. |
| 5,349,412 A | 9/1994 | Miyasaka |
| 5,359,785 A | 11/1994 | Fukutomi et al. |
| 5,374,312 A | 12/1994 | Hasebe et al. |
| 5,376,216 A | 12/1994 | Yoshioka et al. |
| 5,401,316 A | 3/1995 | Shiraishi et al. |
| 5,405,443 A | 4/1995 | Akimoto et al. |
| 5,411,076 A | 5/1995 | Matsunaga et al. |
| 5,416,047 A | 5/1995 | Konishi et al. |
| 5,418,382 A | 5/1995 | Blackwood et al. |
| 5,427,820 A | 6/1995 | Biche et al. |
| 5,430,271 A | 7/1995 | Orgami et al. |
| 5,431,700 A | 7/1995 | Sloan |
| 5,436,848 A | 7/1995 | Nishida et al. |
| 5,438,209 A | 8/1995 | Yamamoto et al. |
| 5,443,348 A | 8/1995 | Biche et al. |
| 5,485,644 A | 1/1996 | Shinbara et al. |
| 5,501,870 A | 3/1996 | Shiraishi et al. |
| 5,505,781 A | 4/1996 | Omori et al. |
| 5,514,215 A | 5/1996 | Takamatsu et al. |
| 5,514,852 A | 5/1996 | Takamori et al. |
| 5,520,744 A | 5/1996 | Fujikawa et al. |
| 5,522,215 A | 6/1996 | Matsunaga et al. |
| 5,536,918 A | 7/1996 | Ohkase et al. |
| 5,553,994 A | 9/1996 | Biche et al. |
| 5,555,234 A | 9/1996 | Sugimoto |
| 5,571,325 A | 11/1996 | Ueyama et al. |
| 5,580,607 A | 12/1996 | Takekuma et al. |
| 5,599,394 A | 2/1997 | Yabe et al. |
| 5,601,645 A | 2/1997 | Nonomura et al. |
| 5,608,943 A | 3/1997 | Konishi et al. |
| 5,611,685 A | 3/1997 | Nakajima et al. |
| 5,618,348 A | 4/1997 | Tran |
| 5,620,560 A | 4/1997 | Akimoto et al. |
| 5,625,433 A | 4/1997 | Inada et al. |
| 5,626,913 A | 5/1997 | Tomoeda et al. |
| 5,633,040 A | 5/1997 | Toshima et al. |
| 5,634,377 A | 6/1997 | Kimura et al. |
| 5,638,687 A | 6/1997 | Mizohata et al. |
| 5,639,301 A | 6/1997 | Sasada et al. |
| 5,651,823 A | 7/1997 | Parodi et al. |
| 5,658,615 A | 8/1997 | Hasebe et al. |
| 5,665,200 A | 9/1997 | Fujimoto et al. |
| 5,668,733 A | 9/1997 | Morimoto et al. |
| 5,670,210 A | 9/1997 | Mandal et al. |
| 5,672,205 A | 9/1997 | Fujimoto et al. |
| 5,674,410 A | 10/1997 | Nakajima et al. |
| 5,677,000 A | 10/1997 | Yoshioka et al. |
| 5,681,614 A | 10/1997 | Omori et al. |
| 5,687,085 A | 11/1997 | Morimoto et al. |
| 5,688,322 A | 11/1997 | Motoda et al. |
| 5,688,324 A | 11/1997 | Umaba |
| 5,688,326 A | 11/1997 | Kandori et al. |
| 5,689,749 A | 11/1997 | Tanaka et al. |
| 5,695,817 A | 12/1997 | Tateyama et al. |
| 5,700,046 A | 12/1997 | Van Doren et al. |
| 5,701,627 A | 12/1997 | Matsumura et al. |
| 5,704,493 A | 1/1998 | Fujikawa et al. |
| 5,711,809 A | 1/1998 | Kimura et al. |
| 5,715,173 A | 2/1998 | Nakajima et al. |
| 5,730,574 A | 3/1998 | Adachi et al. |
| 5,733,024 A | 3/1998 | Slocum et al. |
| 5,762,684 A | 6/1998 | Hayashi et al. |
| 5,762,708 A | 6/1998 | Motoda et al. |
| 5,762,709 A | 6/1998 | Sugimoto et al. |
| 5,762,745 A | 6/1998 | Hirose |

| | | | | | | |
|---|---|---|---|---|---|---|
| 5,763,892 | A | 6/1998 | Kizaki et al. | 6,004,047 | A | 12/1999 | Akimoto et al. |
| 5,765,072 | A | 6/1998 | Ohtani et al. | 6,007,629 | A | 12/1999 | Ohtani et al. |
| 5,766,671 | A | 6/1998 | Matsui | 6,010,570 | A | 1/2000 | Motoda et al. |
| 5,766,824 | A | 6/1998 | Batchelder et al. | 6,012,192 | A | 1/2000 | Sawada et al. |
| 5,772,764 | A | 6/1998 | Akimoto et al. | 6,012,858 | A | 1/2000 | Konishi et al. |
| 5,779,796 | A | 7/1998 | Tomoeda et al. | 6,013,317 | A | 1/2000 | Motoda et al. |
| 5,788,742 | A | 8/1998 | Sugimoto et al. | 6,015,066 | A | 1/2000 | Kimura et al. |
| 5,788,773 | A | 8/1998 | Okuda et al. | 6,017,663 | A | 1/2000 | Yaegashi et al. |
| 5,788,868 | A | 8/1998 | Itaba et al. | 6,018,616 | A | 1/2000 | Schaper |
| 5,792,259 | A | 8/1998 | Yoshioka et al. | 6,021,790 | A | 2/2000 | Yoshitani et al. |
| 5,803,932 | A | 9/1998 | Akimoto et al. | 6,033,475 | A | 3/2000 | Hasebe et al. |
| 5,803,970 | A | 9/1998 | Tateyama et al. | 6,040,120 | A | 3/2000 | Matsushita et al. |
| 5,817,156 | A | 10/1998 | Tateyama et al. | 6,048,400 | A | 4/2000 | Ohtani |
| 5,823,736 | A | 10/1998 | Matsumura | 6,051,101 | A | 4/2000 | Ohtani et al. |
| 5,826,130 | A | 10/1998 | Tanaka et al. | 6,051,349 | A | 4/2000 | Yoshioka |
| 5,834,737 | A | 11/1998 | Hirose et al. | 6,053,058 | A | 4/2000 | Hayashi et al. |
| 5,839,011 | A | 11/1998 | Urasaki et al. | 6,053,977 | A | 4/2000 | Konishi |
| 5,841,515 | A | 11/1998 | Ohtani | 6,056,998 | A | 5/2000 | Fujimoto |
| 5,843,527 | A | 12/1998 | Sanada | 6,059,880 | A | 5/2000 | Kitano et al. |
| 5,845,170 | A | 12/1998 | Ogata | 6,060,697 | A | 5/2000 | Morita et al. |
| 5,846,327 | A | 12/1998 | Kawamoto et al. | 6,062,240 | A | 5/2000 | Sada et al. |
| 5,853,483 | A | 12/1998 | Morita et al. | 6,062,288 | A | 5/2000 | Tateyama |
| 5,853,812 | A | 12/1998 | Kawasaki et al. | 6,062,852 | A | 5/2000 | Kawamoto et al. |
| 5,854,953 | A | 12/1998 | Semba | 6,063,190 | A | 5/2000 | Hasebe et al. |
| 5,866,307 | A | 2/1999 | Kiba et al. | 6,063,439 | A | 5/2000 | Semba et al. |
| 5,867,389 | A | 2/1999 | Hamada et al. | 6,067,727 | A | 5/2000 | Muraoka |
| 5,871,584 | A | 2/1999 | Tateyama et al. | 6,074,515 | A | 6/2000 | Iseki et al. |
| 5,875,804 | A | 3/1999 | Tanaka et al. | 6,076,652 | A | 6/2000 | Head |
| 5,881,750 | A | 3/1999 | Yoshitani | 6,076,979 | A | 6/2000 | Mimasaka et al. |
| 5,887,214 | A | 3/1999 | Kuriu et al. | 6,077,321 | A | 6/2000 | Adachi et al. |
| 5,888,344 | A | 3/1999 | Ogami et al. | 6,087,632 | A | 7/2000 | Mizosaki et al. |
| 5,898,588 | A | 4/1999 | Morimoto | 6,089,762 | A | 7/2000 | Mimasaka et al. |
| 5,904,169 | A | 5/1999 | Yoshitani | 6,097,005 | A | 8/2000 | Akimoto et al. |
| 5,906,469 | A | 5/1999 | Oka et al. | 6,099,643 | A | 8/2000 | Ohtani et al. |
| 5,906,860 | A | 5/1999 | Motoda et al. | 6,104,002 | A | 8/2000 | Hirose et al. |
| 5,908,657 | A | 6/1999 | Kimura et al. | 6,108,932 | A | 8/2000 | Chai |
| 5,912,054 | A | 6/1999 | Tateyama et al. | 6,113,695 | A | 9/2000 | Fujimoto |
| 5,915,396 | A | 6/1999 | Kinose | 6,117,486 | A | 9/2000 | Yoshihara |
| 5,916,366 | A | 6/1999 | Ueyama et al. | 6,120,834 | A | 9/2000 | Terauchi |
| 5,919,520 | A | 7/1999 | Tateyama et al. | 6,124,211 | A | 9/2000 | Butterbaugh |
| 5,919,529 | A | 7/1999 | Matsumura et al. | 6,126,725 | A | 10/2000 | Tateyama et al. |
| 5,921,257 | A | 7/1999 | Weber et al. | 6,128,829 | A | 10/2000 | Wolke et al. |
| 5,923,915 | A | 7/1999 | Akimoto et al. | 6,129,546 | A | 10/2000 | Sada |
| 5,927,077 | A | 7/1999 | Hisai et al. | 6,138,695 | A | 10/2000 | Shibao et al. |
| 5,927,303 | A | 7/1999 | Miya et al. | 6,142,722 | A | 11/2000 | Genov et al. |
| 5,932,380 | A | 8/1999 | Yaegashi et al. | 6,143,087 | A | 11/2000 | Walter |
| 5,935,768 | A | 8/1999 | Biche et al. | 6,143,478 | A | 11/2000 | Toshima et al. |
| 5,938,847 | A | 8/1999 | Akimoto et al. | 6,147,329 | A | 11/2000 | Okamura et al. |
| 5,939,130 | A | 8/1999 | Shiraishi et al. | 6,149,727 | A | 11/2000 | Yoshioka et al. |
| 5,941,083 | A | 8/1999 | Sada et al. | 6,155,275 | A | 12/2000 | Shinbara |
| 5,942,035 | A | 8/1999 | Hasebe et al. | 6,156,125 | A | 12/2000 | Harada et al. |
| 5,943,726 | A | 8/1999 | Eitoku et al. | 6,158,446 | A | 12/2000 | Mohindra |
| 5,943,880 | A | 8/1999 | Tateyama et al. | 6,159,291 | A | 12/2000 | Morita et al. |
| 5,945,161 | A | 8/1999 | Hashimoto et al. | 6,165,270 | A | 12/2000 | Konishi et al. |
| 5,960,225 | A | 9/1999 | Fujimoto | 6,165,273 | A | 12/2000 | Fayefield et al. |
| 5,962,070 | A | 10/1999 | Mitsuhashi et al. | 6,168,665 | B1 | 1/2001 | Sakai et al. |
| 5,963,753 | A | 10/1999 | Ohtani et al. | 6,169,274 | B1 | 1/2001 | Kulp |
| 5,965,200 | A | 10/1999 | Tateyama et al. | 6,174,371 | B1 | 1/2001 | Iseki et al. |
| 5,968,268 | A | 10/1999 | Kitano et al. | 6,176,667 | B1 | 1/2001 | Fairbaim et al. |
| 5,968,691 | A | 10/1999 | Yoshioka et al. | 6,177,133 | B1 | 1/2001 | Gurer et al. |
| 5,970,717 | A | 10/1999 | Tateyama et al. | 6,179,982 | B1 | 1/2001 | Ting et al. |
| 5,974,682 | A | 11/1999 | Akimoto et al. | 6,183,147 | B1 | 2/2001 | Kimura et al. |
| 5,976,256 | A | 11/1999 | Kawano | 6,185,370 | B1 | 2/2001 | Sekimoto et al. |
| 5,976,620 | A | 11/1999 | Sanada et al. | 6,190,063 | B1 | 2/2001 | Akimoto et al. |
| 5,984,540 | A | 11/1999 | Mimasaka et al. | 6,191,394 | B1 | 2/2001 | Shirakawa et al. |
| 5,985,357 | A | 11/1999 | Sanada | 6,193,783 | B1 | 2/2001 | Sakamoto et al. |
| 5,989,342 | A | 11/1999 | Ikeda et al. | 6,199,568 | B1 | 3/2001 | Arai et al. |
| 5,989,346 | A | 11/1999 | Hiroki | 6,200,633 | B1 | 3/2001 | Kitano et al. |
| 5,989,632 | A | 11/1999 | Sanada et al. | 6,202,653 | B1 | 3/2001 | Harada et al. |
| 5,992,431 | A | 11/1999 | Weber et al. | 6,203,969 | B1 | 3/2001 | Ueda |
| 5,993,518 | A | 11/1999 | Tateyama | 6,207,231 | B1 | 3/2001 | Tateyama |
| 6,000,862 | A | 12/1999 | Okuda | 6,210,481 | B1 | 4/2001 | Sakai |
| 6,002,108 | A | 12/1999 | Yoshioka | 6,216,475 | B1 | 4/2001 | Sada et al. |

| | | |
|---|---|---|
| 6,217,657 B1 | 4/2001 | Kiba et al. |
| 6,221,787 B1 | 4/2001 | Ogata |
| 6,222,161 B1 | 4/2001 | Shirakawa et al. |
| 6,224,638 B1 * | 5/2001 | Jevtic et al. ............... 29/25.01 |
| 6,227,786 B1 | 5/2001 | Tateyama |
| 6,228,171 B1 | 5/2001 | Shirakawa et al. |
| 6,228,561 B1 | 5/2001 | Hasebe |
| 6,229,116 B1 | 5/2001 | Shirakawa et al. |
| 6,235,641 B1 | 5/2001 | Christenson |
| 6,238,107 B1 | 5/2001 | Inada |
| 6,238,109 B1 | 5/2001 | Minami |
| 6,238,735 B1 | 5/2001 | Mandal et al. |
| 6,238,848 B1 | 5/2001 | Konishi et al. |
| 6,241,402 B1 | 6/2001 | Sakamoto et al. |
| 6,241,403 B1 | 6/2001 | Sakamoto et al. |
| 6,246,030 B1 | 6/2001 | Matsuyama et al. |
| 6,248,398 B1 | 6/2001 | Talieh et al. |
| 6,251,195 B1 | 6/2001 | Wagoner |
| 6,253,118 B1 | 6/2001 | Koyama |
| 6,254,936 B1 | 7/2001 | Gurer et al. |
| 6,257,778 B1 | 7/2001 | Toshima et al. |
| 6,257,827 B1 | 7/2001 | Hendrickson et al. |
| 6,258,167 B1 | 7/2001 | Kawano et al. |
| 6,260,562 B1 | 7/2001 | Morinishi et al. |
| 6,261,007 B1 | 7/2001 | Takamori et al. |
| 6,261,365 B1 | 7/2001 | Matsuyama et al. |
| 6,261,744 B1 | 7/2001 | Yoshioka |
| 6,266,125 B1 | 7/2001 | Fukuda |
| 6,267,516 B1 | 7/2001 | Nagamine et al. |
| 6,268,013 B1 | 7/2001 | Akimoto et al. |
| 6,273,104 B1 | 8/2001 | Shinbara et al. |
| 6,278,089 B1 | 8/2001 | Young et al. |
| 6,281,145 B1 | 8/2001 | Deguchi et al. |
| 6,284,043 B1 | 9/2001 | Takekuma |
| 6,287,390 B2 | 9/2001 | Sakai et al. |
| 6,291,800 B1 | 9/2001 | Shirakawa et al. |
| 6,292,250 B1 | 9/2001 | Matsuyama |
| 6,293,713 B1 | 9/2001 | Ueda |
| 6,299,938 B1 | 10/2001 | Tateyama |
| 6,300,043 B1 | 10/2001 | Konishi et al. |
| 6,302,960 B1 | 10/2001 | Baroudi et al. |
| 6,306,455 B1 | 10/2001 | Takemori et al. |
| 6,312,171 B1 | 11/2001 | Matsuyama et al. |
| 6,313,441 B1 | 11/2001 | Schaper |
| 6,313,903 B1 | 11/2001 | Ogata |
| 6,318,948 B1 | 11/2001 | Ueda et al. |
| 6,319,317 B1 | 11/2001 | Takemori |
| 6,327,793 B1 | 12/2001 | Gurer et al. |
| 6,332,723 B1 | 12/2001 | Matsuyama et al. |
| 6,336,204 B1 | 1/2002 | Jevtic |
| 6,340,643 B2 | 1/2002 | Ueda |
| 6,348,101 B1 | 2/2002 | Walter |
| 6,352,083 B1 | 3/2002 | Araki et al. |
| 6,354,311 B1 | 3/2002 | Kimura et al. |
| 6,359,264 B1 | 3/2002 | Shaper |
| 6,361,600 B1 | 3/2002 | Tateyama et al. |
| 6,364,547 B1 | 4/2002 | Matsuyama et al. |
| 6,368,776 B1 | 4/2002 | Harada et al. |
| 6,371,667 B1 | 4/2002 | Kitano et al. |
| 6,371,713 B1 | 4/2002 | Nishimura et al. |
| 6,379,056 B1 | 4/2002 | Ueda et al. |
| 6,380,518 B2 | 4/2002 | Shirakawa et al. |
| 6,382,849 B1 | 5/2002 | Sakamoto et al. |
| 6,383,948 B1 | 5/2002 | Kitano et al. |
| 6,384,894 B2 | 5/2002 | Matsuyama et al. |
| 6,391,111 B1 | 5/2002 | Fujimoto et al. |
| 6,398,429 B1 | 6/2002 | Toshima et al. |
| 6,401,353 B2 | 6/2002 | Kimura |
| 6,402,399 B2 | 6/2002 | Sakamoto et al. |
| 6,402,400 B1 | 6/2002 | Ueda et al. |
| 6,402,508 B2 | 6/2002 | Harada et al. |
| 6,402,509 B1 | 6/2002 | Ookura et al. |
| 6,402,844 B1 | 6/2002 | Harada et al. |
| 6,403,924 B1 | 6/2002 | Hayashi |
| 6,410,194 B1 | 6/2002 | Yoshihara |
| 6,416,583 B1 | 7/2002 | Kitano et al. |
| 6,418,356 B1 | 7/2002 | Oh |
| 6,419,408 B1 | 7/2002 | Inada |
| 6,431,769 B1 | 8/2002 | Fukuda et al. |
| 6,432,199 B1 | 8/2002 | Takekuma |
| 6,438,449 B2 | 8/2002 | Kawamatsu et al. |
| 6,440,218 B1 | 8/2002 | Sanada et al. |
| 6,443,641 B2 | 9/2002 | Takamori et al. |
| 6,444,029 B1 | 9/2002 | Kimura et al. |
| 6,446,646 B1 | 9/2002 | Izumi |
| 6,447,608 B1 | 9/2002 | Sakai et al. |
| 6,450,803 B2 | 9/2002 | Shirakawa et al. |
| 6,450,805 B1 | 9/2002 | Oda et al. |
| 6,451,515 B2 | 9/2002 | Takamori et al. |
| 6,454,332 B1 | 9/2002 | Govzman et al. |
| 6,458,208 B1 | 10/2002 | Anai et al. |
| 6,458,607 B1 | 10/2002 | Rangarajan et al. |
| 6,461,438 B1 | 10/2002 | Ookura et al. |
| 6,464,789 B1 | 10/2002 | Akimoto |
| 6,465,765 B2 | 10/2002 | Katayama et al. |
| 6,468,586 B1 | 10/2002 | Gurer et al. |
| 6,471,421 B2 | 10/2002 | Kitamura |
| 6,471,422 B1 | 10/2002 | Ueda et al. |
| 6,474,986 B2 | 11/2002 | Oda et al. |
| 6,475,279 B1 | 11/2002 | Akimoto et al. |
| 6,485,782 B2 | 11/2002 | Takamori |
| 6,485,893 B1 | 11/2002 | Matsuyama |
| 6,491,452 B2 | 12/2002 | Konishi et al. |
| 6,491,491 B1 | 12/2002 | Tsuneda et al. |
| 6,493,607 B1 | 12/2002 | Bourne et al. |
| 6,496,245 B2 | 12/2002 | Kosugi et al. |
| 6,501,191 B2 | 12/2002 | Tanaka et al. |
| 6,503,003 B2 | 1/2003 | Hasebe et al. |
| 6,507,770 B2 | 1/2003 | Tateyama et al. |
| 6,511,315 B2 | 1/2003 | Hashimoto |
| 6,514,073 B1 | 2/2003 | Toshima et al. |
| 6,514,343 B1 | 2/2003 | Motoda |
| 6,514,344 B2 | 2/2003 | Kitano et al. |
| 6,514,570 B1 | 2/2003 | Matsuyama et al. |
| 6,518,199 B2 | 2/2003 | Kitano et al. |
| 6,526,329 B2 | 2/2003 | Tateyama et al. |
| 6,527,860 B1 | 3/2003 | Yoshihara et al. |
| 6,527,861 B2 | 3/2003 | Takekuma |
| 6,530,993 B2 | 3/2003 | Hwang et al. |
| 6,533,531 B1 | 3/2003 | Nguyen et al. |
| 6,533,864 B1 | 3/2003 | Matsuyama et al. |
| 6,534,750 B1 | 3/2003 | Tanoue et al. |
| 6,536,964 B1 | 3/2003 | Kitano et al. |
| 6,537,373 B1 | 3/2003 | Kitano et al. |
| 6,539,956 B1 | 4/2003 | Wolke et al. |
| 6,541,170 B2 | 4/2003 | Fukuda et al. |
| 6,541,376 B2 | 4/2003 | Inada et al. |
| 6,550,988 B2 | 4/2003 | Sugimoto et al. |
| 6,551,400 B2 | 4/2003 | Hasbe et al. |
| 6,551,448 B2 | 4/2003 | Kuga et al. |
| 6,556,893 B2 | 4/2003 | Kumar et al. |
| 6,558,053 B2 | 5/2003 | Shigemori et al. |
| 6,568,847 B2 | 5/2003 | Nishijima et al. |
| 6,571,147 B1 | 5/2003 | Kashihara |
| 6,573,031 B2 | 6/2003 | Shinya et al. |
| 6,578,772 B2 | 6/2003 | Fujimoto et al. |
| 6,579,370 B2 | 6/2003 | Kimura et al. |
| 6,579,733 B2 | 6/2003 | Rangarajan et al. |
| 6,589,339 B2 | 7/2003 | Takeshita et al. |
| 6,598,805 B2 | 7/2003 | Sakai et al. |
| 6,599,366 B1 | 7/2003 | Kitano et al. |
| 6,602,382 B1 | 8/2003 | Matsuyama et al. |
| 6,605,153 B2 | 8/2003 | Kitano et al. |
| 6,616,394 B1 | 9/2003 | Park |
| 6,616,760 B2 | 9/2003 | Kitano et al. |
| 6,616,762 B2 | 9/2003 | Inada et al. |

| | | |
|---|---|---|
| 6,617,095 B2 | 9/2003 | Kitano et al. |
| 6,620,244 B2 | 9/2003 | Yoshihara et al. |
| 6,620,245 B2 | 9/2003 | Ishida et al. |
| 6,620,251 B2 | 9/2003 | Kitano et al. |
| 6,627,263 B2 | 9/2003 | Kitano et al. |
| 6,633,022 B2 | 10/2003 | Kitano et al. |
| 6,634,806 B2 | 10/2003 | Toshima et al. |
| 6,635,113 B2 | 10/2003 | Takamori et al. |
| 6,644,965 B2 | 11/2003 | Ookura et al. |
| 6,645,880 B1 | 11/2003 | Shigemori et al. |
| 6,654,668 B1 | 11/2003 | Harada et al. |
| 6,656,277 B2 | 12/2003 | Sanada et al. |
| 6,656,281 B1 | 12/2003 | Ueda et al. |
| 6,659,661 B2 | 12/2003 | Deguchi et al. |
| 6,662,466 B2 | 12/2003 | Gurer et al. |
| 6,669,782 B1 | 12/2003 | Thakur |
| 6,669,808 B2 | 12/2003 | Adachi et al. |
| 6,672,779 B2 | 1/2004 | Ueda et al. |
| 6,673,151 B2 | 1/2004 | Yoshihara et al. |
| 6,676,757 B2 | 1/2004 | Kitano et al. |
| 6,678,572 B1 | 1/2004 | Oh |
| 6,678,582 B2 | 1/2004 | Waled |
| 6,683,006 B2 | 1/2004 | Konishi et al. |
| 6,686,571 B2 | 2/2004 | Ookura et al. |
| 6,689,215 B2 | 2/2004 | Nguyen |
| 6,691,216 B2 | 2/2004 | Nguyen |
| 6,691,430 B2 | 2/2004 | Saito et al. |
| 6,692,165 B2 | 2/2004 | Tanaka et al. |
| 6,694,224 B2 | 2/2004 | Ramanan |
| 6,695,922 B2 | 2/2004 | Kitano et al. |
| 6,703,316 B2 | 3/2004 | Inoue et al. |
| 6,706,321 B2 | 3/2004 | Nishiya et al. |
| 6,709,174 B2 | 3/2004 | Yamamoto et al. |
| 6,709,523 B1 | 3/2004 | Toshima et al. |
| 6,712,579 B2 | 3/2004 | Fujii et al. |
| 6,713,120 B2 | 3/2004 | Fukuda |
| 6,713,239 B2 | 3/2004 | Toshima et al. |
| 6,715,943 B2 | 4/2004 | Nagamine |
| 6,716,478 B2 | 4/2004 | Kitano et al. |
| 6,726,771 B2 | 4/2004 | Ueda et al. |
| 6,730,599 B2 | 5/2004 | Inada et al. |
| 6,736,556 B2 | 5/2004 | Kanagawa et al. |
| 6,744,020 B2 | 6/2004 | Shirakawa et al. |
| 6,749,351 B2 | 6/2004 | Sanada et al. |
| 6,749,688 B2 | 6/2004 | Tateyama et al. |
| 6,752,543 B2 | 6/2004 | Fukutomi et al. |
| 6,752,544 B2 | 6/2004 | Sanada et al. |
| 6,752,872 B2 | 6/2004 | Inada et al. |
| 6,753,508 B2 | 6/2004 | Shirakawa |
| 6,761,125 B2 | 7/2004 | Kitano et al. |
| 6,768,930 B2 | 7/2004 | Oh |
| 6,770,424 B2 | 8/2004 | Mandal et al. |
| 6,773,510 B2 | 8/2004 | Kitano et al. |
| 6,775,456 B2 | 8/2004 | Matsuura |
| 6,780,461 B2 | 8/2004 | Gurer et al. |
| 6,780,795 B2 | 8/2004 | Suzuki et al. |
| 6,790,283 B2 | 9/2004 | Hayashi et al. |
| 6,790,286 B2 | 9/2004 | Nishimura et al. |
| 6,790,287 B2 | 9/2004 | Shiga et al. |
| 6,790,291 B2 | 9/2004 | Kimura |
| 6,793,769 B2 | 9/2004 | Kajino et al. |
| 6,796,054 B2 | 9/2004 | Minami et al. |
| 6,799,939 B2 | 10/2004 | Lowrance et al. |
| 6,805,769 B2 | 10/2004 | Okuda et al. |
| 6,807,452 B2 | 10/2004 | Mukuta et al. |
| 6,807,455 B2 | 10/2004 | Yoshida et al. |
| 6,808,566 B2 | 10/2004 | Kitano et al. |
| 6,809,036 B2 | 10/2004 | Liu |
| 6,811,613 B2 | 11/2004 | Kitano et al. |
| 6,811,962 B2 | 11/2004 | Yoshihara et al. |
| 6,814,507 B2 | 11/2004 | Inagaki |
| 6,814,809 B2 | 11/2004 | Matsushita et al. |
| 6,815,647 B2 | 11/2004 | Tanoue et al. |
| 6,817,790 B2 | 11/2004 | Toshima et al. |
| 6,821,550 B2 | 11/2004 | Deguchi et al. |
| 6,822,413 B2 | 11/2004 | Simondet et al. |
| 6,823,880 B2 | 11/2004 | Sakashita et al. |
| 6,824,616 B2 | 11/2004 | Kitano et al. |
| 6,826,214 B2 | 11/2004 | Nomoto |
| 6,827,782 B2 | 12/2004 | Goto et al. |
| 6,830,774 B2 | 12/2004 | Hayashi et al. |
| 6,832,863 B2 | 12/2004 | Sugimoto et al. |
| 6,834,210 B2 | 12/2004 | Tateyama et al. |
| 6,837,631 B2 | 1/2005 | Nakano et al. |
| 6,837,632 B2 | 1/2005 | Koyama et al. |
| 6,841,031 B2 | 1/2005 | Iwata et al. |
| 6,841,342 B2 | 1/2005 | Nishi et al. |
| 6,843,259 B2 | 1/2005 | Nagamine |
| 6,848,625 B2 | 2/2005 | Takekuma et al. |
| 6,851,872 B1 | 2/2005 | Okubo et al. |
| 6,860,945 B2 | 3/2005 | Kobayashi et al. |
| 6,868,888 B2 | 3/2005 | Adachi |
| 6,869,234 B2 | 3/2005 | Sanada et al. |
| 6,869,640 B2 | 3/2005 | Yoshihara et al. |
| 6,872,256 B2 | 3/2005 | Kitano et al. |
| 6,874,513 B2 | 4/2005 | Yamagata et al. |
| 6,878,216 B2 | 4/2005 | Fujishima |
| 6,878,303 B2 | 4/2005 | Okamoto |
| 6,878,401 B2 | 4/2005 | Nishijima et al. |
| 6,878,501 B2 | 4/2005 | Hatakeyama et al. |
| 6,884,294 B2 | 4/2005 | Minami et al. |
| 6,885,467 B2 | 4/2005 | Du-Nour et al. |
| 6,889,105 B2 | 5/2005 | Mukuta et al. |
| 6,893,171 B2 | 5/2005 | Fukutomi et al. |
| 6,893,513 B2 | 5/2005 | Michaluk et al. |
| 6,893,805 B2 | 5/2005 | Iseki et al. |
| 6,896,466 B2 | 5/2005 | Nishimura et al. |
| 7,255,747 B2 | 8/2007 | Ishikawa et al. |
| 2003/0040193 A1 * | 2/2003 | Bailey et al. ................ 438/710 |
| 2004/0091349 A1 | 5/2004 | Tabrizie et al. |
| 2006/0134330 A1 | 6/2006 | Ishikawa et al. |
| 2006/0182536 A1 | 8/2006 | Rice et al. |

FOREIGN PATENT DOCUMENTS

| | | |
|---|---|---|
| EP | 1 114 882 A | 7/2001 |
| JP | 07235473 | 9/1995 |
| JP | 10006757 | 1/1998 |
| JP | 11279797 | 10/1999 |
| JP | 05-003151 | 1/2003 |
| KR | 2004-013965 | 2/2004 |
| WO | WO 00/12958 | 3/2000 |

OTHER PUBLICATIONS

International Search Report. Jan. 6, 2009.

* cited by examiner

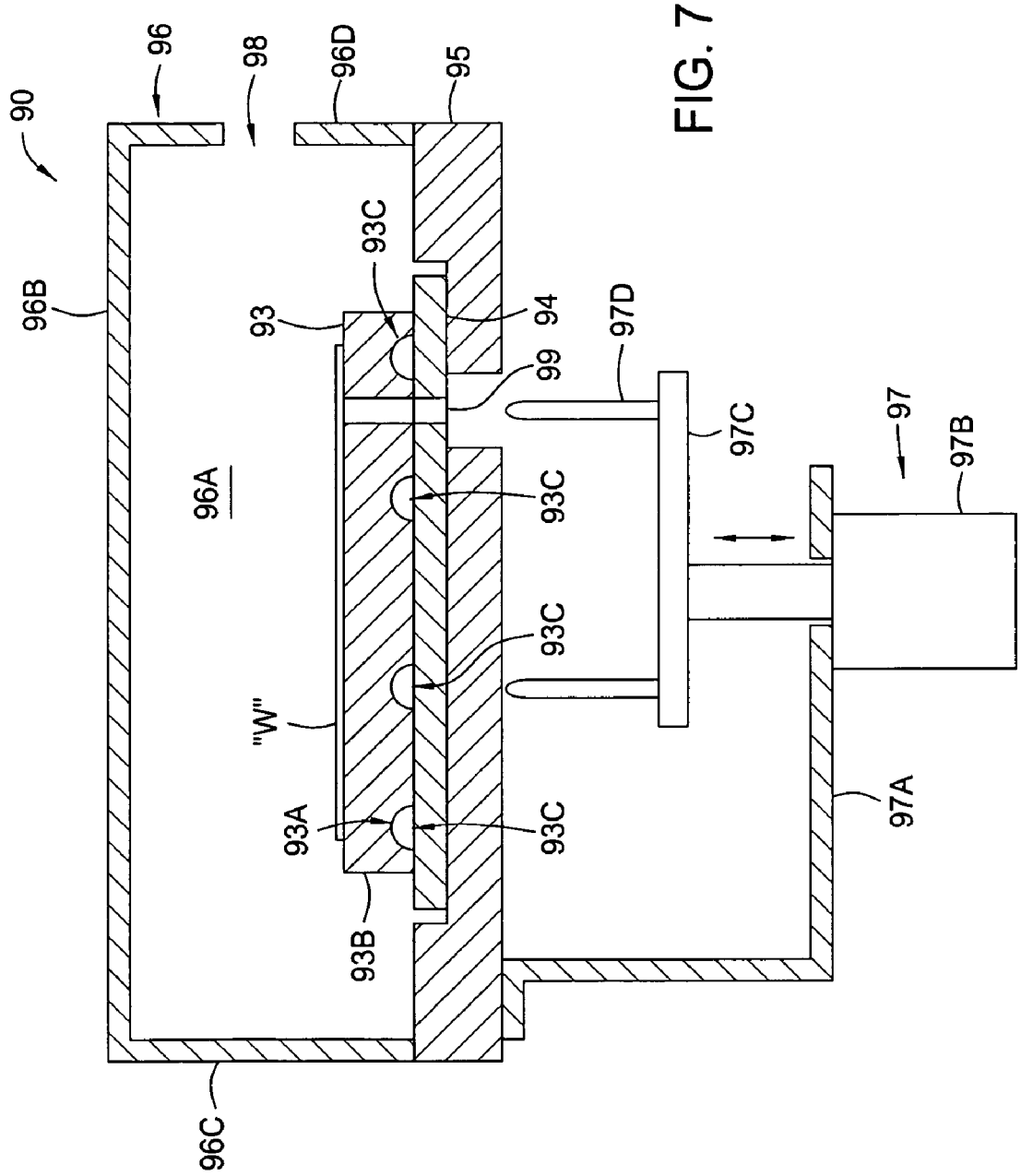

CLUSTER TOOL SUBSTRATE THROUGHPUT OPTIMIZATION

CROSS-REFERENCE TO RELATED APPLICATIONS

This application is a continuation-in-part of U.S. patent application Ser. No. 11/112,281, filed Apr. 22, 2005, now U.S. Pat. No. 7,357,842 which claims the benefit of U.S. Provisional Patent Application Ser. No. 60/639,109, filed Dec. 22, 2004. Each of the aforementioned related patent applications is herein incorporated by reference.

BACKGROUND OF THE INVENTION

1. Field of the Invention

Embodiments of the invention generally relate to an integrated processing system containing multiple processing stations and robots that are capable of processing multiple substrates in parallel.

2. Description of the Related Art

The process of forming electronic devices is commonly done in a multi-chamber processing system (e.g., a cluster tool) that has the capability to sequentially process substrates, (e.g., semiconductor wafers) in a controlled processing environment. A typical cluster tool used to deposit and develop a photoresist material, commonly known as a track lithography tool, will include a mainframe that houses at least one substrate transfer robot which transports substrates between a pod/cassette mounting device and multiple processing chambers that are connected to the mainframe. Cluster tools are often used so that substrates can be processed in a repeatable way in a controlled processing environment. A controlled processing environment has many benefits which include minimizing contamination of the substrate surfaces during transfer and during completion of the various substrate processing steps. Processing in a controlled environment thus reduces the number of generated defects and improves device yield.

The effectiveness of a substrate fabrication process is often measured by two related and important factors, which are device yield and the cost of ownership (CoO). These factors are important since they directly affect the cost to produce an electronic device and thus a device manufacturer's competitiveness in the market place. The CoO, while affected by a number of factors, is greatly affected by the system and chamber throughput, or simply the number of substrates per hour processed using a desired processing sequence.

A process sequence is generally defined as the sequence of device fabrication steps, or process recipe steps, completed in one or more processing chambers in the cluster tool. A process sequence may generally contain various substrate (or wafer) electronic device fabrication processing steps. In an effort to reduce CoO, electronic device manufacturers often spend a large amount of time trying to optimize the process sequence and chamber processing time to achieve the greatest substrate throughput possible given the cluster tool architecture limitations and the chamber processing times.

In track lithography type cluster tools, since the chamber processing times tend to be rather short, e.g., about a minute to complete the process, and the number of processing steps required to complete a typical process sequence is large, a significant portion of the time it takes to complete the processing sequence is taken up transferring the substrates between the various processing chambers. A typical track lithography process sequence will generally include the following steps: depositing one or more uniform photoresist (or resist) layers on the surface of a substrate, then transferring the substrate out of the cluster tool to a separate stepper or scanner tool to pattern the substrate surface by exposing the photoresist layer to a photoresist modifying electromagnetic radiation, and then developing the patterned photoresist layer.

The longest process recipe step will generally limit the throughput of the processing sequence. Sometimes the longest step may be taken by transferring the substrate by a robot, which is generally referred as robot limited. This is usually not the case in track lithography process sequences, due to the short processing times and large number of processing steps. Typical system throughput for the conventional fabrication processes, such as a track lithography tool running a typical process, will generally be between 100-120 substrates per hour.

A track lithography process sequences is generally robot limited due to the short processing times and large number of processing steps. Therefore, reducing transferring time is sometimes an efficient way to increase system throughput and reduce CoO. Transferring time may be decided by several factors, for example the robot trajectory paths in the sequence, and the time spent on collision avoidance. There are generally multiple paths for a robot to move from one point to another point.

Other important factors in the CoO calculation are the system reliability and system uptime. These factors are very important to a cluster tool's profitability and/or usefulness, since the longer the system is unable to process substrates the more money is lost by the user due to the lost opportunity to process substrates in the cluster tool. Therefore, cluster tool users and manufacturers spend a large amount of time trying to develop reliable processes, reliable hardware and reliable systems that have increased uptime.

The push in the industry to shrink the size of semiconductor devices to improve device processing speed and reduce the generation of heat by the device, has caused the industry's tolerance to process variability to diminish. Due to the shrinking size of semiconductor devices and the ever increasing device performance requirements, the allowable variability of the device fabrication process uniformity and repeatability has greatly decreased. To minimize process variability an important factor in the track lithography processing sequences is the issue of assuring that every substrate run through a cluster tool has the same "wafer history." A substrate's wafer history is generally monitored and controlled by process engineers to assure that all of the device fabrication processing variables that may later affect a device's performance are controlled, so that all substrates in the same batch are always processed the same way. To assure that each substrate has the same "wafer history" requires that each substrate experiences the same repeatable substrate processing steps (e.g., consistent coating process, consistent hard bake process, consistent chill process, etc.) and the timing between the various processing steps is the same for each substrate. Lithography type device fabrication processes can be especially sensitive to variations in process recipe variables and the timing between the recipe steps, which directly affects process variability and ultimately device performance. Therefore, a cluster tool and supporting apparatus capable of performing a process sequence that minimizes process variability and the variability in the timing between process steps is needed. Also, a cluster tool and supporting apparatus that is capable of performing a device fabrication process that delivers a uniform and repeatable process result, while achieving a desired substrate throughput is also needed.

Therefore, there is a need for a system, a method and an apparatus that can process a substrate so that it can meet the required device performance goals and increase the system throughput and thus reduce the process sequence CoO.

SUMMARY OF THE INVENTION

The present invention generally provides a cluster tool for processing a substrate. The cluster tool comprises a first module comprises a first processing rack having vertically stacked processing chambers, a second processing rack having vertically stacked processing chambers, wherein the first and second processing racks are positioned substantially parallel to each other, and a first robot disposed between the first and second processing racks, a second module comprises a third processing rack having vertically stacked processing chambers, a fourth processing rack having vertically stacked processing chambers, wherein the third and fourth processing racks are positioned substantially parallel to each other, and a second robot disposed between the third and fourth processing racks, and at least one buffering station, wherein the second module is positioned on one side of the first module such that the first processing rack is next to the third processing rack and the third processing rack is next to the fourth processing rack, and the at least buffering station is disposed in a location where both the first and second robots can reach.

Embodiments of the invention further provide a cluster tool for processing a substrate. The cluster tool comprises a first processing rack containing vertical stacks of substrate processing chambers, a second processing rack containing vertical stacks of substrate processing chambers, a first robot disposed between the first and second processing racks, wherein the first robot is adapted to transfer the substrate among the substrate processing chambers of the first and second processing racks, a second robot disposed between the first and second processing racks, wherein the second robot is adapted to transfer the substrate among the substrate processing chambers of the first and second processing racks, and at least one buffering station disposed between the first and second processing racks and adapted to be accessible by the first and second robots.

Embodiments of the invention further provide a method for processing a substrate in a cluster tool. The method comprises providing a plurality of processing chambers vertically stacked together, providing a first robot configured to transfer substrates among the processing chambers following at least one non-orthogonal trajectory, and handling the substrate by the first robot to transfer the substrate among the processing chambers.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 7B is a side view that illustrates one embodiment of a bake chamber wherein the present invention may be used to advantage.

DETAILED DESCRIPTION

The present invention generally provides an apparatus and method for processing substrates using a multi-chamber processing system (e.g., a cluster tool) that has an increased system throughput, increased system reliability, and a more repeatable wafer processing history (or wafer history) within the cluster tool. In one embodiment, the cluster tool is adapted to perform a track lithography process in which a substrate is coated with a photosensitive material, is then transferred to a stepper/scanner, which exposes the photosensitive material to some form of radiation to form a pattern in the photosensitive material, and then certain portions of the photosensitive material are removed in a developing process completed in the cluster tool.

Figure 1A:
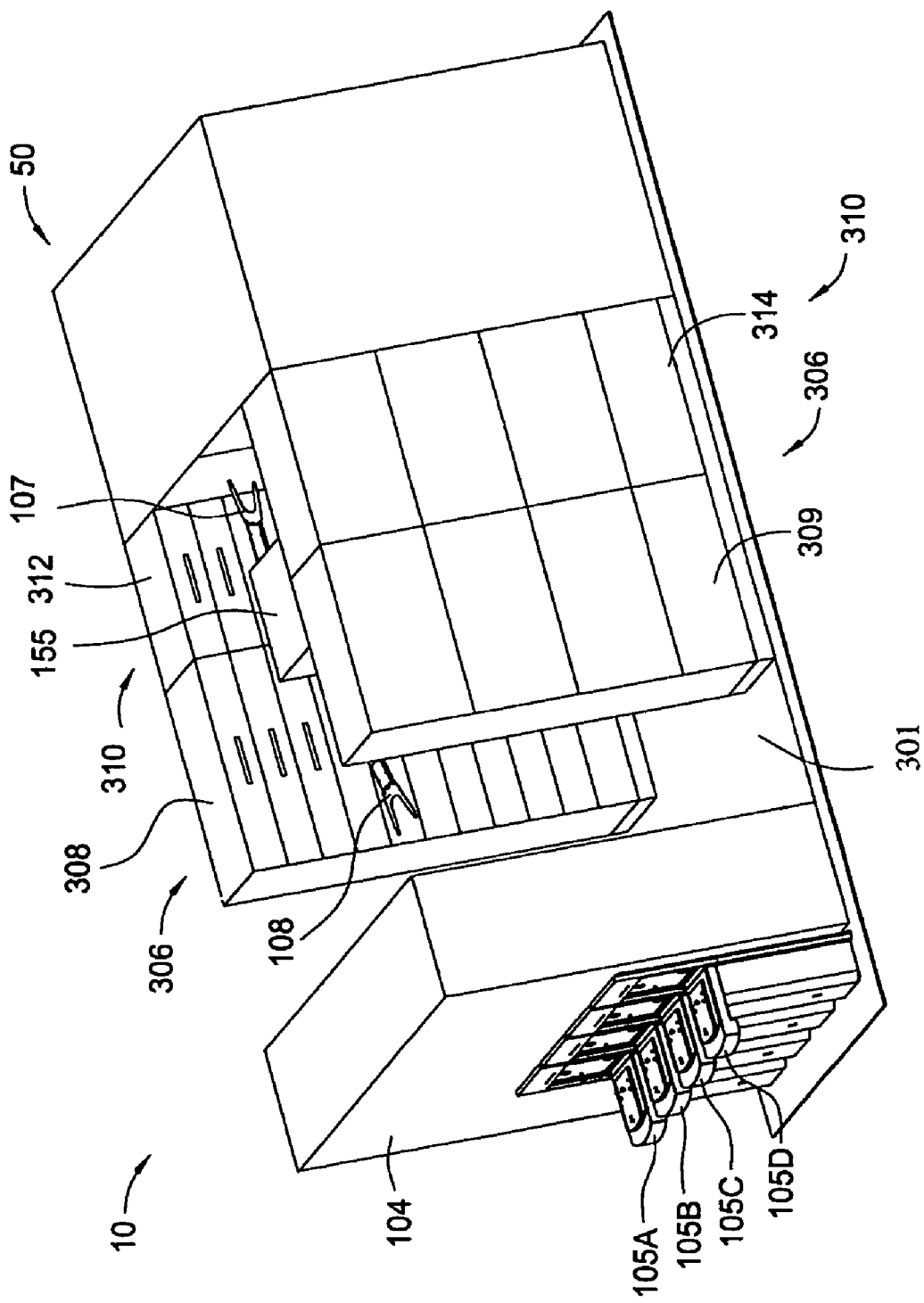
FIG. 1A is an isometric view illustrating a cluster tool according to an embodiment of the invention.
Figure 1B:
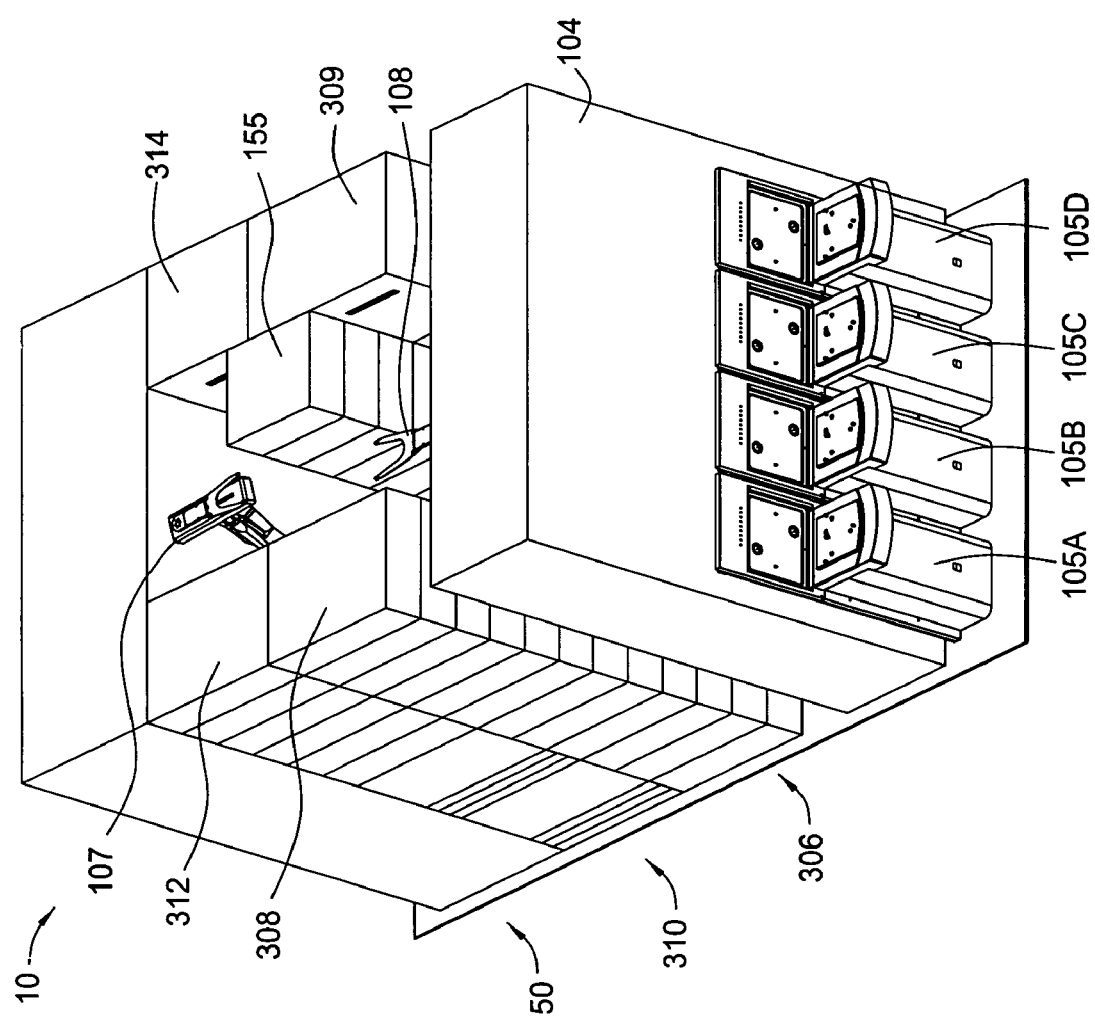
FIG. 1B is another isometric view illustrating a view from the opposite side shown in FIG. 1A.

FIGS. 1A and 1B are isometric views of one embodiment of a cluster tool 10 that illustrates a number of the aspects of the present invention that may be used to advantage. One embodiment of the cluster tool 10, as illustrated in FIGS. 1A and 1B, has a shape of a box which has four walls formed by a front end enclosure 104, a front module 306, a central module 310, and a rear module 50. In one embodiment, there are two gaps 301 between the front end enclosure 104 and the front module 306 enabling maintenance and/or manual interference. The front end enclosure 104 generally contains one or more pod assemblies 105 (e.g., items 105A-D) configured to support one or more substrates. The front module 306 generally contains a front end robot 108, first and second processing racks 308 and 309 disposed on opposite sides of the front end robot 108. The central module 310 generally contain a first central processing rack 312, a second central processing rack 314, and a central robot 107. In one embodiment, a buffer rack 155 is generally disposed between the front robot 108 and the central robot 107 adapted to be accessible by both robots 107 and 108. The buffer rack 155 may be positioned in suitable locations to avoid collisions between robots, improve throughput and/or serve as depair stations.

Figure 2A:
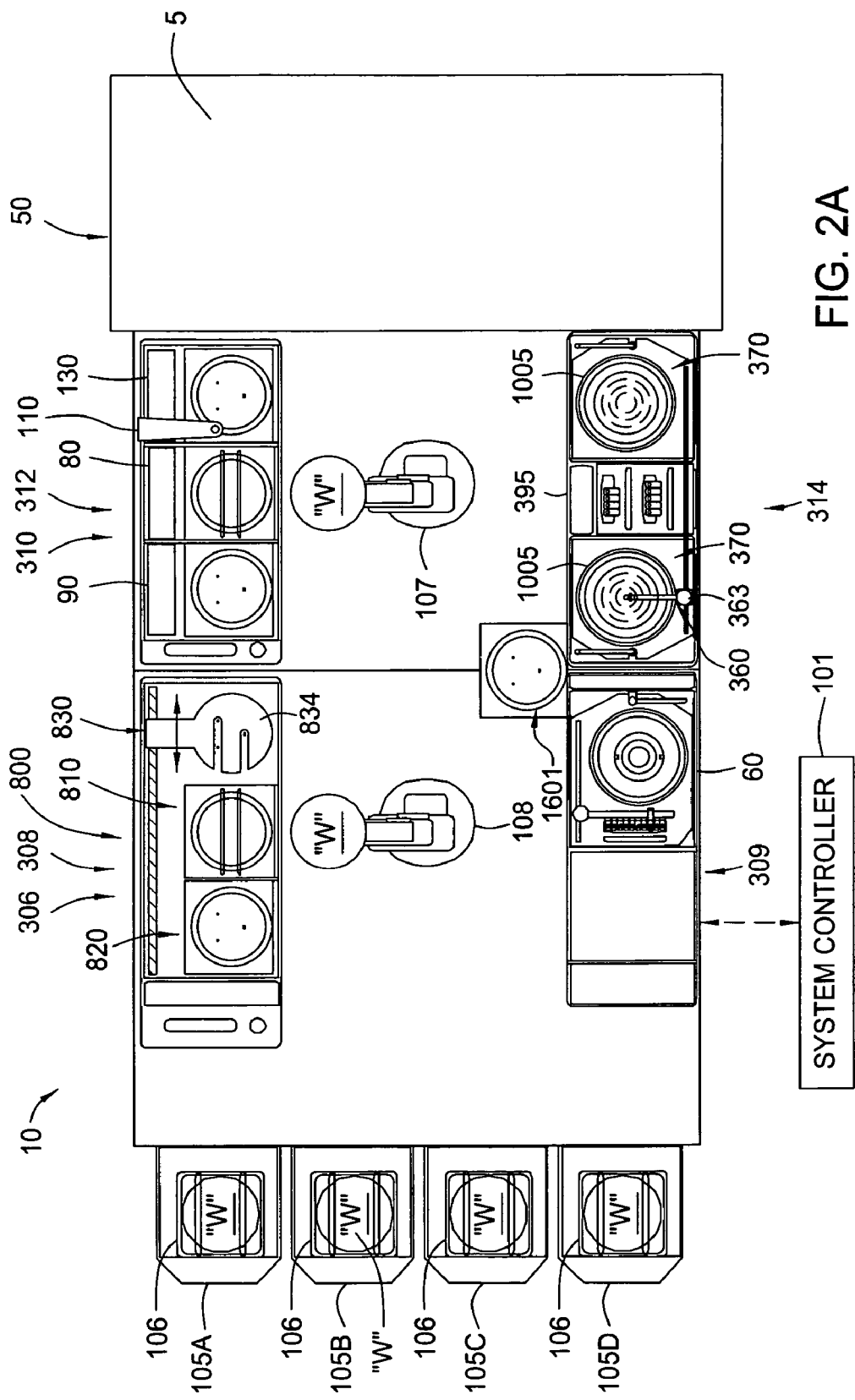
FIG. 2A is a plan view that illustrates another embodiment of cluster tool that contains a front end module and a central processing module, which each contain two processing racks.

FIG. 2A illustrates a plan view of the cluster tool 10 illustrated in FIG. 1A. In this configuration the front module 306 may contain a first processing rack 308 and a second processing rack 309, and the central module 310 may contain a first central processing rack 312 and a second central processing rack 314. A plurality of buffering stations 1601 is generally disposed near the border between the front module 306 and the central module 310. The buffering stations 1601 are configured to support one or more substrates and are accessible from more than one angle so that the robots 107 and 108 may access the buffering stations 1601 from two different directions, therefore, avoid collision and eliminate time used for collision avoidance. The rear module 50 may contain a stepper/scanner 5. The front end robot 108 is adapted to transfer substrates between a cassette 106 mounted in a pod assembly 105, the first processing rack 308, the second processing rack 309, the first central processing rack 312, the second central processing rack 314, the buffering stations 1601, and/or the central robot 107. The central robot 107 is adapted to transfer substrates between the first processing rack 308, the second processing rack 309, the first central processing rack 312, the second central processing rack 314, the front end robot 108, the buffering stations 1601, and/or the stepper/scanner 5. In one embodiment, the front end robot 108, and the central robot 107 are articulated robots (described below).

In one aspect, the front end robot 108 is positioned in a central location between the first processing rack 308 and a second processing rack 309 of the front module 306. In another aspect, the central robot 107 is positioned in a central location between the first central processing rack 312 and a second central processing rack 314 of the central module 310.

In one embodiment, a system controller 101 is used to control all of the components and processes performed in the cluster tool 10. The system controller 101 is generally adapted to communicate with the stepper/scanner 5, monitor and control aspects of the processes performed in the cluster tool 10, and is adapted to control all aspects of the complete substrate processing sequence.

Figure 2B:
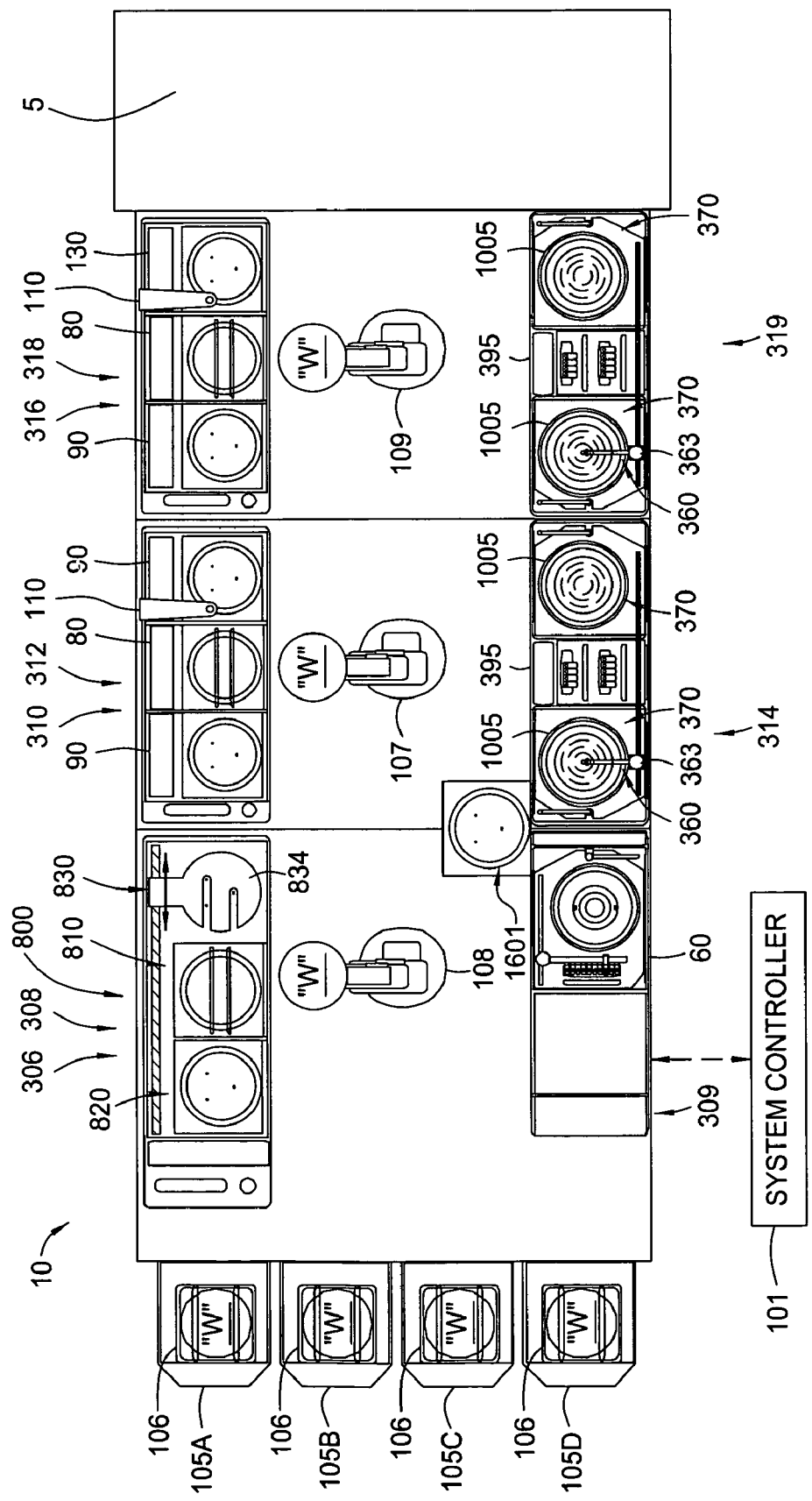
FIG. 2B is a plan view that illustrates another embodiment of cluster tool that contains a front end module, central processing module and a rear processing module, which each contain two processing racks.

FIG. 2B is a plan view of another embodiment of the cluster tool 10, which is similar to the embodiment shown in FIG. 2A, with the addition of a rear module 316 which may be attached to a stepper/scanner 5. In this embodiment the front module 306 may contain a first processing rack 308 and a second processing rack 309, the central module 310 may contain a first central processing rack 312 and a second central processing rack 314, and the rear module 316 may contain a first rear processing rack 318 and a second rear processing rack 319. A plurality of buffering stations 1601 is generally disposed near the border between the front module 306 and the central module 310. The front end robot 108 is adapted to transfer substrates between a cassette 106 mounted in a pod assembly 105, the first processing rack 308, the second processing rack 309, the first central processing rack 312, the second central processing rack 314, the buffering stations 1601, and/or the central robot 107. The central robot 107 is adapted to transfer substrates between the first processing rack 308, the second processing rack 309, the first central processing rack 312, the second central processing rack 314, the first rear processing rack 318, the second rear processing rack 319, the front end robot 108, the buffering stations 1601, and/or the rear robot 109. The rear robot 109 is adapted to transfer substrates between the first central processing rack 312, the second central processing rack 314, the first rear processing rack 318, the second rear processing rack 319, the central robot 107, and/or the stepper/scanner 5. In one embodiment, one or more of the front end robot 108, the central robot 107, and the rear robot 109 are articulated robots (described below).

In one aspect, the rear robot 109 is positioned in a central location between the first rear processing rack 318 and a second rear processing rack 319 of the rear module 316.

The embodiments illustrated in FIGS. 2A and 2B may be advantageous since the gap formed between the processing racks forms a relatively open space that will allow maintenance personnel access to cluster tool components that have become inoperable. As shown in FIGS. 2A and 2B, in one aspect of the invention, the gap is as wide as the space between the processing racks and as high the height of the processing racks. Since system down-time and system availability are important components in determining the CoO for a given tool, the ability to easily access and maintain the cluster tool components have an advantage over other prior art configurations.

Figure 2C:
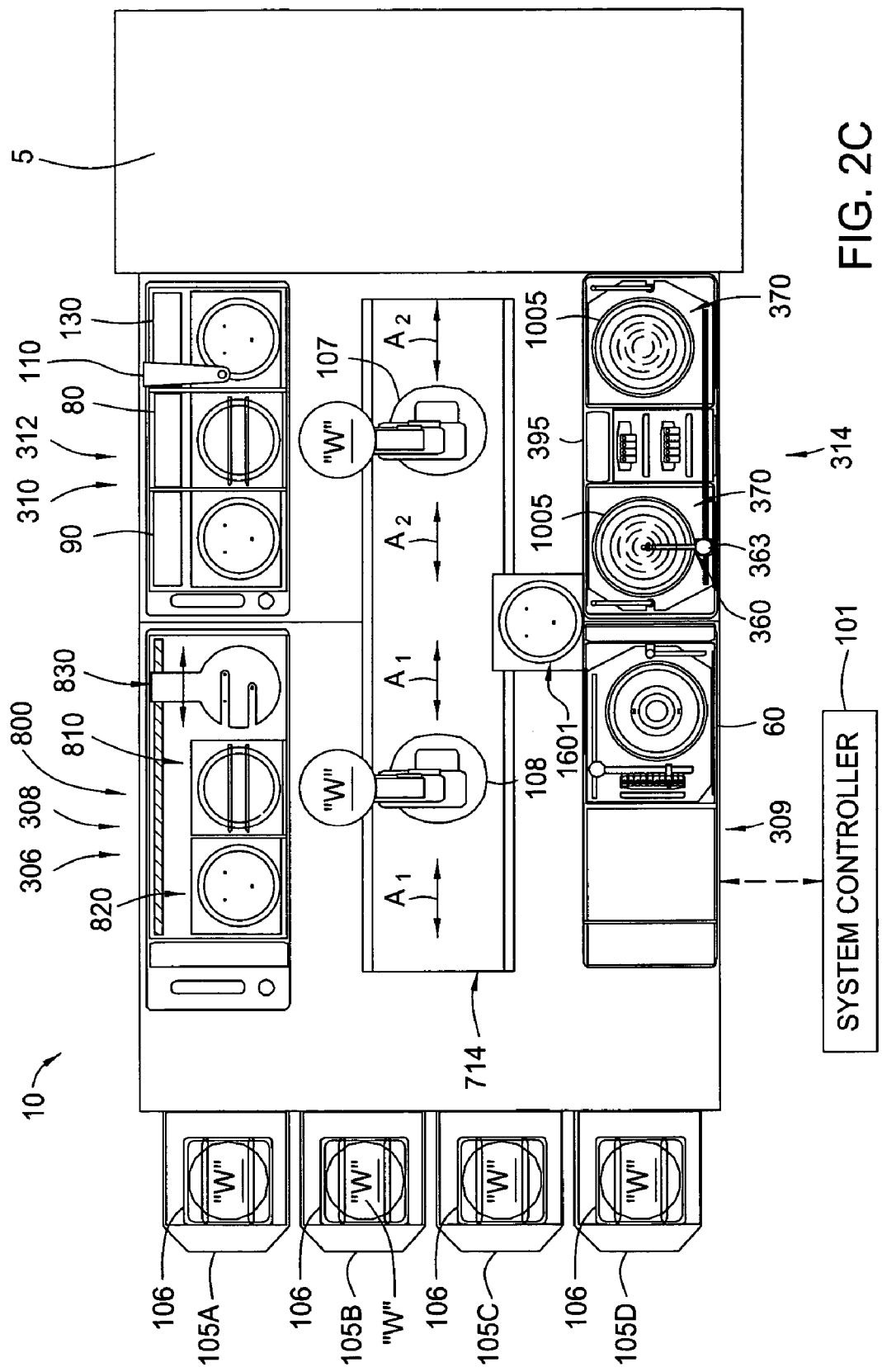
FIG. 2C is a plan view that illustrates another embodiment of cluster tool that contains a front end module and a central processing module, which each contain two processing racks and a slide assembly to allow the base of the front end and central robots to translate.

FIG. 2C is a plan view of yet another embodiment of the cluster tool 10, which is similar to the embodiment shown in FIG. 2A, with the addition of a slide assembly 714 (FIG. 8F) which allows the base of the front end robot 108 and the central robot 107 to translate along the length (items $A_1$ and $A_2$, respectively) of the cluster tool. This configuration extends the reach of each of the robots and improves the "robot overlap." Robot overlap is the ability of a robot to access processing chambers in the processing rack of other modules. While FIG. 2C illustrates the front end robot 108 and the central robot 107 on a single slide assembly 714 other embodiments may include having each of the robots (Items 107 and 108) on their own slide assembly or only one of the robots mounted on a slide assembly and the other mounted to the floor or system frame, without varying from the scope of the invention.

Figure 2D:
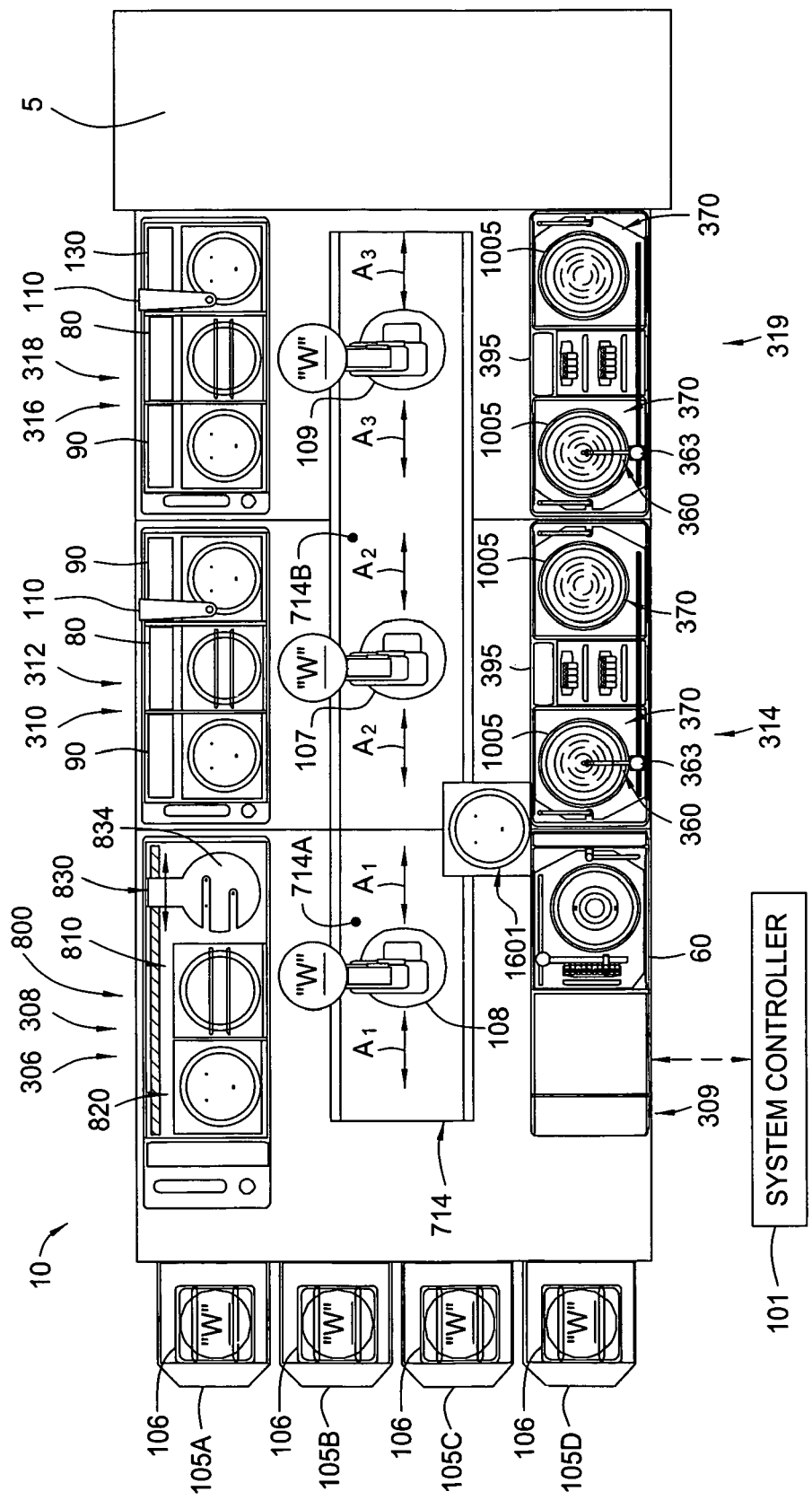
FIG. 2D is a plan view that illustrates another embodiment of cluster tool that contains a front end module, central processing module and a rear processing module, which each contain two processing racks and two slide assemblies to allow the base of the front end, central robot and rear robots to translate.

FIG. 2D is a plan view of yet another embodiment of the cluster tool 10, which is similar to the embodiment shown in FIG. 2B, with the addition of two slide assemblies 714A-B (described in FIG. 8F) which allows the base of the front end robot 108 and the base of the central robot 107 and rear robot 109 to translate along the length (items $A_1$, $A_2$ and $A_3$, respectively) of the cluster tool 10. While FIG. 2D illustrates the front end robot 108 on one slide assembly 714A and the central robot 107 and the rear robot 109 on a single slide assembly 714B, other embodiments may include having one or more of the robots (Items 107, 108 and 109) on their own slide assembly (not shown), on a shared slide assembly or all three on a single slide assembly (not shown), without varying from the scope of the invention.

It should be noted that buffering stations, such as the buffering stations 1601 in cluster tool 10 of FIGS. 2A-D, may be positioned in different locations in a cluster tool depending on the needs.

Photolithography Process Sequence

Figure 3:
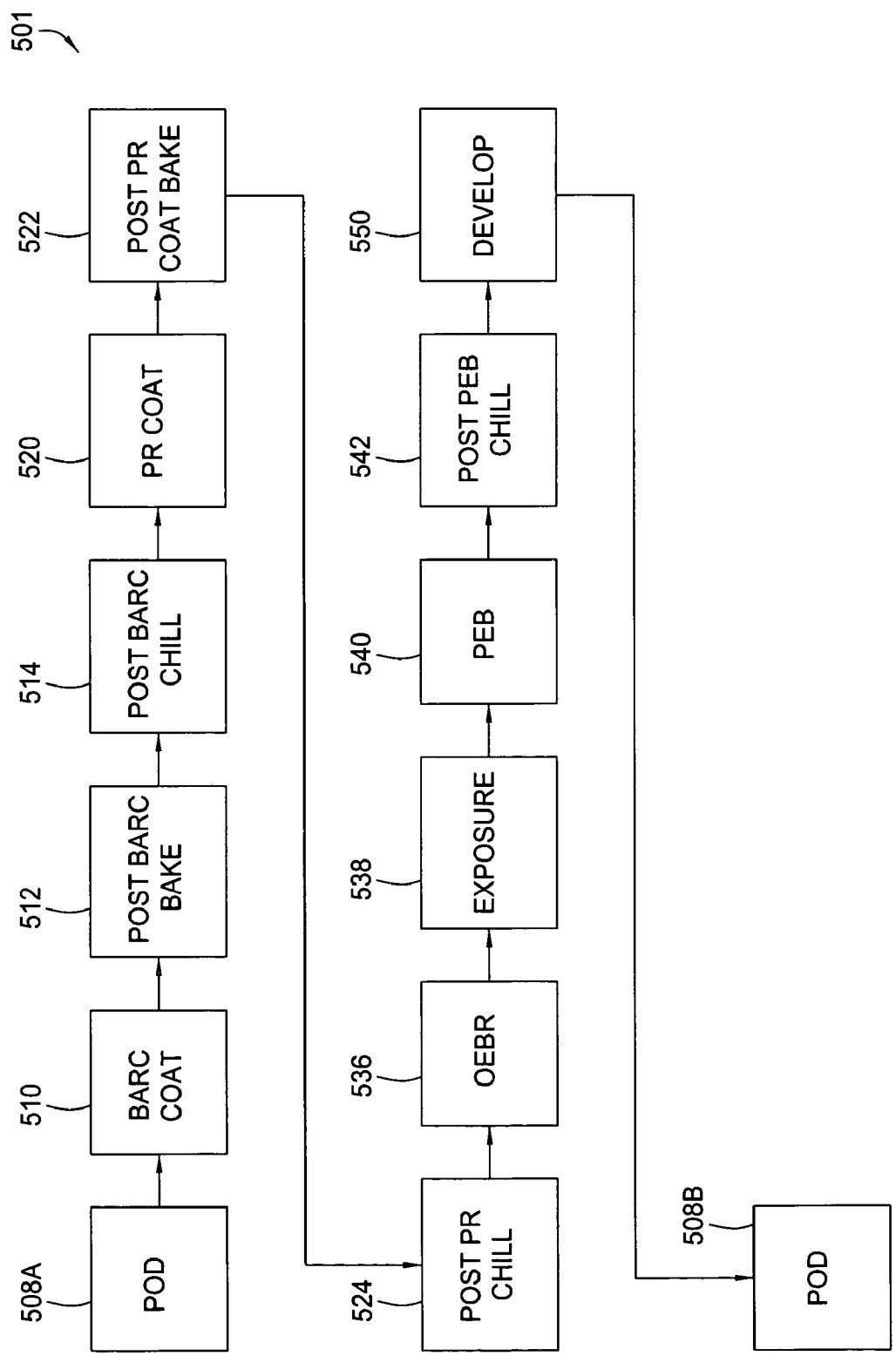
FIG. 3 illustrates one embodiment of a process sequence containing various process recipe steps that may be used in conjunction with the various embodiments of the cluster tool described herein.

FIG. 3 illustrates one embodiment of a series of method steps 501 that may be used to deposit, expose and develop a photoresist material layer formed on a substrate surface. The lithographic process may generally contain the following: a remove substrate from pod 508A step, a BARC coat step 510, a post BARC bake step 512, a post BARC chill step 514, a photoresist coat step 520, a post photoresist coat bake step 522, a post photoresist chill step 524, an optical edge bead removal (OEBR) step 536, an exposure step 538, a post exposure bake (PEB) step 540, a post PEB chill step 542, a develop step 550, and a place in pod step 508B. In other embodiments, the sequence of the method steps 501 may be rearranged, altered, one or more steps may be removed, or two or more steps may be combined into a single step without varying from the basic scope of the invention.

The remove substrate from pod 508A step is generally defined as the process of having the front end robot 108 remove a substrate from a cassette 106 resting in one of the pod assemblies 105. A cassette 106, containing one or more substrates "W", is placed on the pod assembly 105 by the user or some external device (not shown) so that the substrates can be processed in the cluster tool 10 by a user-defined substrate processing sequence controlled by software retained in the system controller 101.

The BARC coat step 510, or bottom anti-reflective coating process (hereafter BARC), is used to deposit an organic material over a surface of the substrate. The BARC layer is typically an organic coating that is applied onto the substrate prior to the photoresist layer to absorb light that otherwise would be reflected from the surface of the substrate back into the photoresist during the exposure step 538 performed in the stepper/scanner 5. If these reflections are not prevented, optical standing waves will be established in the photoresist layer, which cause feature size(s) to vary from one location to another depending on the local thickness of the photoresist layer. The BARC layer may also be used to level (or planarize) the substrate surface topography, since surface topography variations are invariably present after completing multiple electronic device fabrication steps. The BARC material fills around and over the features to create a flatter surface for photoresist application and reduces local variations in photoresist thickness. The BARC coat step 510 is typically performed using a conventional spin-on photoresist dispense process in which an amount of the BARC material is deposited on the surface of the substrate while the substrate is being rotated, which causes a solvent in the BARC material to evaporate and thus causes the material properties of the deposited BARC material to change. The air flow and exhaust flow rate in the BARC processing chamber is often controlled to control the solvent vaporization process and the properties of the layer formed on the substrate surface.

The post BARC bake step 512, is used to assure that all of the solvent is removed from the deposited BARC layer in the BARC coat step 510, and in some cases to promote adhesion of the BARC layer to the surface of the substrate. The temperature of the post BARC bake step 512 is dependent on the type of BARC material deposited on the surface of the substrate, but will generally be less than about 250° C. The time required to complete the post BARC bake step 512 will depend on the temperature of the substrate during the post BARC bake step, but will generally be less than about 60 seconds.

The post BARC chill step 514, is used to assure that the time the substrate is at a temperature above ambient temperature is controlled so that every substrate sees the same time-temperature profile; thus process variability is minimized. Variations in the BARC process time-temperature profile, which is a component of a substrate's wafer history, can have an effect on the properties of the deposited film layer and thus is often controlled to minimize process variability. The post BARC chill step 514, is typically used to cool the substrate after the post BARC bake step 512 to a temperature at or near ambient temperature. The time required to complete the post BARC chill step 514 will depend on the temperature of the substrate exiting the post BARC bake step, but will generally be less than about 30 seconds.

Figure 5A:
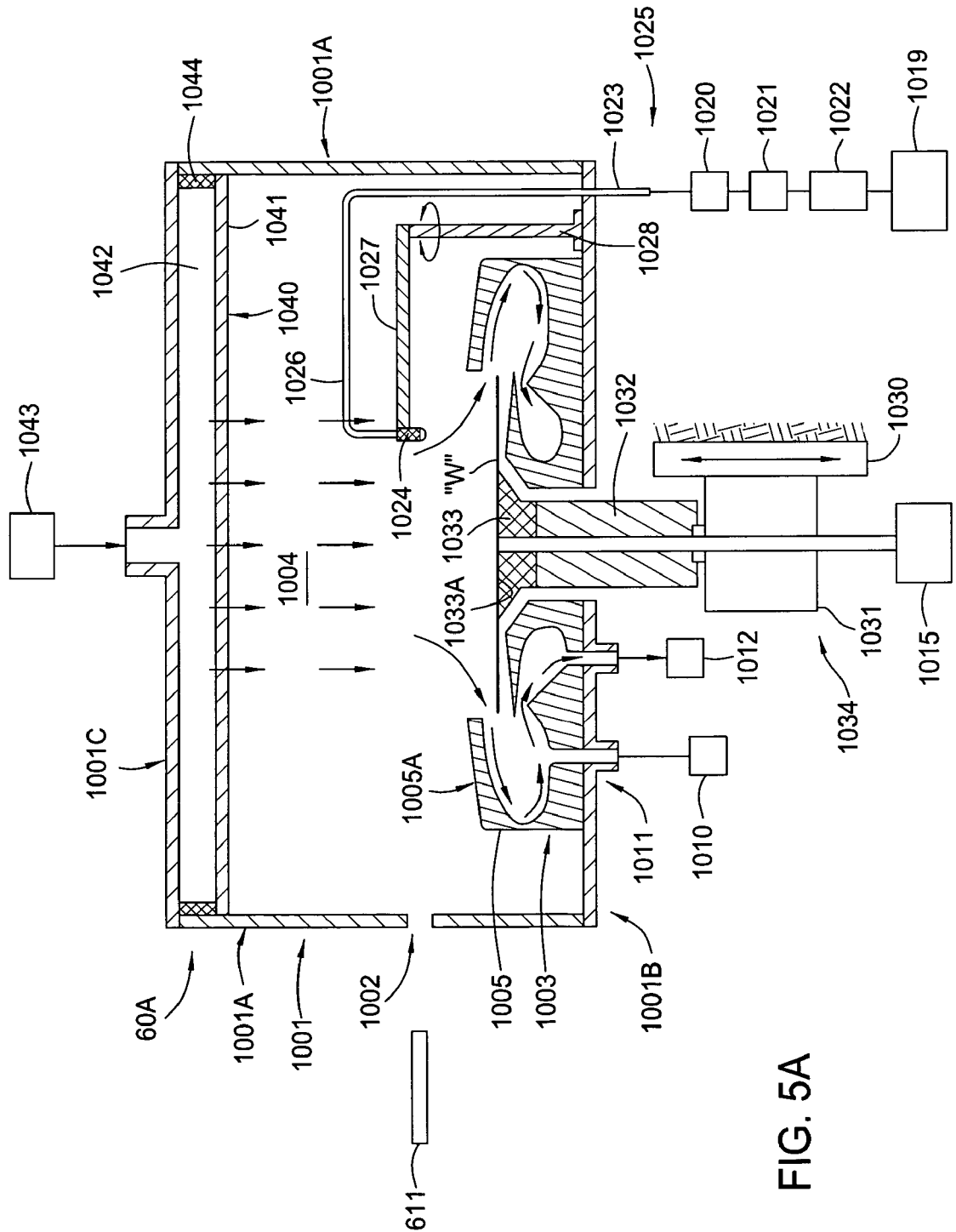
FIG. 5A is a side view that illustrates one embodiment of a coater chamber wherein the present invention may be used to advantage.

The photoresist coat step 520 is used to deposit a photoresist layer over a surface of the substrate. The photoresist layer deposited during the photoresist coat step 520 is typically a light sensitive organic coating that is applied onto the substrate and is later exposed in the stepper/scanner 5 to form the patterned features on the surface of the substrate. The photoresist coat step 520 is a typically performed using conventional spin-on photoresist dispense process in which an amount of the photoresist material is deposited on the surface of the substrate while the substrate is being rotated, thus causing a solvent in the photoresist material to evaporate and the material properties of the deposited photoresist layer to change. The air flow and exhaust flow rate in the photoresist processing chamber is controlled to control the solvent vaporization process and the properties of the layer formed on the substrate surface. In some cases it may be necessary to control the partial pressure of the solvent over the substrate surface to control the vaporization of the solvent from the photoresist during the photoresist coat step by controlling the exhaust flow rate and/or by injecting a solvent near the substrate surface. Referring to FIG. 5A, to complete the photoresist coat step 520 the substrate is first positioned on a spin chuck 1033 in a coater chamber 60A. A motor rotates the spin chuck 1033 and substrate while the photoresist is dispensed onto the center of the substrate. The rotation imparts an angular torque onto the photoresist, which forces the photoresist out in a radial direction, ultimately covering the substrate.

The post photoresist coat bake step 522 is used to assure that most, if not all, of the solvent is removed from the deposited photoresist layer in the photoresist coat step 520, and in some cases to promote adhesion of the photoresist layer to the BARC layer. The temperature of the post photoresist coat bake step 522 is dependent on the type of photoresist material deposited on the surface of the substrate, but will generally be less than about 250° C. The time required to complete the post photoresist coat bake step 522 will depend on the temperature of the substrate during the post photoresist bake step, but will generally be less than about 60 seconds.

The post photoresist chill step 524, is used to control the time the substrate is at a temperature above ambient temperature so that every substrate sees the same time-temperature profile and thus process variability is minimized. Variations in the time-temperature profile can have an affect on properties of the deposited film layer and thus is often controlled to minimize process variability. The temperature of the post photoresist chill step 524, is thus used to cool the substrate after the post photoresist coat bake step 522 to a temperature at or near ambient temperature. The time required to complete the post photoresist chill step 524 will depend on the temperature of the substrate exiting the post photoresist bake step, but will generally be less than about 30 seconds.

The optical edge bead removal (OEBR) step 536, is a process used to expose the deposited light sensitive photoresist layer(s), such as the layers formed during the photoresist coat step 520 and the BARC layer formed during the BARC coat step 510, to a radiation source (not shown) so that either or both layers can be removed from the edge of the substrate and the edge exclusion of the deposited layers can be more uniformly controlled. The wavelength and intensity of the radiation used to expose the surface of the substrate will depend on the type of BARC and photoresist layers deposited on the surface of the substrate. An OEBR tool can be purchased, for example, from USHIO America, Inc. Cypress, Calif.

The exposure step 538 is a lithographic projection step applied by a lithographic projection apparatus (e.g., stepper scanner 5) to form a pattern which is used to manufacture integrated circuits (ICs). The exposure step 538 forms a circuit pattern corresponding to an individual layer of the integrated circuit (IC) device on the substrate surface, by exposing the photosensitive materials, such as, the photoresist layer formed during the photoresist coat step 520 and the BARC layer formed during the BARC coat step 510 (photoresist) of some form of electromagnetic radiation. The stepper/scanner 5, which may be purchased from Cannon, Nikon, or ASML.

The post exposure bake (PEB) step 540 is used to heat a substrate immediately after the exposure step 538 in order to stimulate diffusion of the photoactive compound(s) and reduce the effects of standing waves in the photoresist layer. For a chemically amplified photoresist, the PEB step also causes a catalyzed chemical reaction that changes the solubility of the photoresist. The control of the temperature during the PEB is critical to critical dimension (CD) control. The temperature of the PEB step 540 is dependent on the type of photoresist material deposited on the surface of the substrate, but will generally be less than about 250° C. The time required to complete the PEB step 540 will depend on the temperature of the substrate during the PEB step, but will generally be less than about 60 seconds.

The post exposure bake (PEB) chill step 542 is used to assure that the time the substrate is at a temperature above ambient temperature is controlled, so that every substrate sees the same time-temperature profile and thus process variability is minimized. Variation in the PEB process time-temperature profile can have an effect on properties of the deposited film layer and thus is often controlled to minimize process variability. The temperature of the post PEB chill step 542 is thus used to cool the substrate after the PEB step 540 to a temperature at or near ambient temperature. The time required to complete the post PEB chill step 542 will depend on the temperature of the substrate exiting the PEB step, but will generally be less than about 30 seconds.

The develop step 550 is a process in which a solvent is used to cause a chemical or physical change to the exposed or unexposed photoresist and BARC layers to expose the pattern formed during the exposure step 538. The develop process may be a spray or immersion or puddle type process that is used to dispense the developer solvent. In one embodiment of the develop step 550, after the solvent has been dispensed on the surface of the substrate a rinse step may be performed to rinse the solvent material from the surface of the substrate. The rinse solution dispensed on the surface of the substrate may contain deionized water and/or a surfactant.

The insert the substrate in pod step 508B is generally defined as the process of having the front end robot 108 return the substrate to a cassette 106 resting in one of the pod assemblies 105.

Processing Racks

FIG. 4A-D illustrate side views of one embodiment of a first processing rack 308, a second processing rack 309, a first central processing rack 312, a second central processing rack 314, a first rear processing rack 318 and a second rear processing rack 319, that contain multiple substrate processing chambers to perform various aspects of the substrate processing sequence. In general, the processing racks illustrated in FIGS. 4A-D may contain one or more process chambers, such as, one or more coater chambers 60A, one or more developer chambers 60B, one or more chill chambers 80, one or more bake chambers 90, one or more PEB chambers 130, one or more support chambers 65, one or more OEBR chambers 62, one or more twin coater/developer chambers 350, one or more bake/chill chambers 800, and/or one or more HMDS chambers 70, which are further described below. The orientation, type, positioning and number of process chambers shown in the FIGS. 4A-D are not intended to be limiting as to the scope of the invention, but are intended to illustrate the various embodiments of the invention. In one embodiment, as shown in FIGS. 4A-D, the process chambers are stacked vertically, or one chamber is positioned substantially above another chamber, to reduce the footprint of the cluster tool 10. Minimizing the cluster tool footprint is often an important factor in developing a cluster tool, since the clean room space, where the cluster tool may be installed, is often limited and very expensive to build and maintain.

Figure 4B:
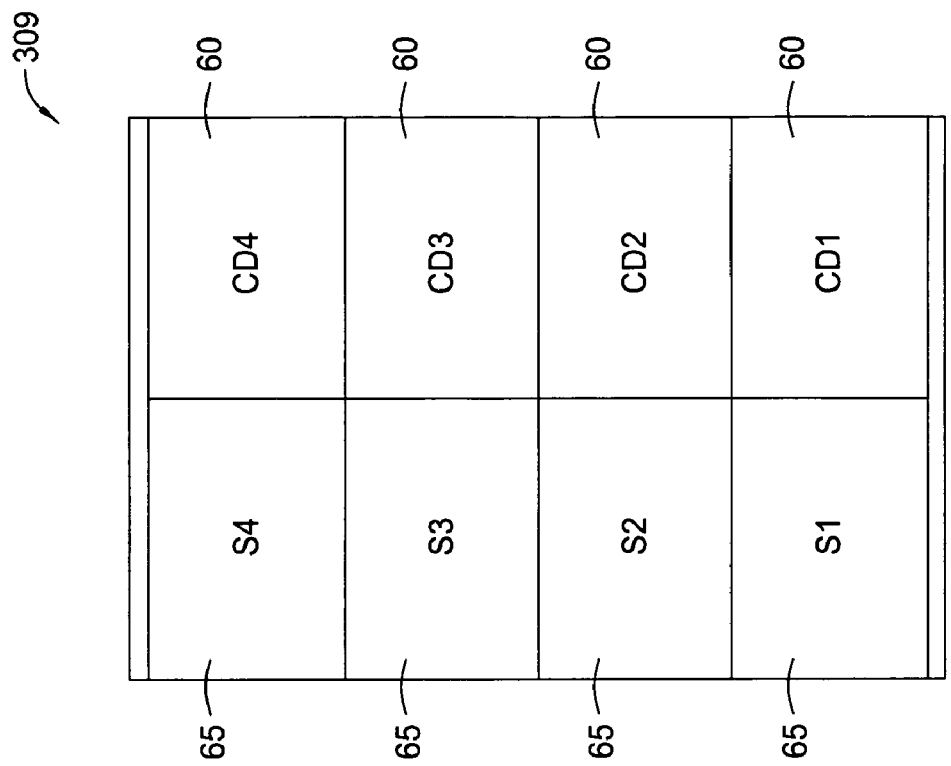
FIG. 4B is a side view that illustrates one embodiment of the second processing rack 309 according to the present invention.
Figure 4A:
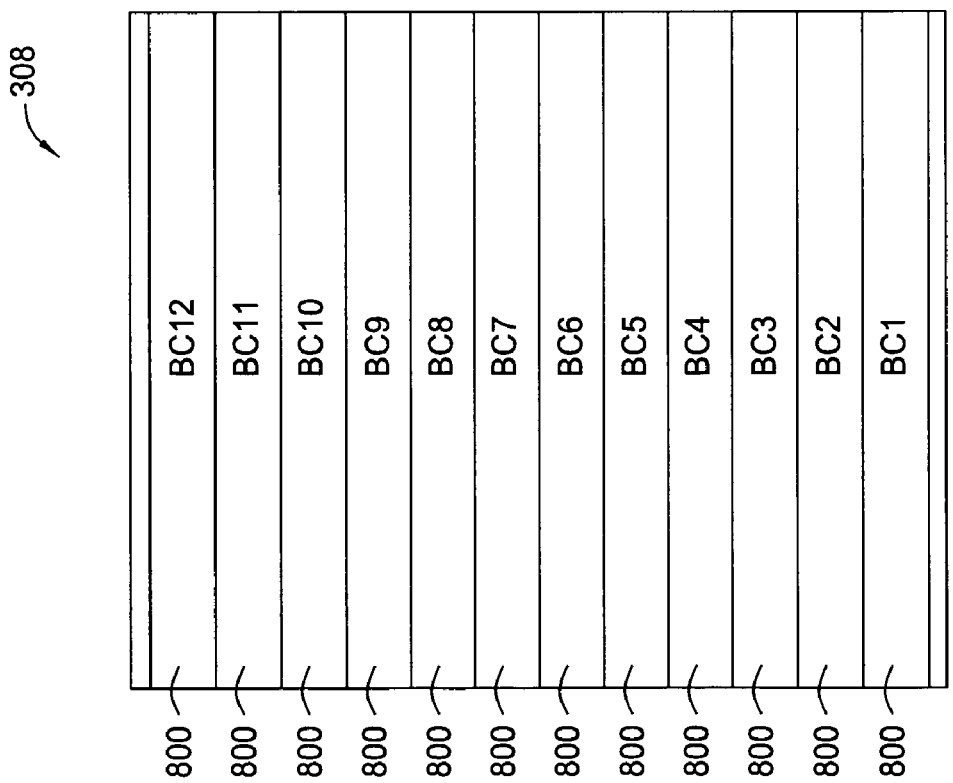
FIG. 4A is a side view that illustrates one embodiment of the first processing rack 308 according to the present invention.

FIG. 4A illustrates a side view of the first processing rack 308 as viewed from outside the cluster tool 10 while facing the front end robot 108 and thus will coincide with the views shown in FIGS. 2A-D. In one embodiment, as shown in FIG. 4A, the first processing rack 308 contains twelve bake/chill chambers 800 (labeled BC1-12). A detailed description of a bake/chill chamber may be found in FIG. 18 of co-pending U.S. patent application Ser. No. 11/112,281, filed Apr. 22, 2005, which is herein incorporated as reference.

FIG. 4B illustrates a side view of the second processing rack 309 as viewed from outside the cluster tool 10 while facing the front end robot 108 and thus will coincide with the view shown in FIGS. 2A-D. In one embodiment, as shown in FIG. 4B, the second processing rack 309 contains four coater/developer chambers 60 (labeled CD1-4) and four support chambers 65 (labeled S1-4). In one embodiment, the four support chambers 65 are replaced with four coater/developer chambers 60.

Figures 4C, 4D:
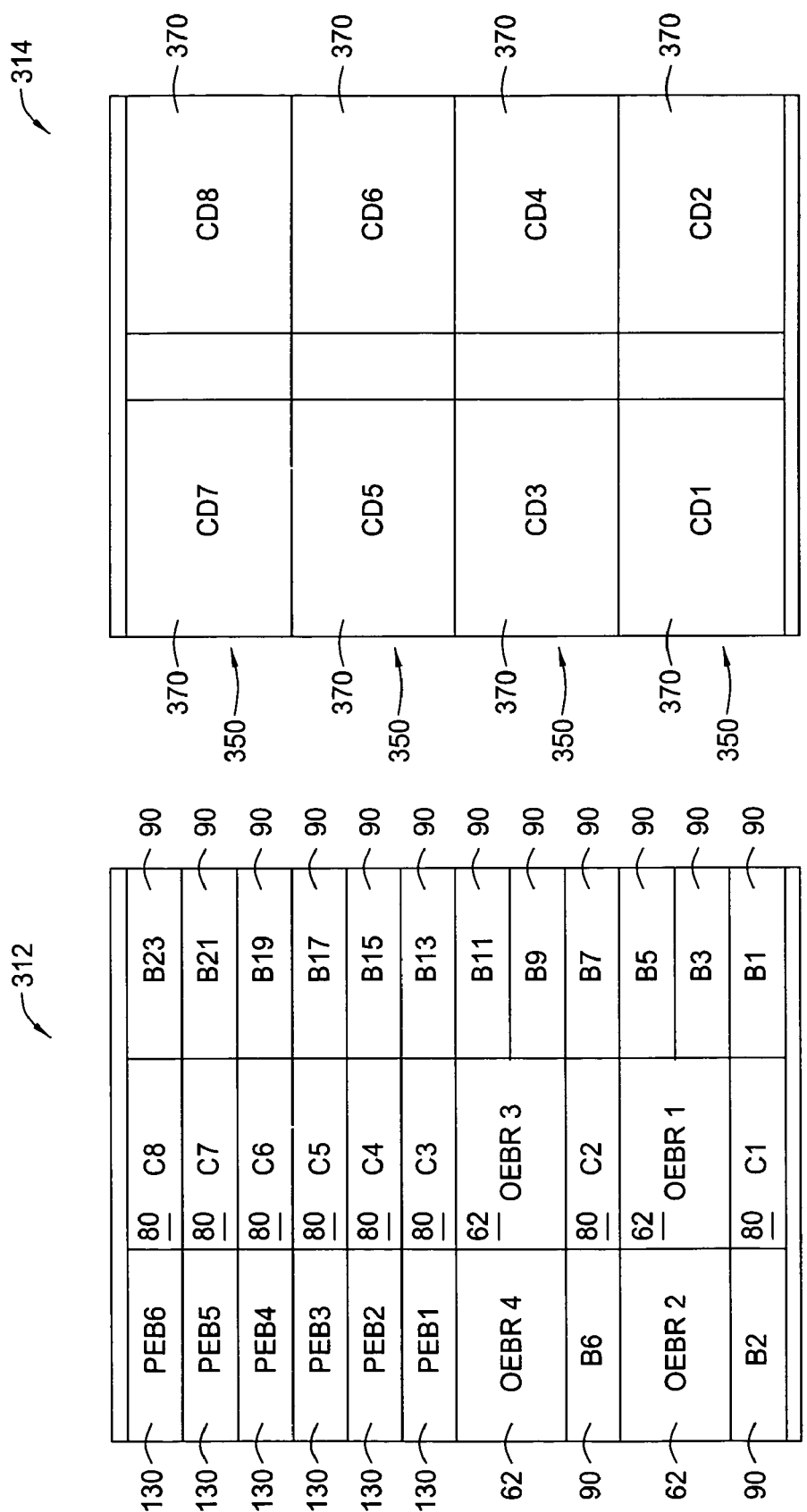
FIG. 4C is a side view that illustrates one embodiment of the first central processing rack 312 and the first rear processing rack 318, according to the present invention.
FIG. 4D is a side view that illustrates one embodiment of the second central processing rack 314 and the second rear processing rack 319, according to the present invention.

FIG. 4C illustrates a side view of the first central processing rack 312, or the first rear processing rack 318, as viewed from outside the cluster tool 10 while facing the central robot 107, or rear robot 109, and thus will coincide with the views shown in FIGS. 2A-D. In one embodiment, as shown in FIG. 4C, the first central processing rack 312, or the first rear processing rack 318, contains eight chill chambers 80 (labeled C1-8), fourteen bake chambers 90 (labeled B1, B2, B3, B5, B6, B7, etc.), four OEBR chambers 62 (labeled OEBR1-4), and six PEB chambers 130 (labeled PEB1-6). In another embodiment, the first central processing rack 312, or the first rear processing rack 318, may be arranged like the configuration illustrated in FIG. 4A, which contains twelve chill chambers 80 and twenty four bake chambers 90.

FIG. 4D illustrates a side view of the second central processing rack 314, or the second rear processing rack 319, as viewed from outside the cluster tool 10 while facing the central robot 107 (or rear robot 109) and thus will coincide with the views shown in FIGS. 2A-D. In one embodiment, as shown in FIG. 4D, the second central processing rack 314, or the second rear processing rack 319, contains four twin coater/developer chambers 350, which contain four pairs of process chambers 370 that may be configured as coater chambers 60A, as developer chambers 60B or combinations thereof.

Figure 4E:
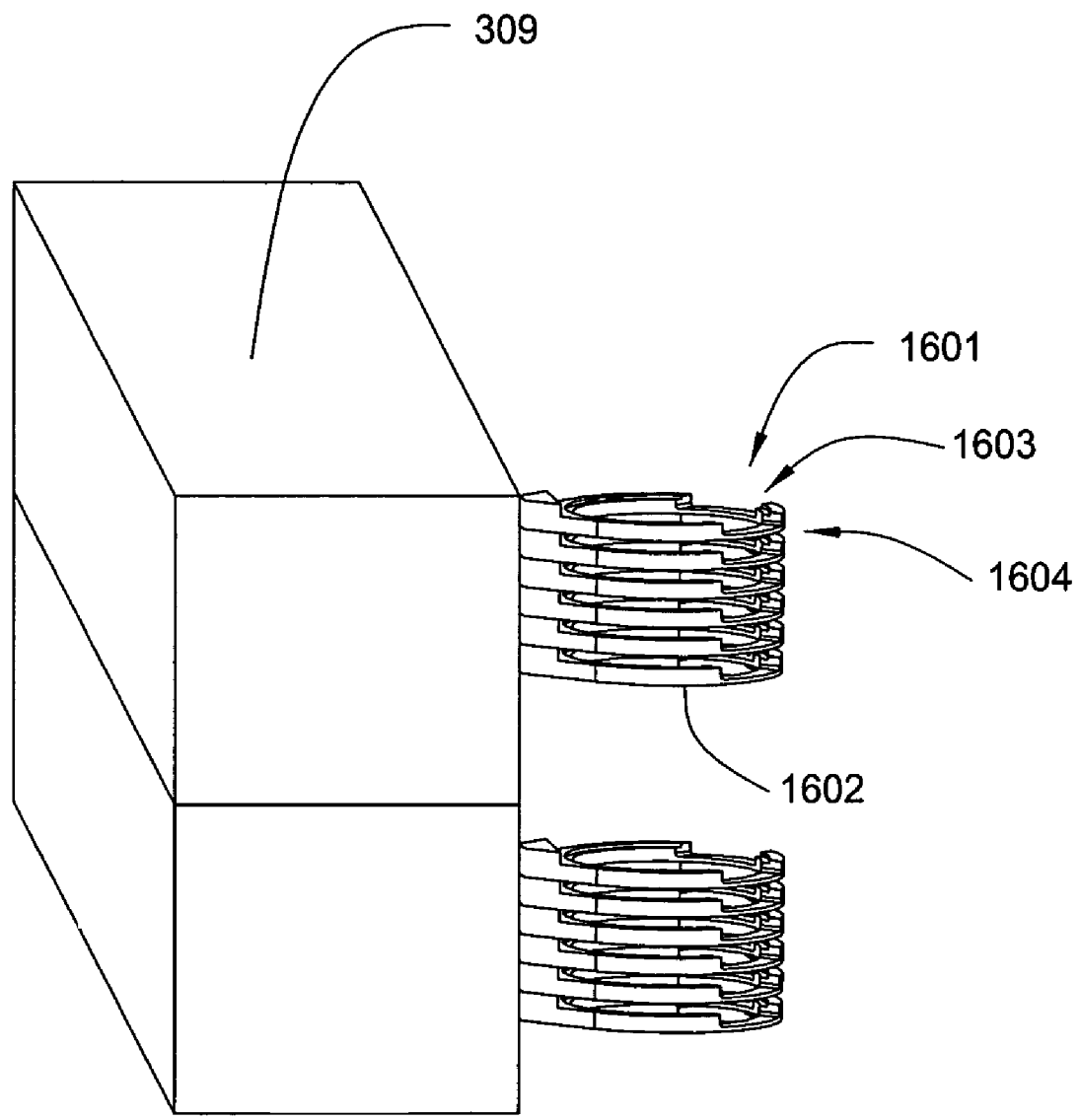
FIG. 4E is an isometric view of the buffering stations 1601 in accord with the present invention.

FIG. 4E illustrates an isometric view of the buffering stations 1601 in accordance with the present invention. In one embodiment, the buffering stations 1601 are attached to a processing rack, for example, the second processing rack 309 of the front module 306. Each of the buffering station 1601 may comprise a plurality of substrate support 1602 vertically stacked together. Each substrate support 1602 may be accessible from a first direction 1603 and a second direction 1604 so that two robots may approach the buffering stations 1601 at the same time without collision, hence, eliminating the time consumed for collision avoidance and improving system throughput and reliability. In one embodiment, two buffering stations 1601 may be disposed vertically with a vertical distance matching the distance between the duel blades of a dual blade assembly so that two substrates may be transferred to and from the buffering stations 1601 simultaneously (as described in FIG. 8H).

Coater/Developer Chamber

The coater/developer chamber 60 is a processing chamber that may be adapted to perform, for example, the BARC coat step 510, the photoresist coat step 520, and the develop step 550, which are shown in FIG. 3. The coater/developer chamber 60 may generally be configured into two major types of chambers, a coater chamber 60A, shown in FIG. 5A, and a developer chamber 60B, shown in FIG. 5B (discussed below).

FIG. 5A, is a vertical sectional view of one embodiment of the coater chamber 60A, that may be adapted to perform the BARC coat step 510, the photoresist coat step and the anti-reflective top coat step 530. The coater chamber 60A may contain an enclosure 1001, a gas flow distribution system 1040, a coater cup assembly 1003, and a fluid dispense system 1025. The enclosure 1001 generally contains side walls 1001A, a base wall 1001B, and a top wall 1001C. The coater cup assembly 1003, which contains the processing region 1004 in which the substrate "W" is processed, also contains a cup 1005, a rotatable spin chuck 1034 and a lift assembly 1030. The gas flow distribution system 1040 is generally adapted to deliver a uniform flow of a gas through the enclosure 1001 and coater cup assembly 1003 to the exhaust system 1012. The rotatable spin chuck 1034 generally contains a spin chuck 1033, a shaft 1032 and a rotation motor 1031, and a vacuum source 1015. The spin chuck 1033, which is attached to the rotation motor 1031 through the shaft 1032, contains a sealing surface 1033A that is adapted to hold the substrate while the substrate is being rotated. The substrate may be held to the sealing surface 1033A by use of a vacuum generated by the vacuum source 1015. The cup 1005 manufactured from a material, such as, a plastic material, or other materials that is compatible with the processing fluids delivered from the fluid dispense system 1025. The fluid dispense system 1025 generally contains one or more fluid source assemblies 1023 which deliver one or more solution to the surface of a substrate mounted on the spin chuck 1033. In one embodiment, the rotation motor 1031 is adapted to rotate a 300 mm semiconductor substrate between about 1 revolution per minute (RPM) and about 4000 RPM. An example of an exemplary coater processing chamber is further described in the copending U.S. patent application Ser. No. 11/112,281, filed Apr. 22, 2005, which is herein incorporated by reference.

Developer Chamber

Figure 5B:
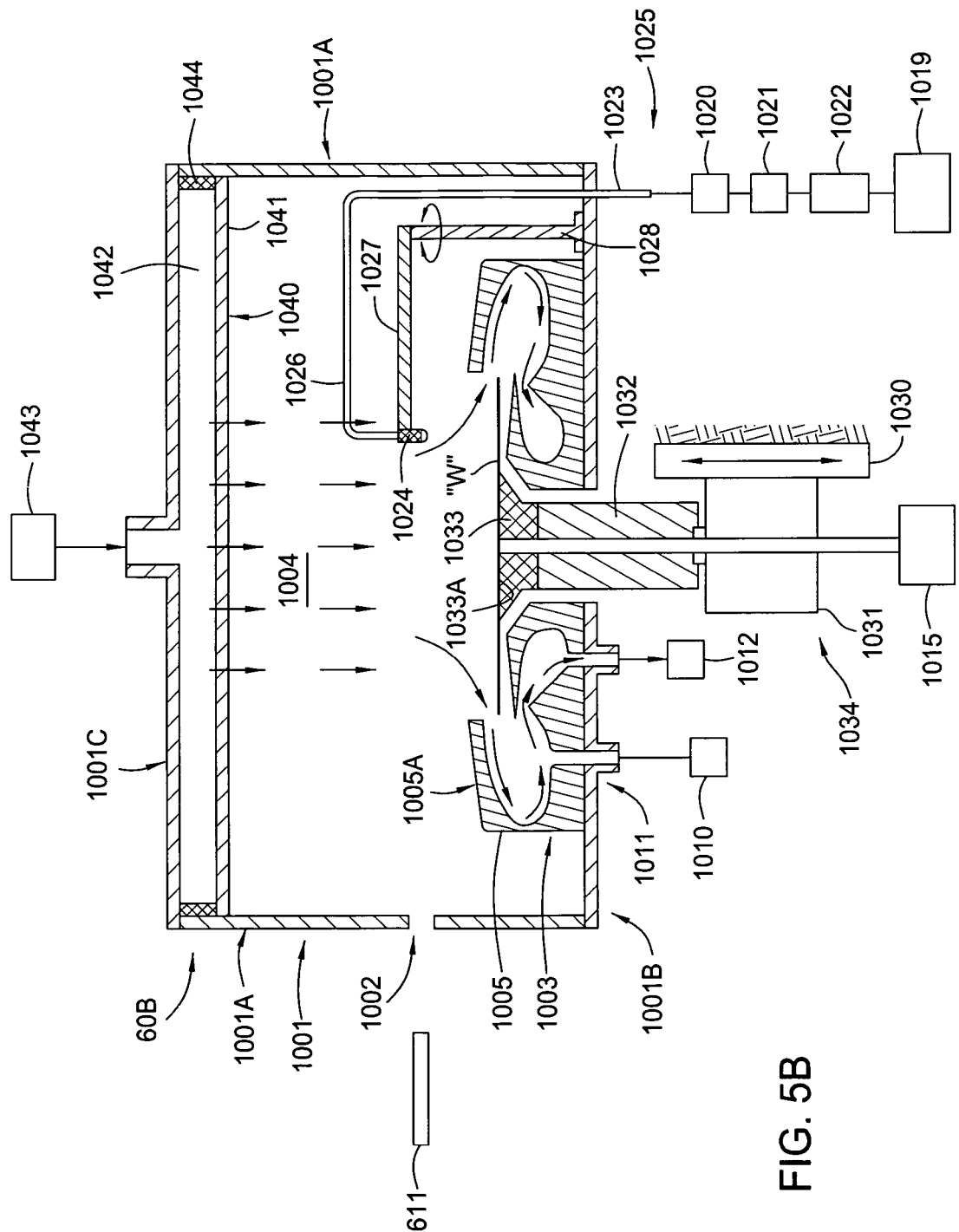
FIG. 5B is a side view that illustrates one embodiment of a developer chamber wherein the present invention may be used to advantage.

Referring to FIG. 5B, which is a side view of one embodiment of the developer chamber 60B, that may be adapted to perform, for example, the develop step 550. In one embodiment, the developer chamber 60B generally contains all of the components contained in the coater chamber 60A and thus some components of the developer chamber 60B that are the same or similar to those described with reference to the developer chamber 60B, have the same numbers. Accordingly, like numbers have been used where appropriate. In one embodiment, the developer chamber 60B contains a fluid distribution device 1070, described above, is adapted to deliver a uniform flow of a developer processing fluid to the surface of the substrate during the developing process. An example of an exemplary developer chamber is further described in the copending U.S. patent application Ser. No. 11/112,281, filed Apr. 22, 2005, which is herein incorporated by reference.

Twin Coater and Developer Chambers

Figure 6:
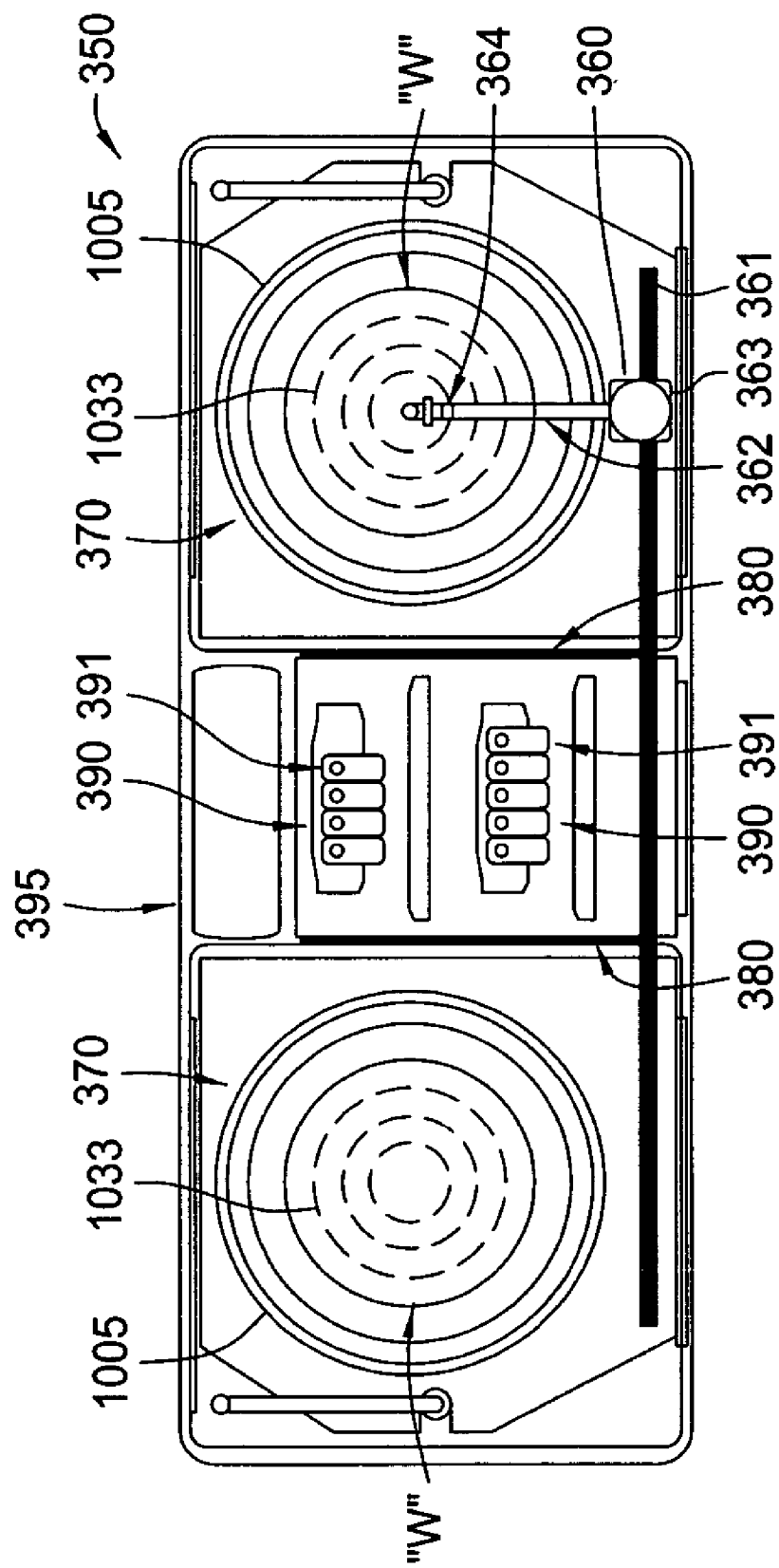
FIG. 6 is a plan view of a twin coater/developer chamber 350 according to the present invention.

FIG. 6 is a plan view of one embodiment of a twin coater/developer chamber 350 that contains two separate process chambers 370 and a central region 395. This configuration is advantageous since it allows some common components in the two chambers to be shared, thus increasing system reliability and reducing the system cost, complexity and footprint of the cluster tool. In one embodiment, the process chamber 370 generally contains all of the processing components described above in conjunction with the coater chamber 60A or developer chamber 60B, except the two chambers are adapted to share a fluid dispense system 1025. The central region 395 contains a shutter 380 and a plurality of nozzles 391 that are contained in a nozzle holder assembly 390. As noted above the fluid dispense system 1025 used in the coater or developer chambers may contain one or more fluid source assemblies 1023 which deliver one or more processing fluid to the surface of a substrate mounted on the spin chuck 1033. Each nozzle 391, contained in the fluid source assemblies 1023, is typically connected to a supply tube 1026, a pump 1022, a filter 1021, a suck back valve 1020 and a fluid source 1019, and is adapted to dispense a single type of processing fluid. Therefore, each fluid source assembly 1023 can be used in either the left or right process chambers 370, thus reducing the redundancy required to in each processing chamber.

As shown in FIG. 6 the nozzle arm assembly 360 is positioned over the right process chamber 370 to dispense a processing fluid on a substrate "W" retained on the spin chuck 1033. The nozzle arm assembly 360 may contain an arm 362 and nozzle holding mechanism 364. The nozzle arm assembly 360 is attached to an actuator 363 that is adapted to transfer and position the nozzle arm assembly 360 in any position along the guide mechanism 361. In one embodiment, the actuator is adapted to move the nozzle arm assembly 360 vertically to correctly position the nozzle 391 over the substrate during processing and also enable the nozzle holding mechanism 364 to pick-up and drop-off the nozzles 391 from the nozzle holder assembly 390. The system controller 101 is adapted to control the position of the nozzle arm assembly 360 so that the nozzle holding mechanism 364 can pick-up and drop-off nozzles 391 from the nozzle holder assembly 390. A shutter 380 is adapted to move vertically to close and isolate one process chamber 370 from the central region 395 and thus the other process chamber 370 during processing to prevent cross contamination of the substrates during processing. In one aspect, the shutter 380 is adapted to sealably isolate one process chamber 370 from the central region 395 and thus the other process chamber 370 during processing. Conventional o-ring and/or other lip seals may be used to allow the shutter to sealably isolate the two processing chambers. An example of an exemplary twin coater/developer chamber is further described in the co-pending U.S. patent application Ser. No. 11/112,281, filed Apr. 22, 2005, which is herein incorporated by reference.

Chill Chamber

Figure 7A:
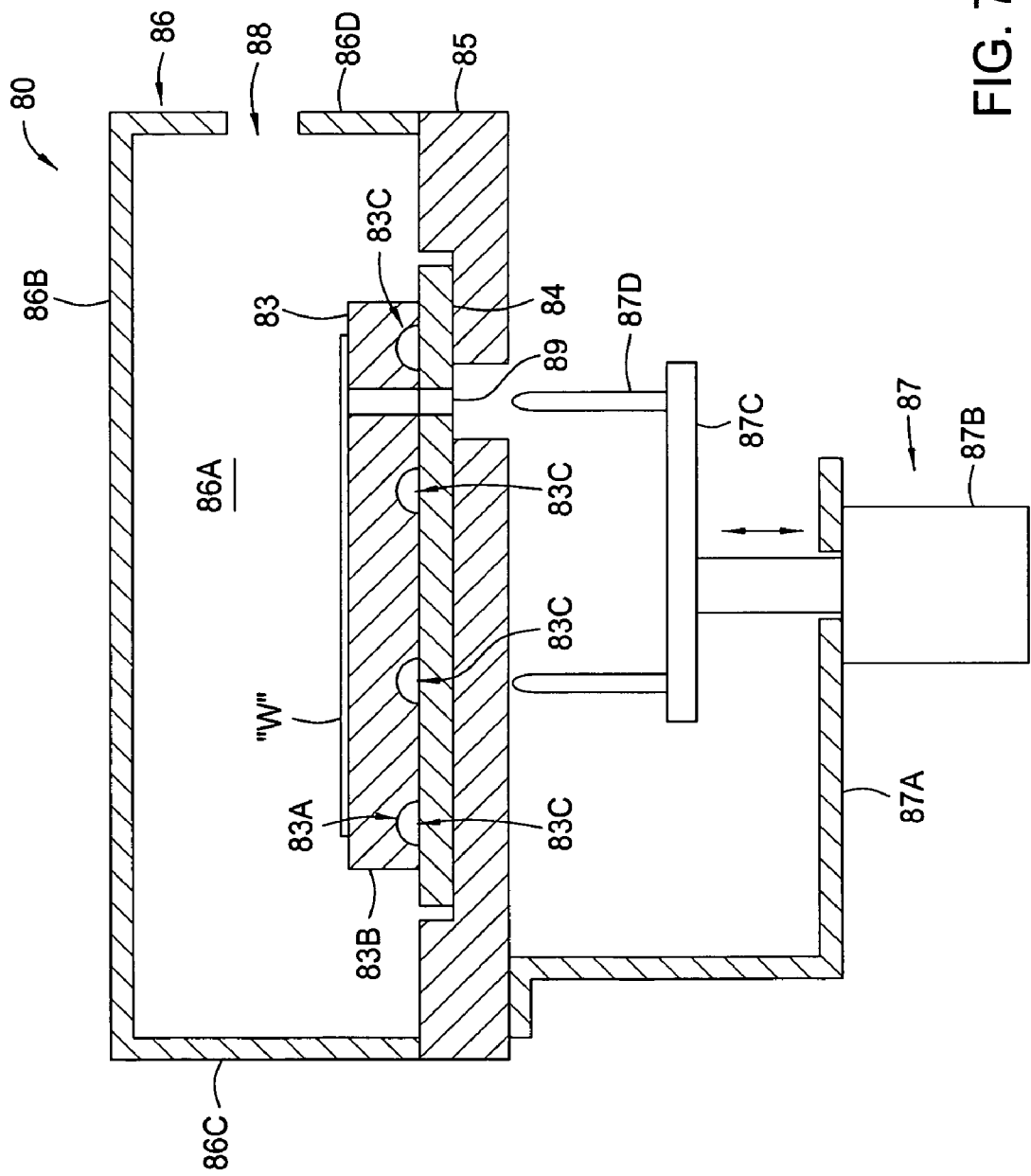
FIG. 7A is a side view that illustrates one embodiment of a chill chamber wherein the present invention may be used to advantage.

FIG. 7A is a vertical sectional view that illustrates one embodiment of a chill chamber 80 that may be adapted to perform the post BARC chill step 514, the post photoresist chill step 524, the post top coat chill step 534, the post PEB chill step 542 and/or the post develop chill step 554. The chill chamber 80 generally contains an enclosure 86, chill plate assembly 83, a support plate 84, and a lift assembly 87. The enclosure 86 is formed by a plurality of walls (items 86B-D and item 85) which isolate the processes performed in the chill chamber 80 from the surrounding environment to form a processing region 86A. In one aspect of the invention the enclosure is adapted to thermally isolate and minimize the possibility of atmospheric contamination in the chill chamber 80. An example of an exemplary chill chamber is further described in the co-pending U.S. patent application Ser. No. 11/112,281, filed Apr. 22, 2005, which is herein incorporated by reference.

Bake Chamber

FIG. 7B is a side view that illustrates one embodiment of a bake chamber 90 that may be adapted to perform the post BARC bake step 512, the post photoresist coat bake step 522, the post top coat bake step 532 and/or the post develop bake step 552. The bake chamber 90 generally contains an enclosure 96, bake plate assembly 93, a support plate 94, and a lift assembly 97. The enclosure 96 generally contains a plurality of walls (items 96B-D and element 95) which tend to isolate the processes performed in the bake chamber 90 from the surrounding environment to form a processing region 96A. In one aspect of the invention the enclosure is adapted to thermally isolate and minimize contamination of the bake chamber 90 from the surrounding environment. An example of an exemplary bake chamber is further described in the co-pending U.S. patent application Ser. No. 11/112,281, filed Apr. 22, 2005, which is herein incorporated by reference.

HMDS Chamber

Figure 7C:
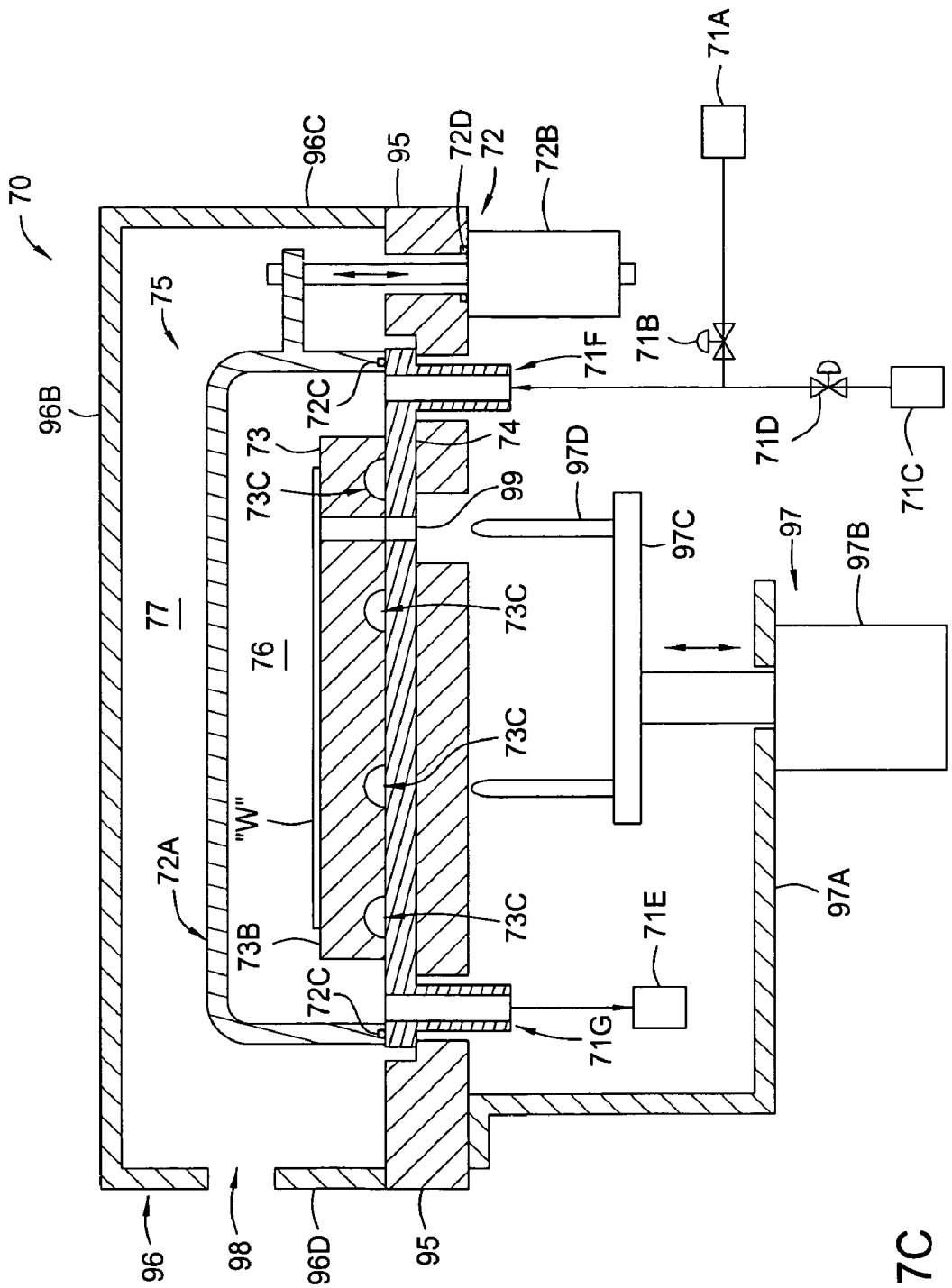
FIG. 7C is a side view that illustrates one embodiment of a HMDS process chamber wherein the present invention may be used to advantage.

FIG. 7C is a side view that illustrates one embodiment of a HMDS process chamber 70 that may be adapted to perform the HMDS processing step 511. In one embodiment, as shown in FIG. 7C, the HMDS process chamber 70 contains some of the components contained in the bake chamber 90 shown in FIG. 7B and thus some components of the HMDS process chamber 70 are the same or similar to those described with reference to the bake chamber 90, described above. An example of an exemplary HMDS chamber is further described in the co-pending U.S. patent application Ser. No. 11/112,281, filed Apr. 22, 2005, which is herein incorporated by reference.

Post Exposure Bake Chamber

During an exposure process using a positive photoresist an insoluble photoresist material is transformed into a soluble material. During the exposure process, components in the photoresist that contain photoacid generators (or PAGS) generate an organic acid that can attack the unexposed areas of the photoresist and affect the sharpness of the pattern formed in the photoresist layer during the exposure process. The attack of the unexposed photoresist is thus affected by the migration of the generated photoacid, which is a diffusion dominated process. Since the photoacid attack of the formed pattern is a diffusion dominated process, the rate of attack is dependent on two related variables, time and temperature. The control of these variables are thus important in assuring that the critical dimension (CD) uniformity is acceptable and consistent from substrate to substrate.

In one embodiment, the PEB step 540 is performed in a bake chamber 90 as shown in FIG. 7B. In another embodiment, the PEB step 540 is performed in a HMDS process chamber 70 where a temperature controlled gas is delivered from the purge gas source 71C to the processing region 76, to heat or cool the substrate retained on the HMDS bake plate assembly 73. An example of an exemplary PEB chamber is further described in the co-pending U.S. patent application Ser. No. 11/112,281, filed Apr. 22, 2005, which is herein incorporated by reference.

Cluster Robots Design

A. Articulated Robot

Figure 8A:
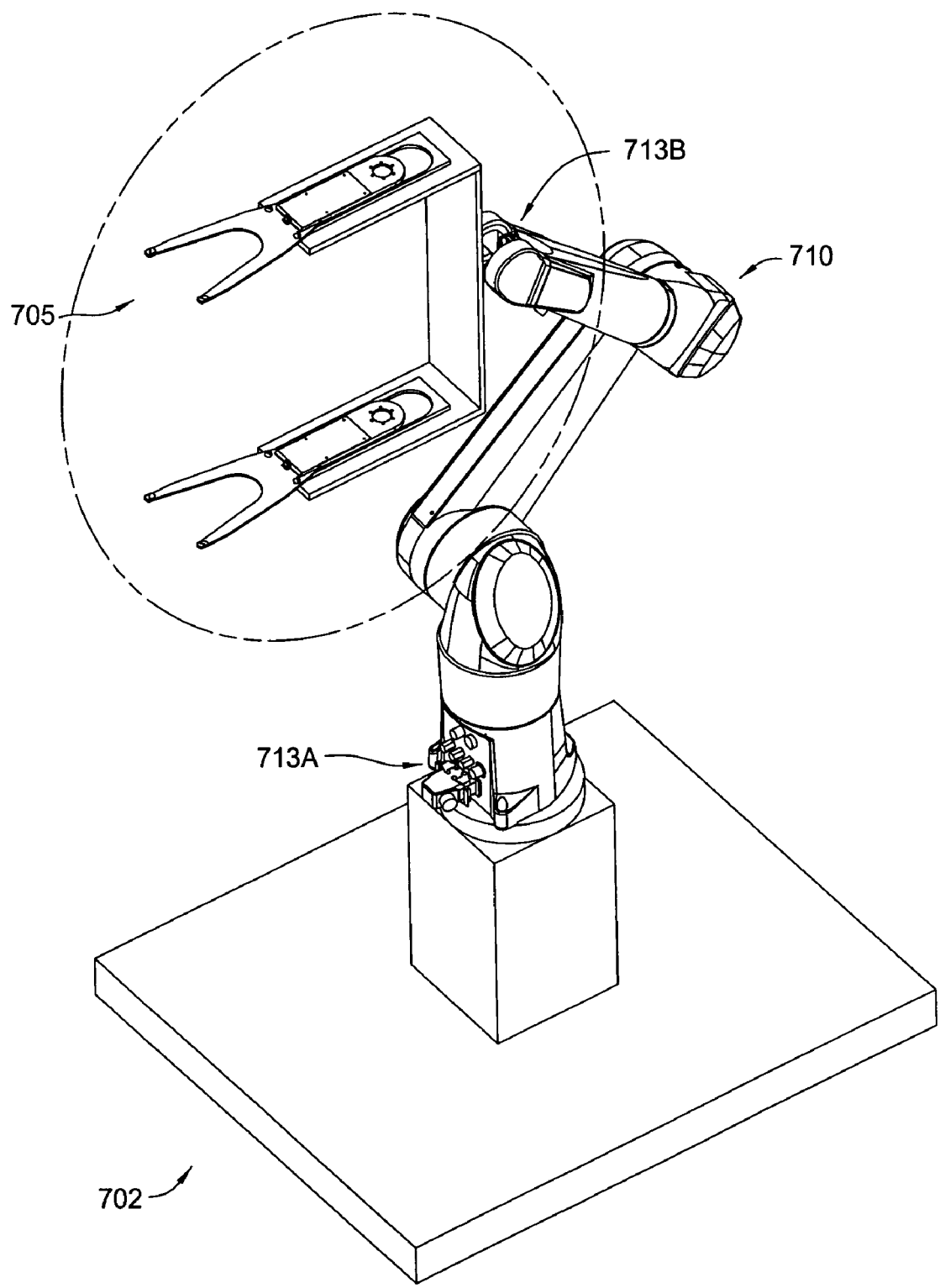
FIG. 8A is an isometric view illustrating one embodiment of a dual blade 6-axis articulated robot assembly according to the present invention.

FIG. 8A is an isometric view of one embodiment of the central robot 107 containing an articulated robot assembly 702 (hereafter AR assembly 702). The AR assembly 702 is adapted to transfer substrates to and from the various process chambers contained in the front end processing rack 52, the first central processing rack 152, the second central processing rack 154 and/or the rear processing rack 202. The second central processing rack 154 has been removed from FIG. 8A to highlight and clarify the components contained in this embodiment. The AR assembly 702 generally contains articulated robot 710 and a dual blade assembly 705. The articulated robot 710 is generally a 6-axis articulated robot which can be purchased from Mitsubishi Electric Corporation, of Tokyo, Japan, Kawasaki Robotics (USA), Inc. of Wixom, Mich., and Staubli Corp. of Duncan, S.C. In one embodiment, the 6-axis articulated robot is a model number TX90 purchased from Staubli Corp. of Duncan, S.C. The articulated robot 710 has a robot base 713A and a mechanical interface 713B, which connect the robot to the cluster tool and the end-effector assembly (e.g., dual blade assembly 705, blade assembly 706, etc.) to the robot, respectively. In general, the 6-axis articulated robot is advantageous since the reach of the articulated robot is far superior from conventional robots due to its multiple axis and multiple linkage design, the reach of multiple articulated robots can more easily "overlap" since the motion of the end-effector, which retains and transfers the substrate(s), is not linked to motion of the robot base 713A which allows the robots to more effectively avoid each other while transferring substrates, and/or the reliability of the articulated robots exceeds most conventional robots.

The dual blade assembly 705 generally contains a support 720, and two or more blade assemblies 715 (e.g., first blade assembly 715A, a second blade assembly 715B, etc.). The support 720 attaches to and is guided by the articulated robot 710 so that a blade in a first blade assembly 715A and a blade in a second blade assembly 715B can each pick-up and/or place a substrate in a two different processing chambers retained in a processing rack. The pitch (see item "A"), or the distance, between the robot blades is fixed by the distance between the first supporting surface 720A and second supporting surface 720B, and is designed to coincide with the pitch between two of the processing chambers retained in the processing racks. Therefore, the distance between the transfer position of the bake chambers labeled B1 and B4, for example, in the first central processing rack 152, would coincide with the pitch between the coater/developer chambers labeled CD1 and CD2 in the front end processing rack 52, so that after completing the BARC coat step 510 the substrates could then be transferred to bake chambers labeled B1 and B4 to complete the post BARC bake step 512. Referring to FIG. 8B, the pitch "A" is generally defined as the distance, or spacing, between the blades 711A-B in a normal direction to the substrate receiving surfaces 712A-B. In one embodiment, the pitch (see item "A"), is a distance between about 100 mm and about 1200 mm, and preferably between about 300 mm and about 700 mm. While the dual blade assembly 705 is illustrated in conjunction with the articulated robot assembly 702, other configurations may utilize the dual blade assembly 705 on other types of robots without varying from the basic scope of the invention.

In one aspect, the substrate receiving surfaces 712A-B are adapted to retain a substrate positioned on the blade (not shown) by use of an edge gripping mechanism that holds the substrate in position on the robot blade. The edge gripping mechanism can be adapted to grab the edge of the substrate at multiple points (e.g., 3 points) to hold and retain the substrate.

Referring to FIG. 8B, in one embodiment, each blade assembly 715 (e.g., first blade assembly 715A or second blade assembly 715B), generally contains one or more robot blade actuators 721 (see items 721A-721B) and one or more robot blades 711 (see items 711A-711B). The robot blade actuators 721 may be a direct drive linear brushless servomotor or other equivalent device that is able to control the motion and position of the robot blade 711. Generally, the pitch between the robot blades will not affected by the actuation, or translation, of one robot blade relative to another robot blade, since it is preferred that the actuated blade translate in a plane that is parallel to the other robot blade.

Figure 8C:
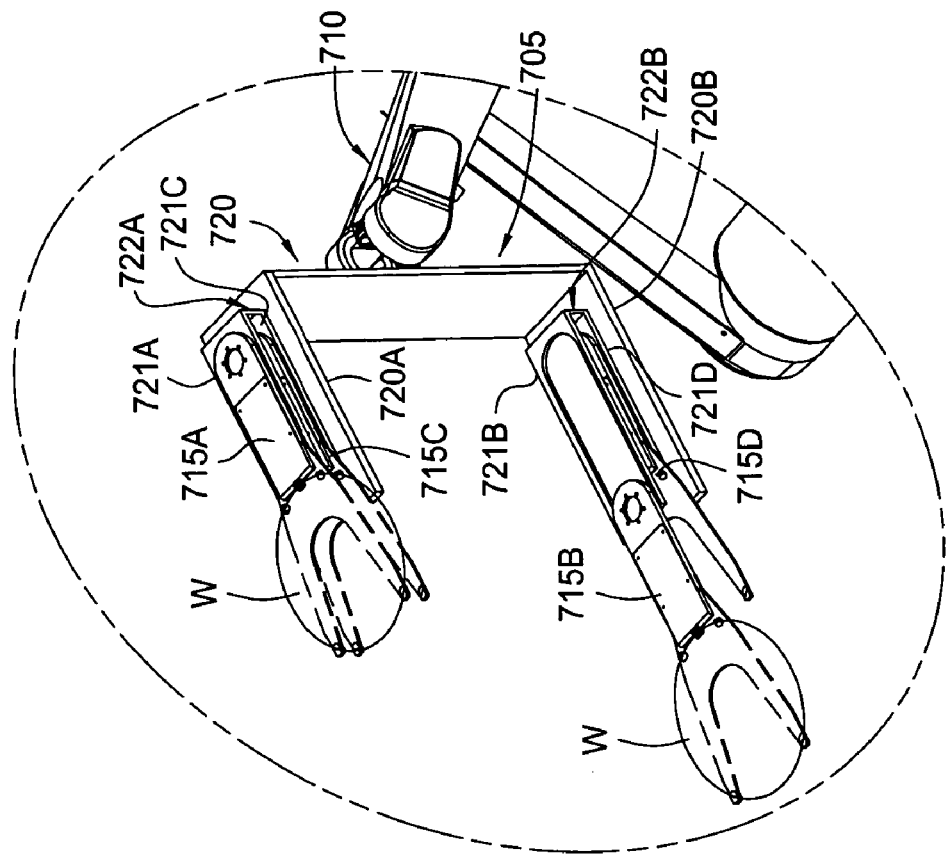
FIG. 8C is an isometric view illustrating one embodiment of the dual blade assembly shown in FIG. 8A.
Figure 8B:
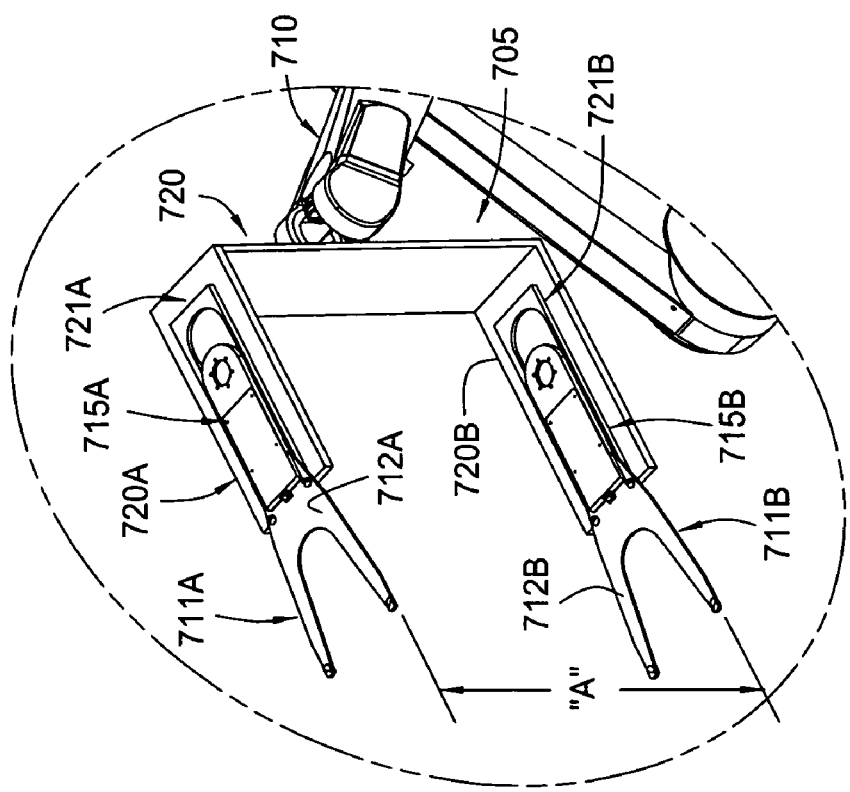
FIG. 8B is an isometric view illustrating one embodiment of the dual blade assembly shown in FIG. 8A.

FIG. 8C illustrates one embodiment of the dual blade assembly 705 which contains one pair of blade assemblies 715A and 715C mounted on the first supporting surface 720A and a second pair of blade assemblies 715B and 715D mounted on the second supporting surface 720B. FIG. 8C further illustrates a configuration where robot blade 711B is shown in an actuated position while the other blades (e.g., 715A and 715C-D) are shown in their retracted position. In one aspect of the dual blade assembly 705, each robot blade 711 (e.g., 711A-D), contained in its respective blade assembly 715 (e.g., 715A-D), may be independently actuated by use of the system controller (not shown) and its robot blade actuator 721 (e.g., 721A-D). In one aspect, as shown in FIG. 8C, each robot blade 711 in each of the pairs may be physically positioned in an orientation that is substantially horizontally aligned over each other and vertically spaced apart (often termed "over/under" configuration), so that a substrate can be retained on each blade at the same time. The over/under blade configuration may be advantageous, for example, where the robot has to remove a substrate from a processing chamber prior to placing the next substrate to be processed in the same processing chamber, without having to leave its basic position to move the "removed" substrate to another chamber. In another aspect, this configuration may allow the robot to fill up all of the blades and then transfer the substrates in groups to a desired location in the tool. For example, in FIG. 8C four substrates could be transferred on the four blades. This configuration also has a further advantage that allows substrates transferred in groups to be ungrouped by dropping-off or picking-up the substrates one at a time from each of the blades 711A-D. In other embodiments, three or more stacked blades mounted on each of the supporting surfaces (e.g., 720A and 720B FIG. 8B) may be used in place of the "pairs" of robot blades to further facilitate the transfer of multiple substrates in groups.

In one aspect of the invention, to perform a single substrate transfer task using a robot that contains two or more fixed robot blades, i.e., contains no robot blade actuators 721, the robot is adapted to "re-position," e.g., flip, rotate, and/or detach, at least one of the robot blades so that the "re-positioned" blade(s) will not interfere with the process of transferring a substrate on another robot blade. In this configuration a special position or chamber (e.g., support chambers) may be adapted to receive a robot blade and reposition it in a desired orientation to allow substrates to be transferred using other robot blades. The ability to re-position one or more of the robot blades may be especially useful when one or more processing chambers in a grouped transferring sequence is not operational, and thus will not allow a blade to enter the processing chamber, since it will allow other adjacent processing chamber positions to be utilized.

Figure 8E:
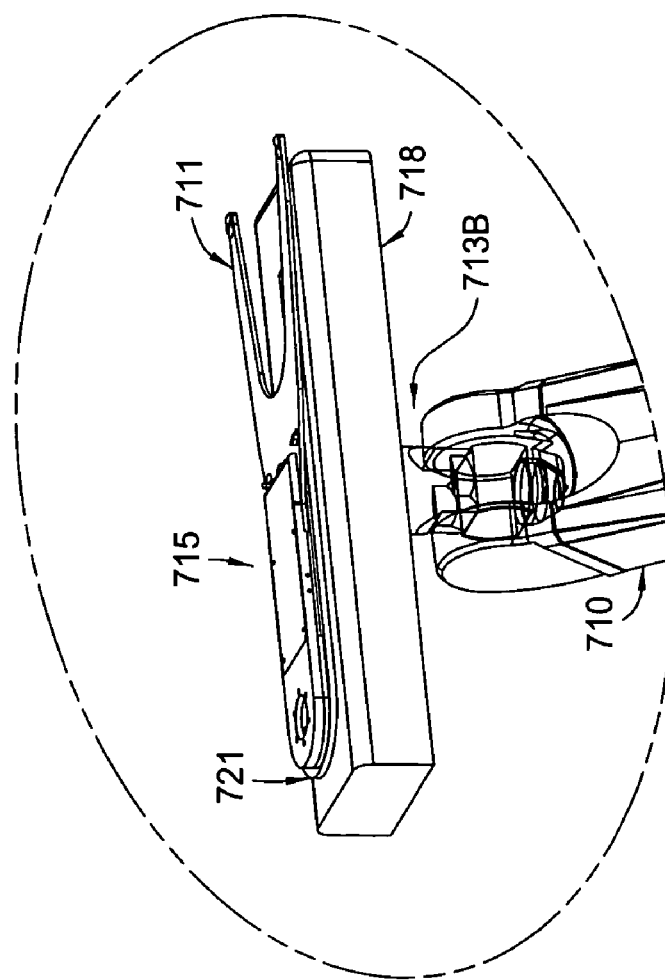
FIG. 8E is an isometric view illustrating one embodiment of the single blade assembly shown in FIG. 8D.
Figure 8D:
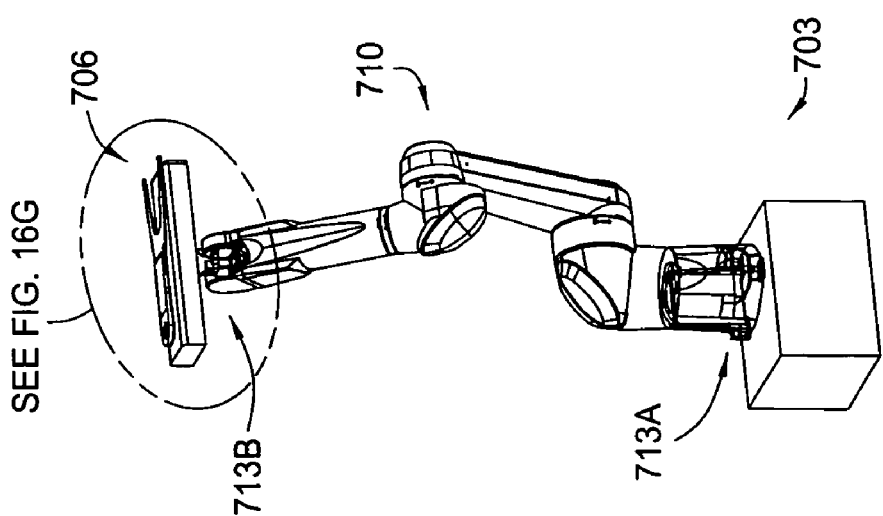
FIG. 8D is an isometric view illustrating one embodiment of a single blade 6-axis articulated robot assembly wherein the present invention may be used to advantage.

FIGS. 8D and 8E are isometric views of one embodiment of the front end robot 108 or the rear robot 109 containing a single blade type articulated robot assembly 703. The single articulated robot assembly 703 (hereafter SA robot assembly 703) is adapted to transfer substrates to and from the various process chambers contained in the front end processing rack 52 and the pod assembly 105, or the rear processing rack 202 and stepper/scanner 5, depending on whether the robot is a front end robot 108 or the rear robot 109. The SA robot assembly 703 generally contains a articulated robot 710 and a blade assembly 706. The articulated robot 710 is generally a 6-axis articulated robot which can be purchased from Mitsubishi Electric Corporation, of Tokyo, Japan, Kawasaki Robotics (USA), Inc., of Wixom, Mich., and Staubli Corp. of Duncan, S.C.

Referring to FIG. 8E, the blade assembly 706 generally contains a support 718 and a blade assembly 715 (e.g., first blade assembly 715A), described above. The support 718 attaches to and is guided by the articulated robot 710 so that robot blade 711 in a blade assembly 715 can pick-up and/or place a substrate in a processing chamber retained in a processing rack. In one embodiment, the single blade articulated robot assembly 703 may contain a pair of blade assemblies 715 (e.g., items 715A and 715C) such as one of the pairs illustrated and described in conjunction with FIG. 8C.

In one embodiment, the front end robot 108 or the rear robot 109 are a dual blade assembly 705 as illustrated and described above in conjunction with FIGS. 8A-D and 14A-B. This configuration will allow grouped transfer of the substrates throughout the system and thus increase throughput, CoO and system reliability.

Figure 8F:
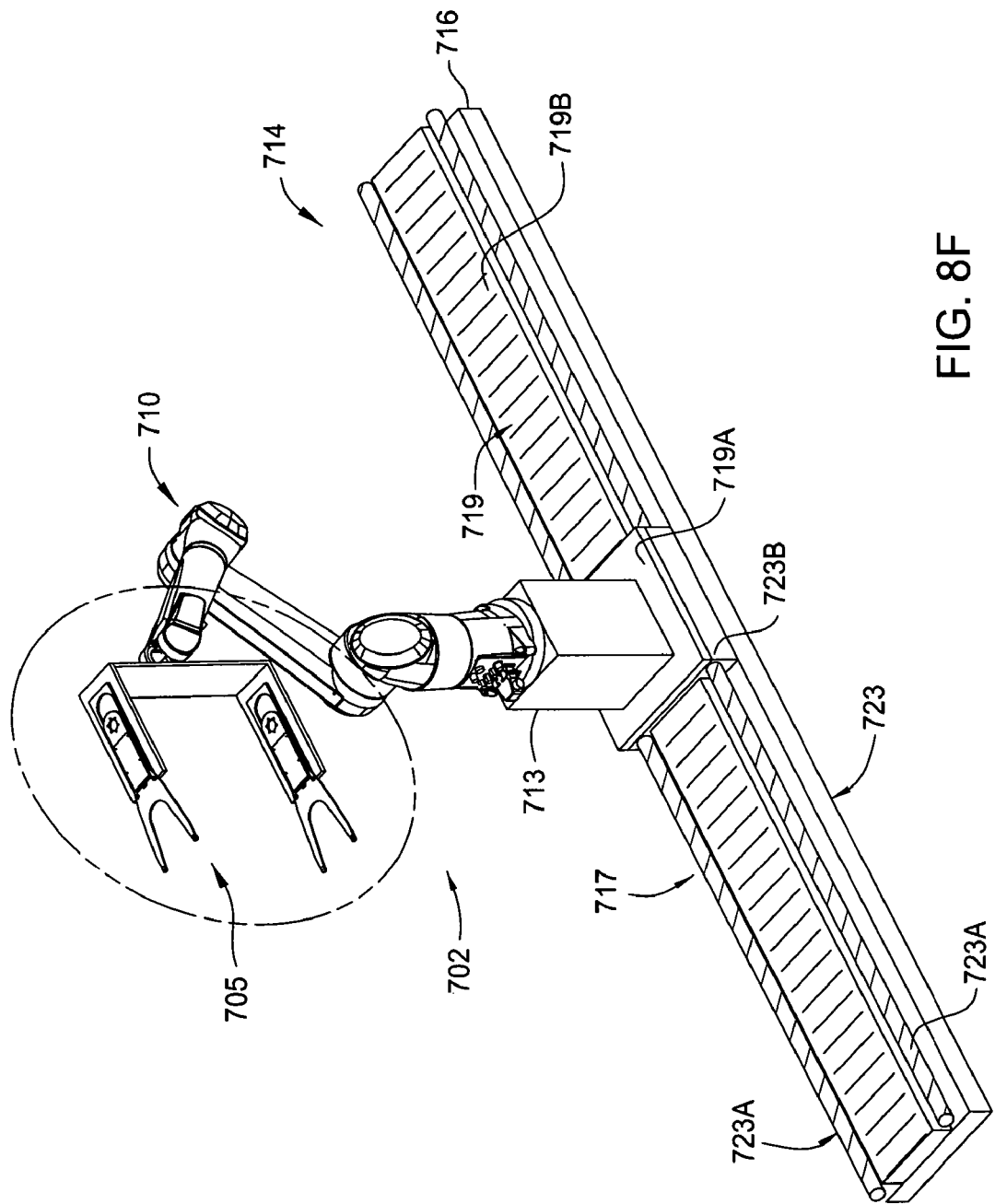
FIG. 8F is an isometric view illustrating one embodiment of a dual blade 6-axis articulated robot assembly and slide assembly according to the present invention.

FIG. 8F is an isometric view of one embodiment of a moveable articulated robot (e.g., AR assembly 702 is shown) that is adapted to allow the articulated robot base 713 to be translated and positioned along the length of a cluster tool by use of a slide assembly 714. In this configuration the articulated robot base 713 is connected to an actuator assembly 717 of the slide assembly 714, which is adapted to move the AR assembly 702 to a desired position in the cluster tool by use of commands from the system controller 101. The slide assembly 714 generally contains an actuator assembly 717, a cover (not shown), and a base 716. The base 716 supports and mounts the AR assembly 702 and slide assembly components to the cluster tool. The cover, not shown for clarity, is used to enclose the actuator assembly 717 and other slide assembly features to prevent generated particles from making their way to the processing chambers and prevent damage to these features during maintenance of the cluster tool. The actuator assembly 717 may generally contain an actuator 719 and a guiding mechanism 723. In one embodiment, as shown in FIG. 8F, the actuator 719 is a direct drive linear brushless servomotor, which through communication with the base component 719A (e.g., secondary coil or "rotor" section) mounted on the base 716 and a slider 719B (e.g., stator), is adapted to move the AR assembly 702 along the length of the slide assembly 714. A direct drive linear brushless servomotor that may be purchased from Danaher Motion of Wood Dale, Ill. or Aerotech, Inc. of Pittsburgh, Pa. In other embodiments, the actuator 719 may be stepper motor or other type of actuator that can be used to position the robot. The guiding mechanism 723 is mounted to the base 716 and is used to support and guide the robot as it is moved along the length of the slide assembly 714. The guiding mechanism 723 may be a linear ball bearing slides or a conventional linear guide, which are well known in the art.

While FIG. 8F illustrates a single robot mounted to the slide assembly 714, in other embodiments two or more robots may be affixed to the same slide assembly. This configuration can reduce cost by reducing the number of redundant parts and improve the precise motion of each of the robots relative each other. Also, while FIG. 8F illustrates a dual blade articulated robot mounted to the slide assembly 714, the type of robot or number of blades is not intended to be limiting of the scope of the invention.

Figure 8H:
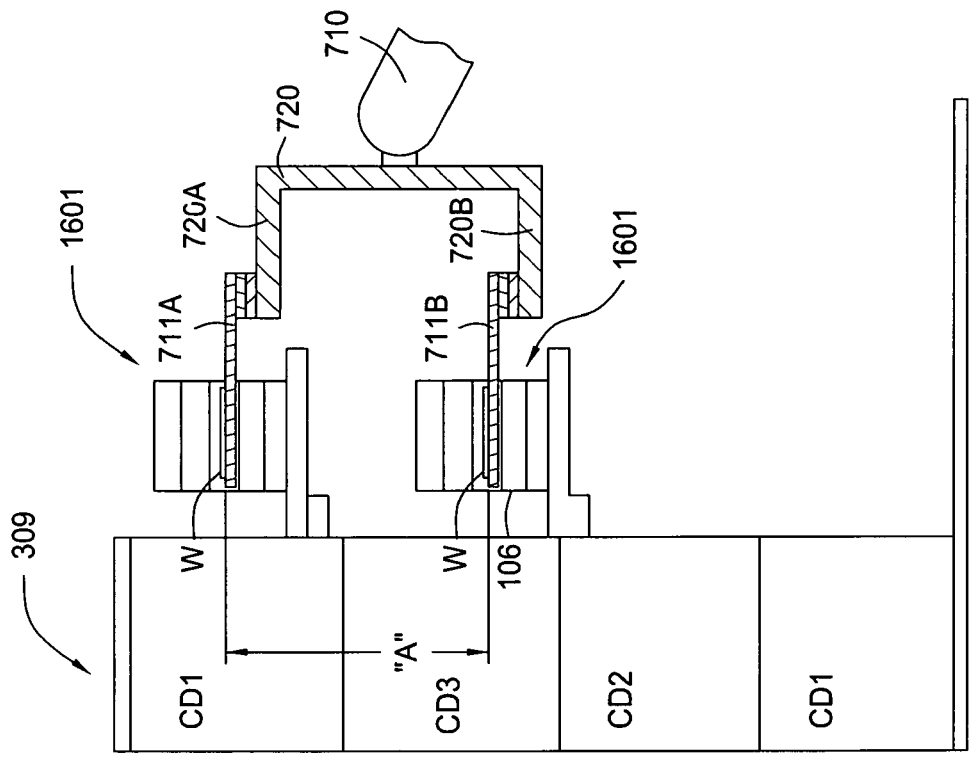
FIG. 8H illustrates a cross-sectional view of a dual blade assembly where the blades are positioned to transfer substrates from buffering stations.
Figure 8G:
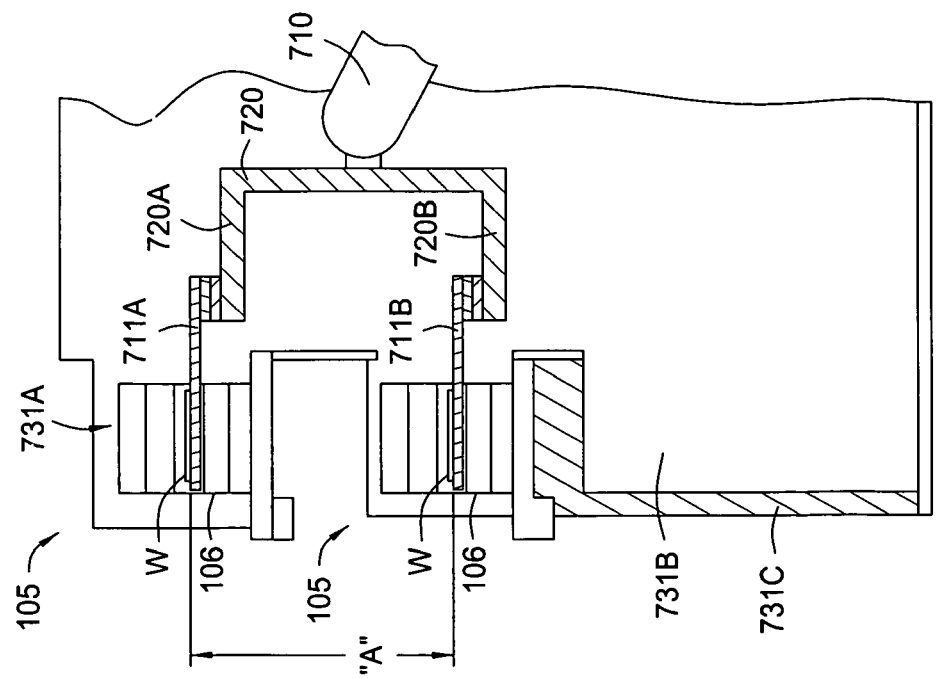
FIG. 8G illustrates a cross-sectional view of a dual blade assembly where the blades are positioned to transfer substrates from a pair of cassettes.

FIG. 8G illustrates a cross-sectional view of one embodiment of a robot having two fixed blades that are positioned to pick-up two substrates positioned in the two separate vertically stacked pod assemblies 105. In this configuration the multiple bladed robot is adapted to pick-up and/or drop-off substrates positioned in the two cassettes (item #s 106A-B) to allow grouped substrate transferring process to be performed at the start and/or the end of the substrate transferring sequence. In one aspect, the cassettes and the pod assemblies are spaced a distance "A" apart so that a robot can access the substrates in similar positions in each cassette. In one aspect, the distance of "A" is about 600 mm. In one aspect, when at least one cassette (e.g., item 106A) is not required various regions (e.g., items 731A, 731B, etc.) may formed above and/or below one of the other cassettes to allow a robot that has a fixed blades to access a first cassette with a first fixed robot blade without causing a collision with a second fixed robot blade and a cluster tool wall 731C. Therefore, in one aspect a region 731B may be formed to allow the first blade 711A to access a position in the lower cassette 106B while allowing the lower robot blade 711B to enter the region 731B without colliding with the wall 731C. While FIG. 8G illustrates a configuration where the robot blades 711A-B are fixed to the support surfaces 720A-B of the support 720, and thus do not utilize a robot blade actuator 721, other embodiments having robot blade actuators can be used without varying from the basic scope of the invention.

Figure 8I:
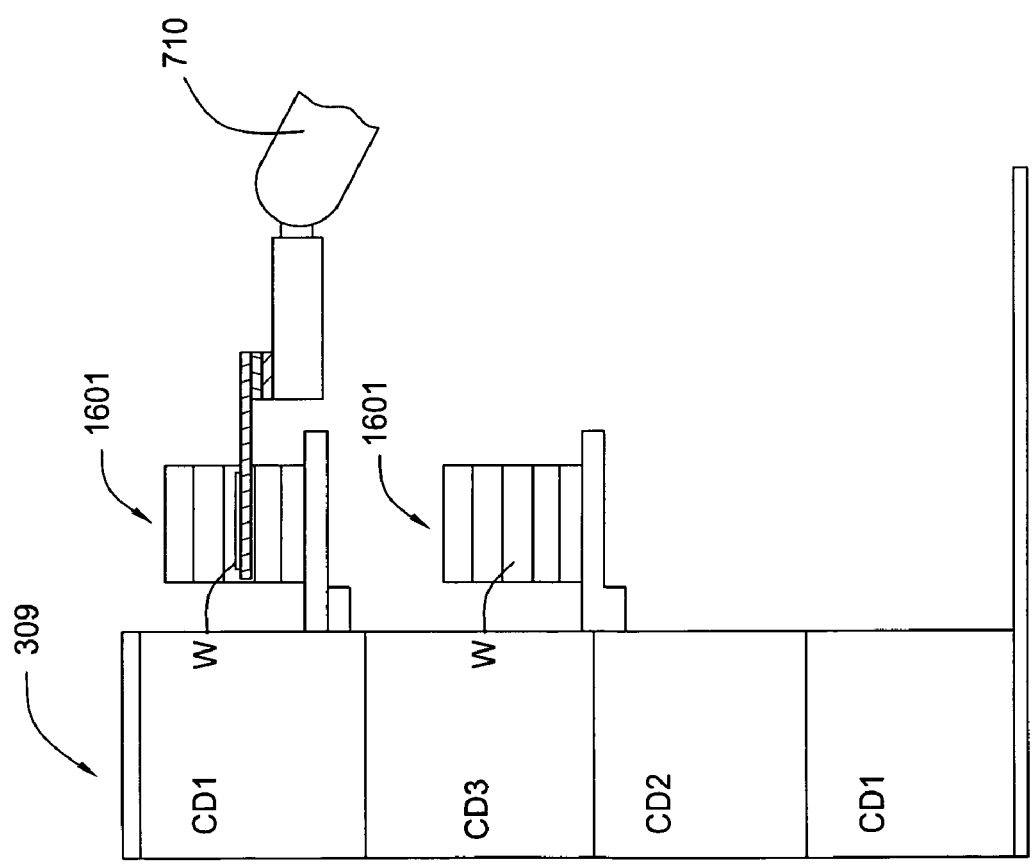
FIG. 8I illustrates a cross-sectional view of a single blade assembly where the blade is positioned to transfer a substrate from a buffer station.

FIG. 8H illustrates a cross-sectional view of one embodiment of a robot having two fixed blades that are positioned to pick-up two substrates positioned in the two separate vertically stacked buffering stations 1601. In this configuration the multiple bladed robot is adapted to pick-up and/or drop-off substrates positioned in the two buffering stations 1601 to allow grouped substrate transferring process to be performed in a substrate transferring sequence. In one aspect, the cassettes and the pod assemblies are spaced a distance "A" apart so that a robot can access the substrates in similar positions in each cassette. FIG. 8I illustrates a cross-sectional view of one embodiment of a robot having a single blade that is positioned to pick-up a substrates positioned a buffering station 1601. Allowing single substrate transferring provides flexibility to the processing sequence and balancing loads between the robots.

Shuttle Robot

Figure 9A:
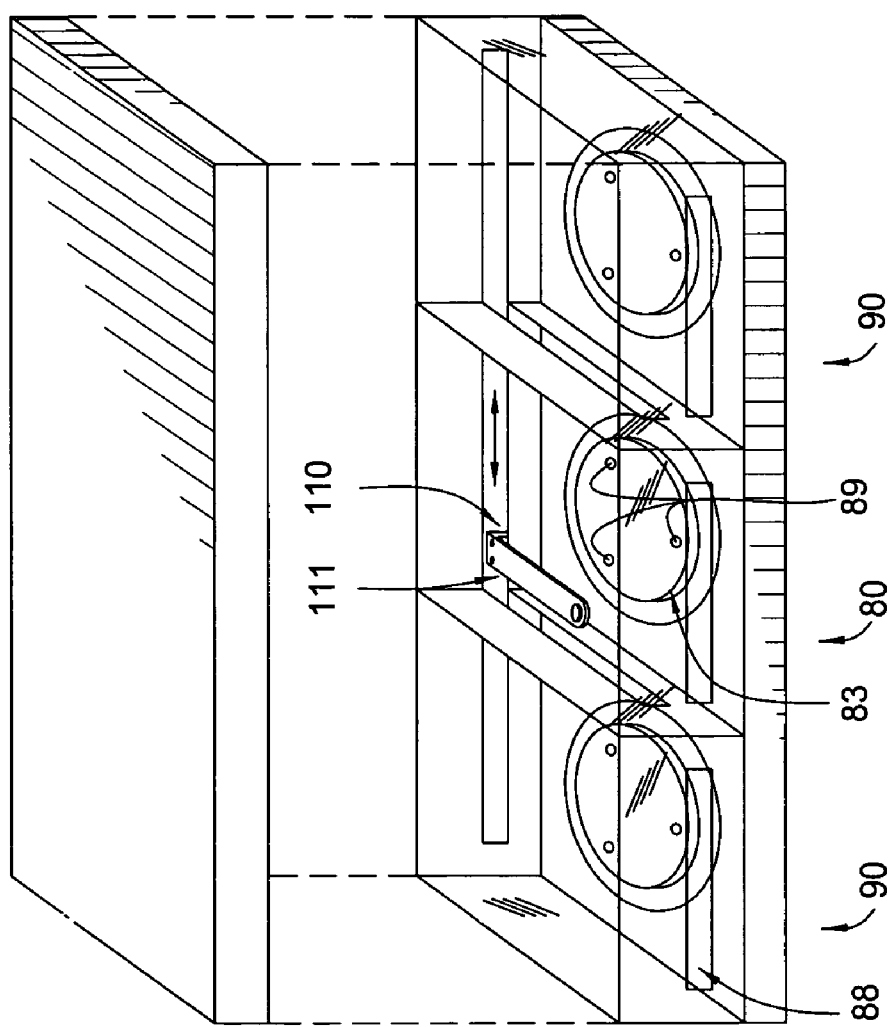
FIG. 9A is an isometric view of one embodiment of a bake chamber, a chill chamber and a robot adapted to transfer the substrate between the chambers.
Figure 9B:
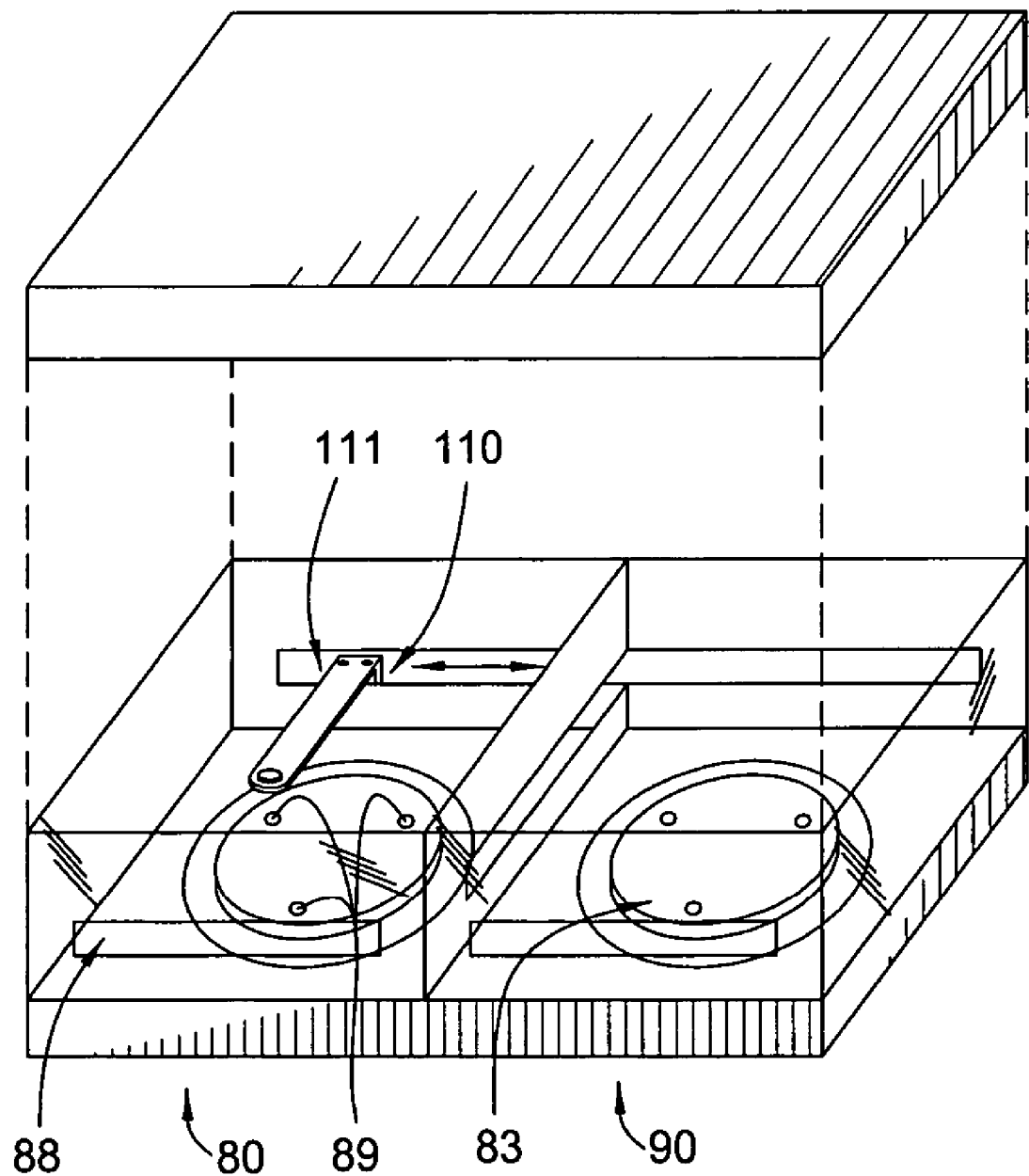
FIG. 9B is an isometric view of one embodiment of a bake chamber, a chill chamber and a robot adapted to transfer the substrate between the chambers.
Figure 9C:
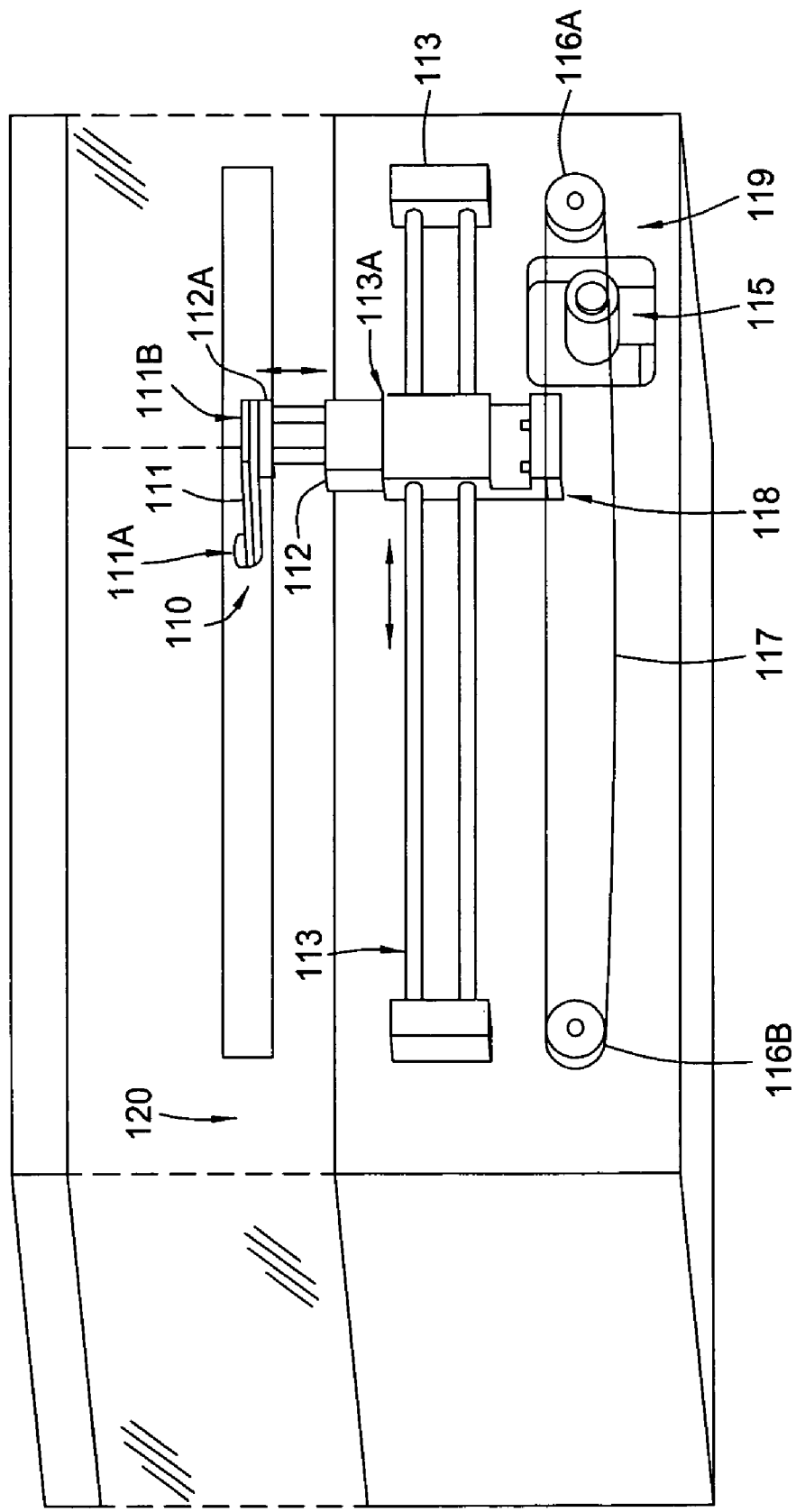
FIG. 9C is an isometric view showing the opposing side of the view shown in FIG. 9A which illustrates the robot adapted to transfer the substrate between the chambers.

FIGS. 9A-C illustrate various embodiments of a shuttle robot 110 that can be adapted to transfer substrates between adjacent chambers in the various processing racks. The design here may be advantageous for use when transferring substrates between a bake process chamber (e.g., bake chamber 90, HMDS process chamber 70, PEB chamber 130, etc.) and a chill chamber 80 which are used in subsequent processing steps, for example, between the post BARC bake step 512 and the post BARC chill step 514 and the post photoresist coat bake step 522 and the post photoresist chill step 524. The shuttle robot 110 is thus used to reduce the work load on the various system robots, such as, the front end robot 108, the central robot 107, and the rear robot 109, thus allowing the system robots to do other tasks while the other processing steps are completed on the substrates.

FIG. 9A is an isometric view of one configuration in which the shuttle robot 110 is used to transfer substrates between three adjacent processing chambers, such as between two bake chambers 90 and a chill chamber 80. This configuration may thus be used between, for example, a bake chamber B1, chill chamber C1 and bake chamber B2 in the first central processing rack 152 shown in FIG. 4B.

FIG. 9B is an isometric view of one configuration in which the shuttle robot 110 is used to transfer substrates between two adjacent processing chambers, such as between a bake chamber 90 and a chill chamber 80. This configuration may thus be used between, for example, a bake chamber B1 and chill chamber C7 contained in the front end processing rack 52 shown in FIG. 4A, a PEB bake chamber PEB1 and chill chamber C3 contained in the rear processing rack 202 shown in FIG. 4D, or a HMDS process chamber P1 and chill chamber C1 contained in the front end processing rack 52 shown in FIG. 4A.

FIG. 9C is an isometric view of the backside of the adjacent processing chambers shown in FIG. 9A or 9B which is intended to show an embodiment of the shuttle robot 110. The shuttle robot 110 generally contains a robot blade 111 and a shuttle robot actuator assembly 120. A shuttle robot actuator assembly 120 generally contains a robot blade actuator 112, a slide assembly 113 and a robot drive assembly 119. The robot blade 111 generally contains a substrate retaining area 111A and a mounting region 111B. The mounting region 111B is an area of the robot blade 111 that is used to attach the robot blade 111 to the robot blade actuator 112 (see mount 112A). The substrate retaining area 111A may be adapted to act as a conventional vacuum chuck, which is attached to a vacuum generating source (not shown), to hold a substrate during the substrate transferring process. The robot blade actuator 112 is a device that is used to raise and lower the robot blade 111 so that the substrate can be transferred from one processing chamber to another. In one embodiment, the robot blade actuator 112 is an air cylinder. In one embodiment, a linear actuator (e.g., linear brushless servo motor (not shown)) is mounted between the robot blade actuator 112 and the robot blade 111, so that the robot blade 111 can be extended and/or retracted (e.g., into or out of the chamber) to complete the substrate transfer process with the lift pins or other substrate retaining features in the processing chamber.

In one embodiment, the slide assembly 113 is a linear ball bearing slide that guides the shuttle robot 110 as it transfers the substrates between the various processing chambers. The slide assembly 113 generally contains a shuttle 113A on which the robot blade actuator 112 is attached. The clamp 118 is used to attach the shuttle 113A to the belt 117 of the robot drive assembly 119 to allow the robot drive assembly 119 to move the robot blade 111 between the various processing chambers.

In one embodiment, as shown in FIG. 9C, the robot drive assembly 119 is a belt and pulley type system which is used move the robot along the length of the slide assembly 113. In this configuration the robot drive assembly 119 will generally contain two or more idler pulleys 116A-B, a belt 117 and a motor 115 that is adapted to drive and control the position of the robot. In one embodiment, the motor 115 is a DC servomotor with an integrated encoder so that the system controller 101 can keep track of and control the position of the shuttle robot 110. In another embodiment of the robot drive assembly 119, the belt and pulley type system is replaced with a direct drive linear brushless servomotor that may be purchased from Danaher Motion of Wood Dale, Ill.

Integrated Bake/Chill Chamber

Figure 10A:
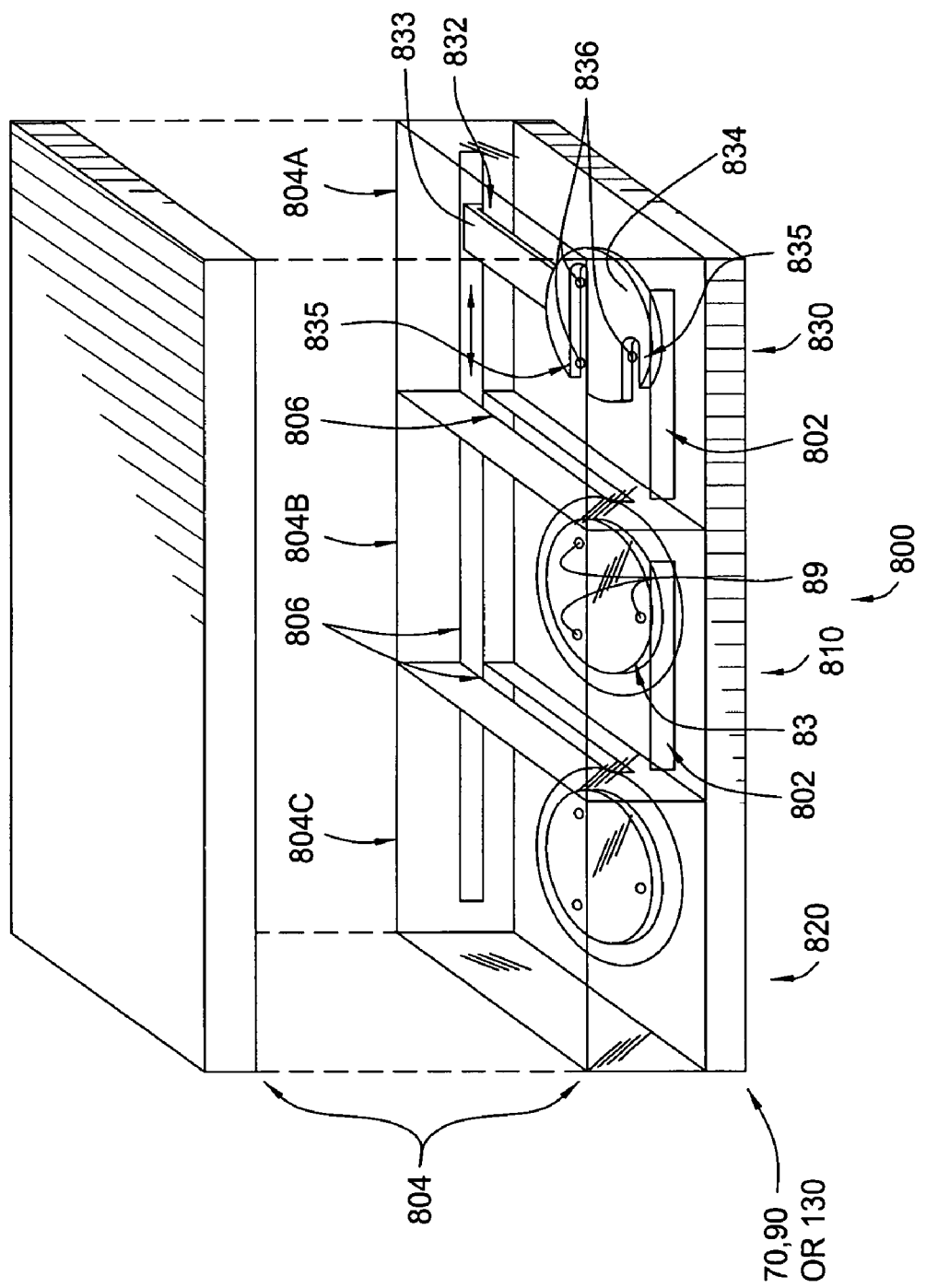
FIG. 10A is an isometric view of one embodiment of a bake/chill chamber 800.

FIG. 10A illustrates one embodiment of an integrated bake/chill chamber 800 that may be used in conjunction with the various embodiments of the cluster tool. In general the integrated bake/chill chamber 800 has three major processing regions: an input region 830, a chill region 810 and a bake region 820, which are adapted to perform a process sequence where various bake method steps (e.g., post BARC bake step 512, PEB step 540, etc.) and/or chilled method steps (e.g., post BARC chill step 514, post PEB chill step 544, etc.) are performed. The integrated bake/chill chamber 800 may contain two or more access ports 802 (two shown in FIG. 10A) in the enclosure 804, which are adapted to allow an external robot (e.g., front end robot 108, the central robot 107, etc. (not shown)) to access the input region 830 and/or the chill region 810 to pick up or drop off substrates. The enclosure 804 generally contains an input station enclosure 804A, a chill chamber enclosure 804B and a bake chamber enclosure 804C, that are adapted to isolate the various regions of the integrated bake/chill chamber 800.

In one embodiment, the input region 830 is used to receive a substrate from an external robot. The input region 830 is generally an enclosed region that contains a substrate exchanging device, such as lift pins 836 or some other similar device, that is adapted to allow an external robot to pick up or drop-off a substrate in the integrated bake/chill chamber 800. The input region 830 is also configured to allow a chilled transfer arm assembly 832 to pick-up and drop off substrates from the lift pins 836.

The chilled transfer arm assembly 832 generally contains a chilled blade 833 that has a blade receiving surface 834 and a plurality of cut-outs 835 that are adapted to allow the chilled blade 833 to pick-up, retain and drop-off substrates from the various substrate exchanging devices in the various processing regions of the integrated bake/chill chamber 800. In one embodiment, the chilled blade 833 of the chilled transfer arm assembly 832 contains a heat exchanging device 837 (FIG. 10B) that is in thermal communication with the blade receiving surface 834 so that the temperature of a substrate positioned on the blade receiving surface 834 can be temperature controlled. In one aspect, the temperature of the heat exchanging device 837 is monitored and controlled by use of a temperature controlling device 838 (FIG. 10B) that is in communication with the system controller 101. The heat exchanging device 837 may be a thermal electric device and/or embedded heating elements so that the temperature of the substrate can be controlled. In one aspect, the heat exchanging device 837 may contain a plurality of fluid channels (not shown) that are embedded in the chilled blade 833, that are configured to allow a temperature controlled heat exchanging fluid to flow therethrough. The blade receiving surface 834 may contain mechanical features (not shown) to retain a substrate on the receiving surface. In one aspect, the blade receiving surface 834 may contain a plurality of vacuum ports (not shown) that are connected to a vacuum source (not shown) to retain the substrate and assure intimate contact between the substrate and the blade receiving surface 834.

Figure 10B:
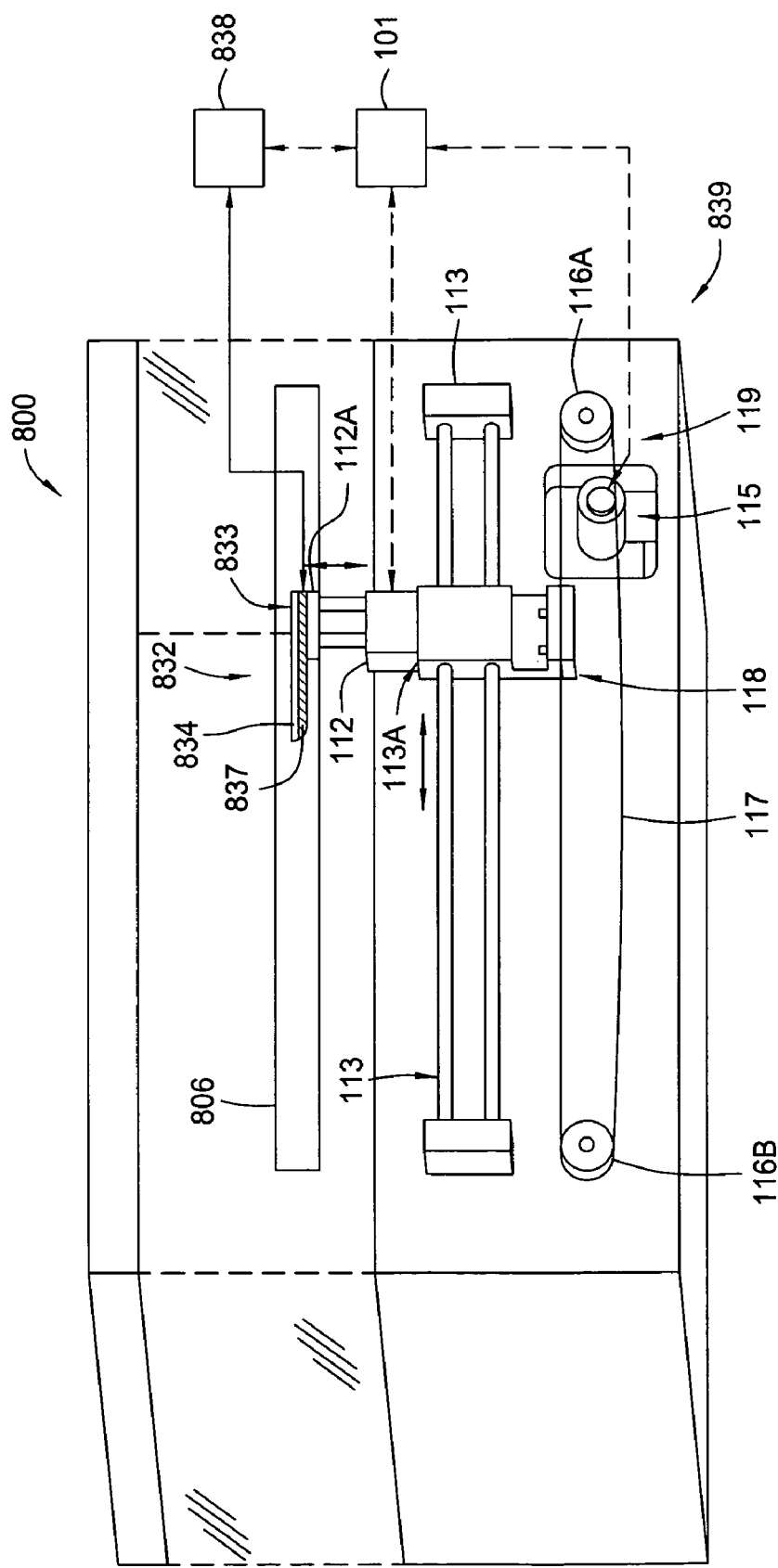
FIG. 10B is an isometric view showing the opposing side of the view shown in FIG. 10A which illustrates the robot adapted to transfer the substrate between the chambers.

FIG. 10B illustrates one embodiment of the chilled transfer arm assembly 832 that utilizes a chilled blade actuator assembly 839, similar to the shuttle robot actuator assembly 120 described above in conjunction with FIG. 9C, which is used to control the position of the chilled blade assembly 832 in any of the various processing regions of the integrated bake/chill chamber 800. For clarity, the item numbers of the common components used in the chilled blade actuator assembly 839 and shuttle robot actuator assembly 120 have not been changed. In one aspect of the chilled transfer arm assembly 832, the system controller 101 is utilized to position, both vertically and horizontally, the chilled blade assembly 832 in any of the various processing regions of the integrated bake/chill chamber 800. The chilled blade 833 is positioned by use of a chilled blade actuator assembly 839, on which is mounted one or more surfaces of the integrated bake/chill chamber 800. Referring to FIGS. 10A-B, the enclosure 804 contains a plurality of enclosure cut-outs 806, which allow the chilled blade 833 to transfer a substrate between the various processing regions of the integrated bake/chill chamber 800.

Referring to FIG. 10A, the chill region 810 contains the chill chamber 80 components illustrated and described in reference to FIG. 7A. In one aspect of the chill region 810, the enclosure 804B contains one or more enclosure cut-outs 806 to allow the chilled transfer arm assembly 832 to facilitate the transfer of a substrate between the various processing regions of the integrated bake/chill chamber 800.

The bake region 820 may contain all of the components of a bake chamber 90, HMDS process chamber 70, or a PEB chamber 130 as illustrated and described in reference to FIGS. 7B-D. In one aspect of the bake region 820, the enclosure 804C contains one or more enclosure cut-outs 806 to allow the chilled transfer arm assembly 832 to transfer a substrate between the various processing regions of the integrated bake/chill chamber 800.

When the integrated bake/chill chamber 800 is in use, an external robot delivers the substrate to the lift pins 836 of the input region 830 through an access port 802. The chilled blade 833, which is positioned below the lift pins 836, then moves vertically to remove the substrate from the lift pins 836 and positions the substrate on the blade receiving surface 834. The chilled blade 833 is then moved to the bake region 820 where the chilled blade 833 deposits the substrate and then exits the bake region 820 so that a bake process can be performed on the substrate. After the bake process has been performed the chilled blade 834 picks up the substrate from the bake region 820, transfers the substrate to a substrate exchanging device in the chill region 810, and then exits the chill region 810. After a chill process has been performed, the substrate is removed from the chill region 810 through the access port 802 by use of the external robot. In one aspect, after the chill process has been performed the chilled blade 833 removes the substrate from the chill region 810 and deposits the substrate on the lift pins 836 in the input region. This configuration may be advantageous since the chill region 810 is made available to complete a chill process on a new substrate and/or it allows the external robot to pickup the substrate from the same position that it deposited the substrate.

Wafer Sequencing/Parallel Processing

In an effort to be more competitive in the market place and thus reduce CoO, electronic device manufacturers often spend a large amount of time trying to optimize the process sequence and chamber processing time to achieve the greatest substrate throughput possible given the cluster tool architecture limitations and the chamber processing times. In track lithography type cluster tools, since the chamber processing times tend to be rather short, (e.g., about a minute to complete the process) and the number of processing steps required to complete a typical track system process is large, a significant portion of the time it takes to process a substrate is taken up by the processes of transferring the substrates in a cluster tool between the various processing chambers. In one embodiment of the cluster tool 10, the CoO is reduced by grouping substrates together and transferring and processing the substrates in groups of two or more. This form of parallel processing thus increases the system throughput, and reduces the number of moves a robot has to make to transfer a batch of substrates between the processing chambers, thus reducing wear on the robot and increasing system reliability.

In one aspect of the invention, the track architecture is designed so that substrates leave the cassette 106 mounted in the pod assemblies 105A-D one-by-one, and are then grouped together in groups containing two or more substrates after being processed in the first processing station. For example, when using the process sequence shown in FIG. 3, the substrates might be grouped after completing the BARC coat step 510. In this configuration, the robot that serves the cassettes 106 and places each substrate in the first process stations may use a single blade robot, but the robot (e.g., central robot 107) that picks up the substrates from the first process stations and places them in subsequent process stations, will be a robot that contains as many substrate retaining devices (e.g., robot blades) as there are substrates to be grouped. For example, in the case where two substrates are to be grouped together, a dual bladed type central robot 107 may be used. In another aspect of the invention, the substrates are ungrouped before they are transferred into the stepper/scanner 5, then are regrouped again after the performing the PEB step 540, and are then ungrouped again at the last process station prior to being picked up by the front end robot 108. In one embodiment, the group and/or ungroup step may be achieved by using buffering stations, such as the buffering stations 1601. For example, for the cluster tool 10 shown in FIG. 2A, the front robot 108 may have a single blade while the central robot 107 may have dual blades. The central robot 107 may drop off substrates two at a time onto the buffering stations 1601 and the front robot may pick up the substrates one by one from the buffering stations 1601.

In one aspect of the invention, the substrates may be grouped together at the pod assembly 105 and transferred through the cluster tool in groups, by use of a multiple bladed type front end robot 108, central robot 107 and rear robot 109. FIGS. 8A-C illustrate one embodiment of a multiple bladed robot. In this case, after each blade of the front end robot 108 is loaded with a substrates, all of the transfer processes through the cluster tool is completed in groups. One will note that it is likely that the substrates will have to be de-grouped, i.e, transferred one at a time, at the stepper/scanner 5.

In one embodiment, the substrates are grouped in pairs and thus the transferring process would include the grouping steps of single substrate transfer in to the first process chamber, then dual substrate transfer through the system, then single substrate transfer to and from the stepper/scanner 5, then dual substrate transfer through the system, and single substrate transfer from the last chamber to the cassette. In one embodiment, the central robot 107, as shown below in FIGS. 8A-B, contains a dual blade assembly 705 that contains at least a first robot blade 711A on the first blade assembly 715A and at least one robot blade 711B on the second blade assembly 715B to transfer substrates in groups of two. In this configuration, the first blade assembly 715A and the second blade assembly 715B are a fixed distance apart, which corresponds to the vertical spacing of the two chambers in which the substrates are to be grouped. For example, if the substrates are grouped in pairs after the BARC coat step 510 is performed in CD1 and CD2 of the front end processing rack 52 shown in FIG. 4A, the spacing of the transfer positions in the CD1 and CD2 chambers is configured to allow transferring of the substrates to the C12 and C9 chill chambers or B5 and B2 bake chambers in the first central processing rack 152. Therefore, after the post BARC chill step 514 has been completed the central robot 107 may transfer the pair of substrates to one of the pairs of coater/developer chambers 60 retained in the second central processing racks 154, such as chambers CD1 and CD2, CD2 and CD3, or CD3 and CD4.

In one embodiment of the dual blade assembly 705, the horizontal spacing of the first blade assembly 715A relative to the second blade assembly 715B is a fixed distance apart, which corresponds to the horizontal spacing of the two chambers in which the substrates are to be grouped. In this configuration, the first blade assembly 715A and the second blade assembly 715B are aligned in the horizontal plane so that the dual blade assembly 705 can access chambers spaced horizontally.

In one embodiment, a batch develop process could be performed on the substrates, in which case the substrates would be transferred in a group and then ungrouped to perform the develop process, after which they would be regrouped transferred as a group.

Figure 11:
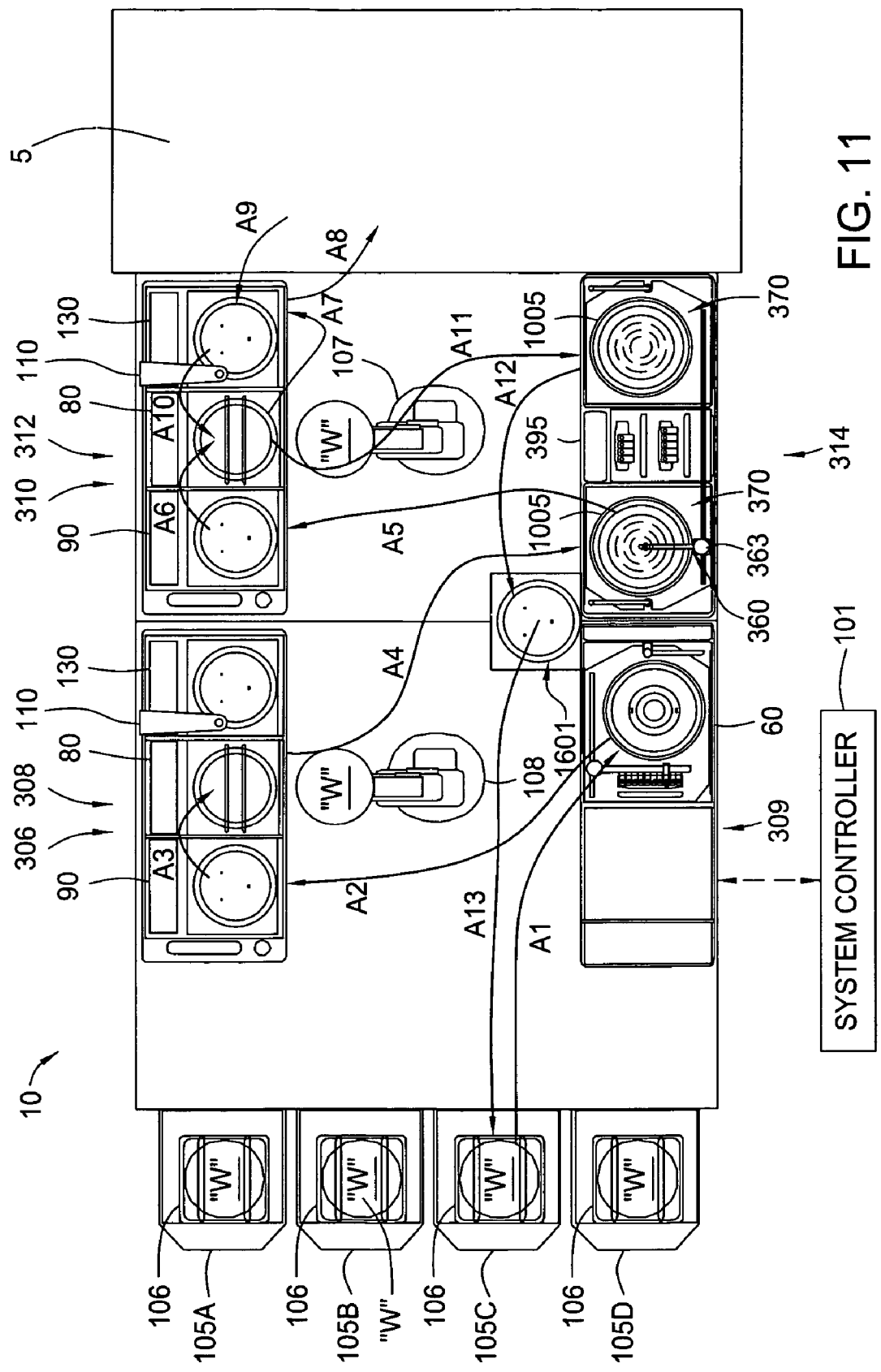
FIG. 11 is a plan view of a processing system illustrated in FIG. 2A that illustrates a transfer path of a substrate through the cluster tool following the process sequence illustrated in FIG. 3.

FIG. 11 illustrates schematically one example of a substrate transfer path through the FIG. 2A configuration of cluster tool 10. FIG. 11 illustrates the transfer path of a substrate following the processing sequence described in FIG. 3. In this embodiment, the substrate is removed from a pod assembly 105 (item # 105C) by the front end robot 108 and is delivered to a coater chamber 60A following the transfer path A1, so that the BARC coat step 510 can be completed on the substrate. Once the BARC process has been completed, the substrate is then transferred to a bake chamber 90 (e.g., B1, B2, B3, etc. (FIG. 4A)) by the front end robot 108 following the transfer path A2, where the post BARC bake step 512 is completed on the substrate. After completing the post BARC bake step 512 the substrate is then transferred to the post BARC chill step 514 (e.g., C1, C2, etc. (FIG. 4A)) by a shuttle robot 110 following the transfer path A3. After performing the post BARC chill step 514 the substrate is then transferred by the front end robot 108, or central robot 107, following the transfer path A4, to the process chamber 370 configured as a coater chamber 60A (e.g., CD1, CD2, CD3, etc. (FIG. 4D)) where the photoresist coat step 520 is performed. After performing the photoresist coat step 520 the substrate is then transferred by the central robot 107, following the transfer path A5, to the bake chamber 90 (e.g., B2, B4, etc. (FIG. 4C)) where the post photoresist coat bake step 522 is performed. After performing the post photoresist coat bake step 522 the substrate is then transferred by a shuttle robot 110, following the transfer path A6, to the chill chamber 80 (e.g., C1, C2, etc. (FIG. 4C)) where the post photoresist chill step 524 is performed. After performing the post photoresist chill step 524 the substrate is then transferred by the central robot 107, following the transfer path A7, to the OEBR chamber 62 (e.g., OEBR1, etc. (FIG. 4C)) where the OEBR step 536 is performed. The substrate is then transferred to the stepper/scanner 5 following the transfer path A8 using the central robot 107. After the exposure step 538 is complete, the central robot 107 transfers the substrate to the PEB chamber 130 following the transfer path A9. After performing the PEB step 540 the substrate is then transferred by the shuttle robot 110, following the transfer path A10, to the chill chamber 80 where the post PEB chill step 542 is performed. After performing the post PEB chill step 542, the substrate is then transferred by the central robot 107, following the transfer path A11, to the process chamber 370 configured as a developer chamber 60B (e.g., CD1, CD2, CD3, etc. as (FIG. 4D)) where the develop step 550 is performed. After performing the develop step 550 the substrate is then transferred by the central robot 107, following the transfer path A12, to the buffering stations 1601. The front end robot 108 may then pick up the substrate from the buffering stations 1601, following path A13, to the pod assembly 105.

Figure 12:
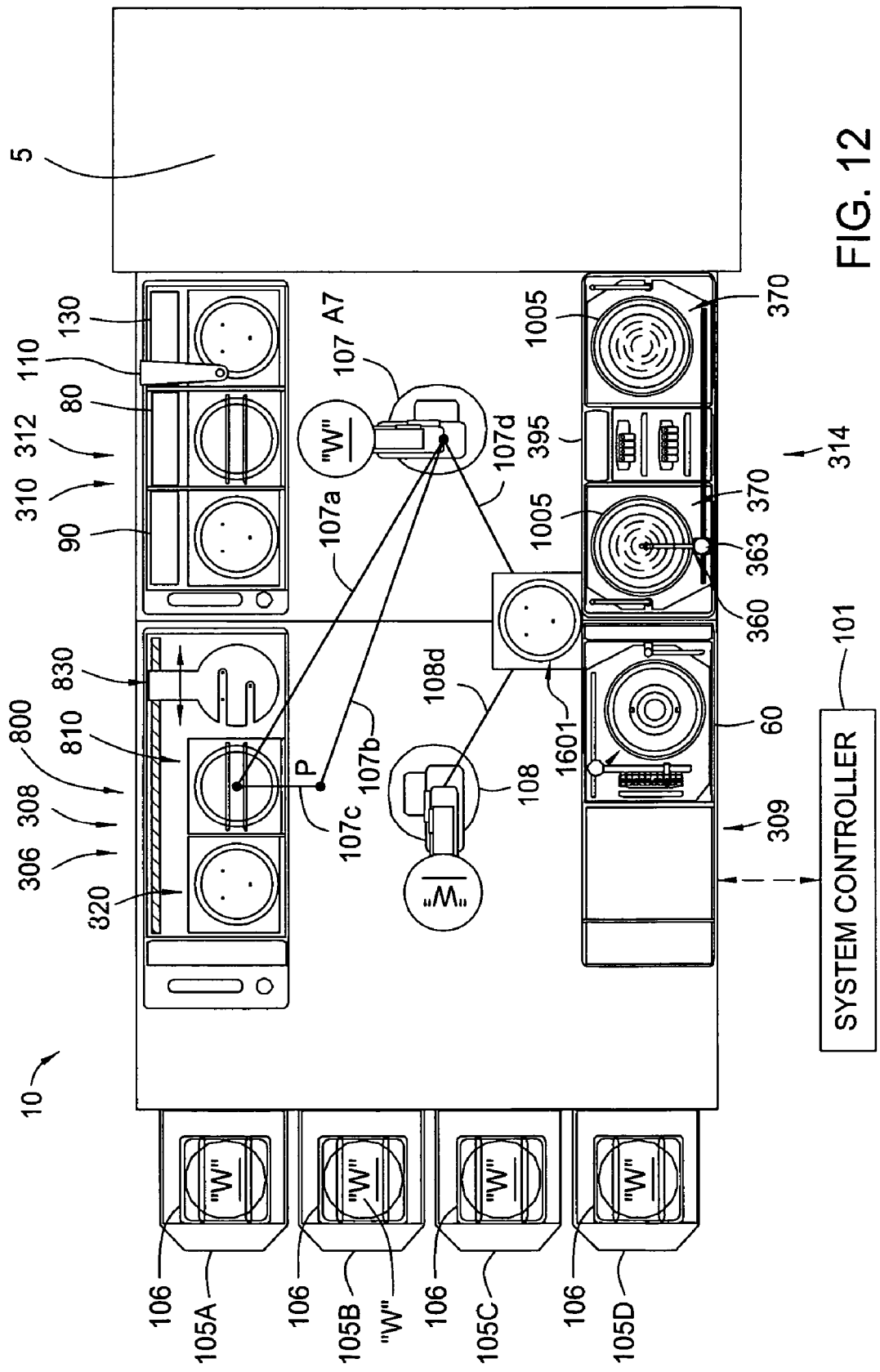
FIG. 12 is a plan view of a processing system illustrated in FIG. 2A that illustrates a non-orthogonal robot trajectory.

FIG. 12 is a plan view of a processing system illustrated in FIG. 2A that illustrates a non-orthogonal robot trajectory. In the state-of-the-art system, a robot generally access to a processing chamber via an orthogonal path. For example, as shown in FIG. 12, the central robot 107 may access the chill station 810 following path 107b to reach a point P, where the end-effecter of the robot 107, such as the blade assembly, is perpendicular to an entrance of the chill station 810. The central robot 107 may then send the blade assembly following path 107c to drop off or pick up a substrate in the chill station 810. This orthogonal path requires at least two motions from a robot. Since every robot has to arrive at the point P before accessing the chill station 810, the point P becomes a collision point among robots having access to the processing chamber. To assure reliable and high speed transfer of substrates to each processing chamber, non-orthogonal robot trajectory may be used. For example, the central robot 107 may reach the chill station 810 by following the path 107a directly, the front robot 108 may reach the buffering stations 1601 following path 108a, and the central robot 107 may reach the buffering stations 1601 following path 107d. In one aspect, by following a non-orthogonal trajectory, number of motions may be reduced compared to following a orthogonal trajectory. In another aspect, for each processing chamber, different robots may come from trajectories of different directions, hence reducing the needs for collision avoidance. Since collision among robots are generally avoided by setting at least one robot on a pause status while more than two robots need to have access to one overlapped area, collision avoidance usually slows down the system and decreases throughput. Therefore, following the non-orthogonal trajectories also increase system throughput by eliminating collision avoidance time.

Figure 13:
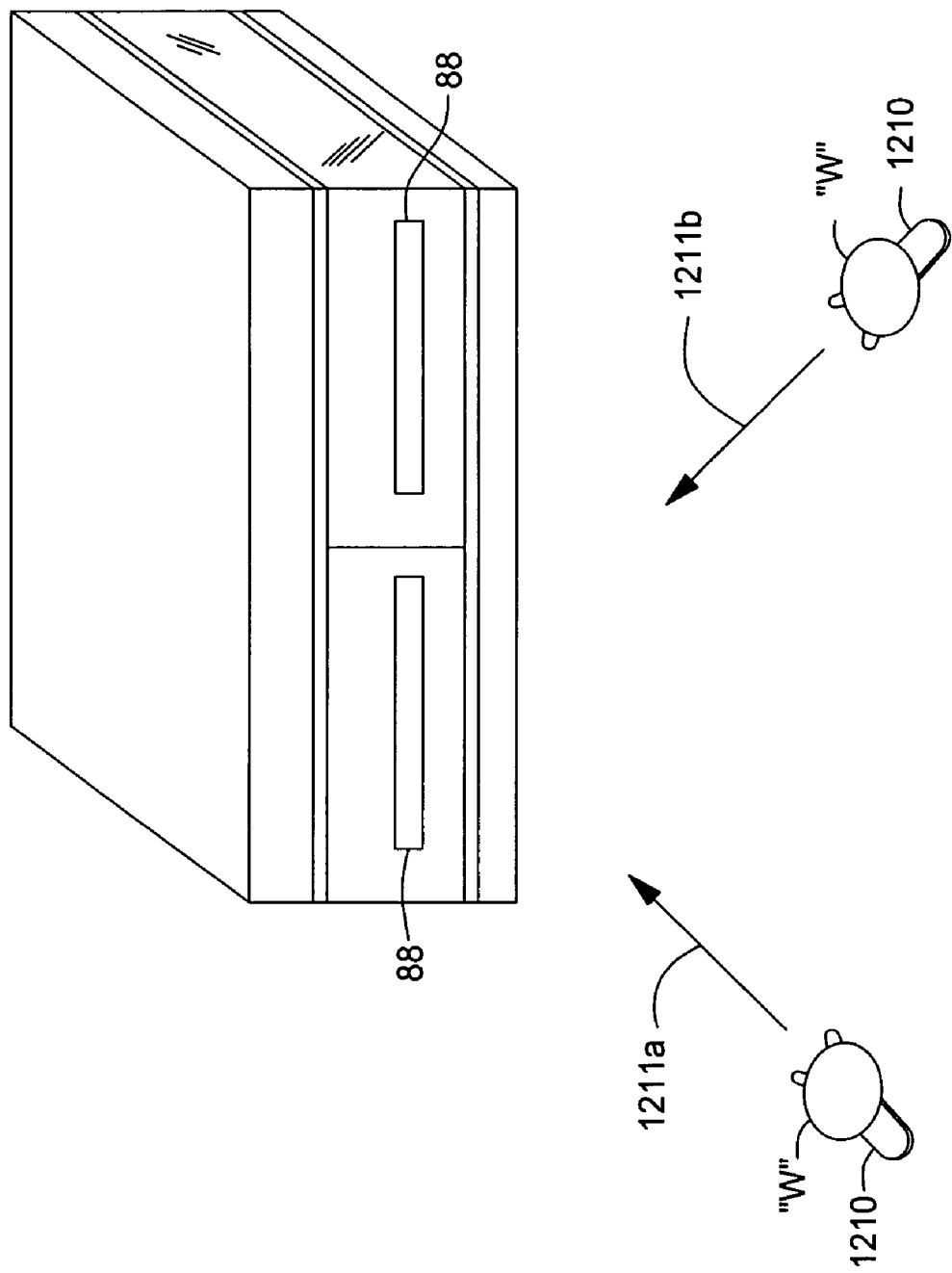
FIG. 13 is an isometric view showing a processing chamber accessible to robots from non-orthogonal directions.

A non-orthogonal robot trajectory may be achieved by reorienting hardware of processing chambers, redesigning rack hardware and/or optimizing robot blade trajectory. FIG. 13 is an isometric view showing an exemplary processing chamber accessible to robots from non-orthogonal directions. In one embodiment, to accommodate substrates carried by robot blades 1210 from non-orthogonal directions, such as direction 1211a and 1211b, an entrance 88 to an integrated bake/chill chamber 800 is correspondingly widened. Additionally, lifting pins, if used inside the processing chamber 800 for picking up substrates from the robot end-effecters, such as the robot blades 1210, may need to be orientated and/or rotated to correspond the incoming robot blades 1210 from non-orthogonal directions.

Figure 14:
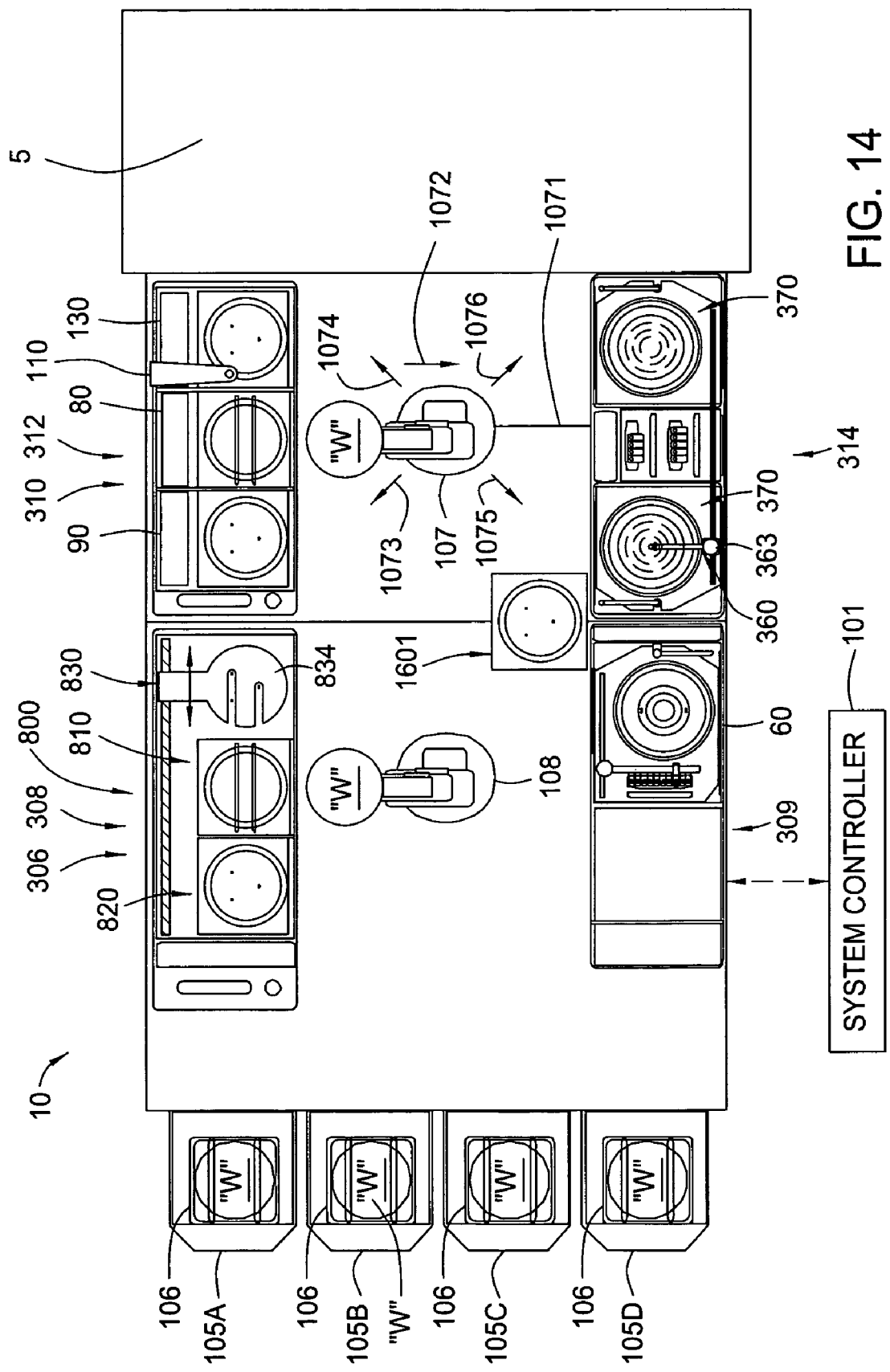
FIG. 14 is a plan view of a processing system illustrated in FIG. 2A that illustrates repositioning of robots.

FIG. 14 is a plan view of a processing system illustrated in FIG. 2A that demonstrates repositioning of robots to increase throughput. A 6-axis articulated robot generally has dead spots where the robot can not reach. For example, as shown in FIG. 14, the central robot 107 can not reach any point along path 1071. The presence of the dead spots usually makes it difficult to get the positions around the dead spots. For example, when the central robot 107 need to move from a position along path 1075 to a position along path 1076, it will have to rotate to pass points along path 1073 and path 1074 to get where it needs to be. Therefore, it is generally takes more time to reach positions close to the dead spots, for example those along paths 1075 and 1076, than the positions far away from the dead spots, for example, those along paths 1073 and 1074. In one embodiment, the central robot 107 may be repositioned along direction 1072 to be closer to the processing rack 314 such that the trajectories near the dead spots become shorter. In one embodiment, the position of the central robot 107 may be determined by using optimization methods.

In one aspect of the present invention, optimally positioning of robots, grouping and/or orienting process chambers may be used in combination to improve throughput and/or reduce wear of components in a cluster tool.

While the foregoing is directed to embodiments of the present invention, other and further embodiments of the invention may be devised without departing from the basic scope thereof, and the scope thereof is determined by the claims that follow.

The invention claimed is:

1. A cluster tool for processing a substrate, comprising:
   a first module comprising:
      a first processing rack having vertically stacked processing chambers;
      a second processing rack having vertically stacked processing chambers, wherein the first and second processing racks are positioned substantially parallel to each other; and
      a first robot disposed between the first and second processing racks;
   a second module comprising:
      a third processing rack having vertically stacked processing chambers;
      a fourth processing rack having vertically stacked processing chambers, wherein the third and fourth processing racks are positioned substantially parallel to each other; and
      a second robot disposed between the third and fourth processing racks;
   a third module comprising:
      a fifth processing rack having vertically stacked processing chambers;
      a sixth processing rack having vertically stacked processing chambers, wherein the fifth and sixth processing racks are positioned substantially parallel to each other; and
      a third robot disposed between the fifth and sixth processing racks, wherein the third module and the first module are positioned on opposite sides of the second module; and
   at least one buffering station, wherein the second module is positioned on one side of the first module such that the first processing rack is next to the third processing rack and the second processing rack is next to the fourth processing rack, and the at least one buffering station is disposed in a location so that the at least one buffering station is accessible by both the first and second robots.

2. The cluster tool of claim 1, wherein the first and second robots are 6-axis articulated robots.

3. The cluster tool of claim 2, wherein at least one of the first and second robot is movable along a track.

4. The cluster tool of claim 1, wherein the at least one buffering station is attached to the first processing rack.

5. The cluster tool of claim 1, wherein at least one of the processing chambers is accessible to at least one of the first and second robots following a non-orthogonal trajectory.

6. The cluster tool of claim 5, wherein the at least one of the processing chambers has an entrance substantially wider than a diameter of the substrate.

7. The cluster tool of claim 1, further comprising a factory enclosure having a plurality of pods, wherein the factor enclosure is positioned near the first module, on an opposite site of the second module, and wherein a gap is between the first module and the factory enclosure.

8. The cluster tool of claim 1, wherein the first robot comprise a single blade assembly and the second robot comprises a dual blade assembly.

* * * * *